(12) United States Patent
Nakagawa et al.

(10) Patent No.: US 12,027,091 B2
(45) Date of Patent: Jul. 2, 2024

(54) DISPLAY DEVICE

(71) Applicant: SEMICONDUCTOR ENERGY LABORATORY CO., LTD., Atsugi (JP)

(72) Inventors: Takashi Nakagawa, Kanagawa (JP); Takayuki Ikeda, Kanagawa (JP); Hidetomo Kobayashi, Kanagawa (JP); Hideaki Shishido, Kanagawa (JP); Shuichi Katsui, Kanagawa (JP); Kiyotaka Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/296,690

(22) Filed: Apr. 6, 2023

(65) Prior Publication Data

US 2023/0386383 A1 Nov. 30, 2023

Related U.S. Application Data

(63) Continuation of application No. 17/609,497, filed as application No. PCT/IB2020/053958 on Apr. 28, 2020, now Pat. No. 11,626,052.

(30) Foreign Application Priority Data

May 10, 2019 (JP) ................................. 2019-089437

(51) Int. Cl.
*G09G 3/20* (2006.01)
*H01L 27/12* (2006.01)
*H01L 29/786* (2006.01)

(52) U.S. Cl.
CPC ....... *G09G 3/20* (2013.01); *G09G 2300/0814* (2013.01); *G09G 2310/027* (2013.01);
(Continued)

(58) Field of Classification Search
CPC ...... G09G 3/20; G09G 3/3266; G09G 3/3233; G09G 3/3648; G09G 3/3275;
(Continued)

(56) References Cited

U.S. PATENT DOCUMENTS 6,384,818 B1 5/2002 Yamazaki et al.
6,765,562 B2 7/2004 Yamazaki et al.
(Continued)

FOREIGN PATENT DOCUMENTS

CN 001519929 A 8/2004
CN 109494229 A 3/2019
(Continued)

OTHER PUBLICATIONS

International Search Report (Application No. PCT/IB2020/053958) dated Aug. 4, 2020.
(Continued)

*Primary Examiner* — Vinh T Lam
(74) *Attorney, Agent, or Firm* — Fish & Richardson P.C.

(57) ABSTRACT

A display device with a narrower frame can be provided. In the display device, a first layer, a second layer, and a third layer are provided to be stacked. The first layer includes a gate driver circuit and a data driver circuit, the second layer includes a demultiplexer circuit, and the third layer includes a display portion. In the display portion, pixels are arranged in a matrix, an input terminal of the demultiplexer circuit is electrically connected to the data driver circuit, and an output terminal of the demultiplexer circuit is electrically connected to some of the pixels. The gate driver circuit and the data driver circuit are provided to include a region overlapping some of the pixels. The gate driver circuit and the data driver circuit have a region where they are not (Continued)

strictly separated from each other and overlap each other. Five or more gate driver circuits and five or more data driver circuits can be provided.

24 Claims, 33 Drawing Sheets

(52) U.S. Cl.
CPC ............ *G09G 2310/0297* (2013.01); *G09G 2310/08* (2013.01); *H01L 27/1225* (2013.01); *H01L 29/7869* (2013.01)

(58) Field of Classification Search
CPC ....... G09G 2300/0413; G09G 2370/14; G09G 2310/027; G09G 2300/0814; G09G 2310/0297; G09G 2310/0286; G09G 2310/08; H05B 33/14; G09F 9/30; H01L 27/1207; H01L 29/7869; H01L 27/1225; H10K 59/876; G11C 19/28
See application file for complete search history.

(56) References Cited

U.S. PATENT DOCUMENTS

| | | | |
|---|---|---|---|
| 7,067,926 B2 | 6/2006 | Yamazaki et al. | |
| 7,268,777 B2 | 9/2007 | Yamazaki et al. | |
| 7,489,291 B2 | 2/2009 | Yamazaki et al. | |
| 7,511,380 B2 | 3/2009 | Yamazaki et al. | |
| 7,532,208 B2 | 5/2009 | Yamazaki et al. | |
| 8,247,813 B2 | 8/2012 | Koyama et al. | |
| 8,446,403 B2 | 5/2013 | Tsuchi. et al. | |
| 8,520,312 B2 | 8/2013 | Miyano | |
| 8,564,575 B2 | 10/2013 | Yamazaki et al. | |
| 8,866,138 B2 | 10/2014 | Koyama et al. | |
| 9,129,927 B2 | 9/2015 | Gupta et al. | |
| 9,235,092 B2 | 1/2016 | Yamaguchi et al. | |
| 9,423,860 B2* | 8/2016 | Nishijima | G06F 1/3243 |
| 9,459,719 B2* | 10/2016 | Ikeda | G06F 3/0412 |
| 9,461,646 B2* | 10/2016 | Kozuma | H03K 19/1776 |
| 9,477,294 B2* | 10/2016 | Nishijima | G06F 1/3243 |
| 9,482,919 B2* | 11/2016 | Shishido | H01L 27/124 |
| 9,490,267 B2* | 11/2016 | Fujita | H01L 27/1222 |
| 9,496,408 B2 | 11/2016 | Yamazaki et al. | |
| 9,703,423 B2* | 7/2017 | Kurokawa | H01L 27/14609 |
| 9,721,971 B2 | 8/2017 | Koyama et al. | |
| 9,741,865 B2 | 8/2017 | Yamazaki et al. | |
| 9,761,281 B2* | 9/2017 | Nakagawa | G11C 5/148 |
| 9,899,536 B2 | 2/2018 | Yamazaki et al. | |
| 9,972,655 B2* | 5/2018 | Kurokawa | H01L 27/1225 |
| 9,985,069 B2* | 5/2018 | Kurokawa | G02F 1/362 |
| 9,991,286 B2 | 6/2018 | Koyama et al. | |
| 10,204,563 B2* | 2/2019 | Takahashi | H01L 27/1225 |
| 10,249,658 B2* | 4/2019 | Ikeda | H02S 40/44 |
| 10,297,214 B2* | 5/2019 | Lin | G09G 3/3648 |
| 10,304,555 B2* | 5/2019 | Yamazaki | H01L 27/1225 |
| 10,453,404 B2 | 10/2019 | Takahashi | |
| 10,490,142 B2* | 11/2019 | Kobayashi | H01L 29/7869 |
| 10,558,097 B2 | 2/2020 | Miyamoto et al. | |
| 10,586,495 B2* | 3/2020 | Kobayashi | G09G 3/3413 |
| 10,642,110 B2* | 5/2020 | Takahashi | G02F 1/136227 |
| 10,650,766 B2* | 5/2020 | Kurokawa | G09G 3/3688 |
| 10,840,268 B2 | 11/2020 | Koyama et al. | |
| 10,991,725 B2 | 4/2021 | Oda et al. | |
| 11,049,437 B2 | 6/2021 | Kurokawa | |
| 11,062,666 B2 | 7/2021 | Kurokawa et al. | |
| 11,069,722 B2* | 7/2021 | Matsukizono | H01L 27/1222 |
| 11,177,291 B2 | 11/2021 | Osawa et al. | |
| 11,205,387 B2* | 12/2021 | Kobayashi | G09G 3/3648 |
| 11,373,612 B2 | 6/2022 | Kurokawa et al. | |
| 11,423,844 B2* | 8/2022 | Ikeda | G09G 3/3233 |
| 11,450,709 B2* | 9/2022 | Yamazaki | G06F 3/04166 |
| 11,475,832 B2 | 10/2022 | Kawashima et al. | |
| 11,482,146 B2* | 10/2022 | Yamazaki | G09G 3/3225 |
| 11,509,918 B2* | 11/2022 | Kurokawa | H03K 3/3562 |
| 11,510,002 B2* | 11/2022 | Ikeda | H01L 27/124 |
| 11,742,379 B2* | 8/2023 | Yamazaki | H01L 27/156 |
| | | | 345/173 |
| 11,814,126 B2* | 11/2023 | Katsui | G01S 15/04 |
| 11,881,177 B2* | 1/2024 | Kobayashi | G09G 3/3426 |
| 11,894,040 B2* | 2/2024 | Ikeda | H03M 1/74 |
| 2002/0089483 A1 | 7/2002 | Yamazaki et al. | |
| 2004/0140547 A1 | 7/2004 | Yamazaki et al. | |
| 2004/0257357 A1 | 12/2004 | Yamazaki et al. | |
| 2005/0088433 A1 | 4/2005 | Yamazaki et al. | |
| 2005/0093852 A1 | 5/2005 | Yamazaki et al. | |
| 2006/0214306 A1 | 9/2006 | Yamazaki et al. | |
| 2009/0195523 A1 | 8/2009 | Yamazaki et al. | |
| 2010/0265224 A1 | 10/2010 | Cok | |
| 2010/0277443 A1* | 11/2010 | Yamazaki | G02F 1/13452 |
| | | | 345/204 |
| 2012/0012847 A1 | 1/2012 | Koyama et al. | |
| 2012/0305912 A1 | 12/2012 | Koyama et al. | |
| 2015/0021600 A1 | 1/2015 | Koyama et al. | |
| 2017/0025070 A1 | 1/2017 | Kang et al. | |
| 2017/0060310 A1 | 3/2017 | Gwon et al. | |
| 2017/0061888 A1 | 3/2017 | Nam et al. | |
| 2017/0084638 A1 | 3/2017 | Koyama et al. | |
| 2017/0316730 A1 | 11/2017 | Cheng et al. | |
| 2018/0026218 A1* | 1/2018 | Kobayashi | G09G 3/2003 |
| | | | 349/143 |
| 2018/0269233 A1 | 9/2018 | Koyama et al. | |
| 2019/0079331 A1 | 3/2019 | Miyamoto et al. | |
| 2020/0052004 A1 | 2/2020 | Koyama et al. | |
| 2021/0036093 A1 | 2/2021 | Okabe et al. | |
| 2021/0233623 A1 | 7/2021 | Kurokawa | |
| 2021/0359669 A1* | 11/2021 | Harada | G06F 1/04 |
| 2022/0137409 A1 | 5/2022 | Yamazaki et al. | |
| 2022/0189398 A1 | 6/2022 | Kimura et al. | |
| 2022/0199653 A1* | 6/2022 | Yakubo | H01L 21/822 |
| 2022/0208939 A1 | 6/2022 | Kobayashi et al. | |
| 2022/0223671 A1 | 7/2022 | Yamazaki et al. | |
| 2022/0230573 A1 | 7/2022 | Nakagawa et al. | |
| 2022/0231131 A1* | 7/2022 | Ikeda | H01Q 23/00 |
| 2023/0260473 A1* | 8/2023 | Kobayashi | H01L 27/1225 |
| | | | 345/87 |
| 2023/0353110 A1* | 11/2023 | Takahashi | H03K 17/79 |

FOREIGN PATENT DOCUMENTS

| | | |
|---|---|---|
| CN | 112119446 A | 12/2020 |
| EP | 1432032 A | 6/2004 |
| EP | 3454376 A | 3/2019 |
| JP | 10-104663 A | 4/1998 |
| JP | 2004-200522 A | 7/2004 |
| JP | 2011-139056 A | 7/2011 |
| JP | 2011-172100 A | 9/2011 |
| JP | 2012-042569 A | 3/2012 |
| JP | 2014-007399 A | 1/2014 |
| JP | 2015-046613 A | 3/2015 |
| JP | 2015-167237 A | 9/2015 |
| JP | 2016-219824 A | 12/2016 |
| JP | 2018-026572 A | 2/2018 |
| JP | 2018-087960 A | 6/2018 |
| JP | 2018-174344 A | 11/2018 |
| JP | 2019-020687 A | 2/2019 |
| JP | 2019-050323 A | 3/2019 |
| JP | 2019-186564 A | 10/2019 |
| JP | 6716221 | 7/2020 |
| KR | 10-0624158 | 9/2006 |
| KR | 10-1158831 | 6/2012 |
| TW | 201738868 | 11/2017 |

(56) References Cited

FOREIGN PATENT DOCUMENTS

| | | |
|---|---|---|
| WO | WO-2011/068017 | 6/2011 |
| WO | WO-2019/220278 | 11/2019 |

OTHER PUBLICATIONS

Written Opinion (Application No. PCT/IB2020/053958) dated Aug. 4, 2020.
Taiwanese Office Action (Application No. 109114388) dated Feb. 2, 2024.

\* cited by examiner

10

FIG. 31A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 31B
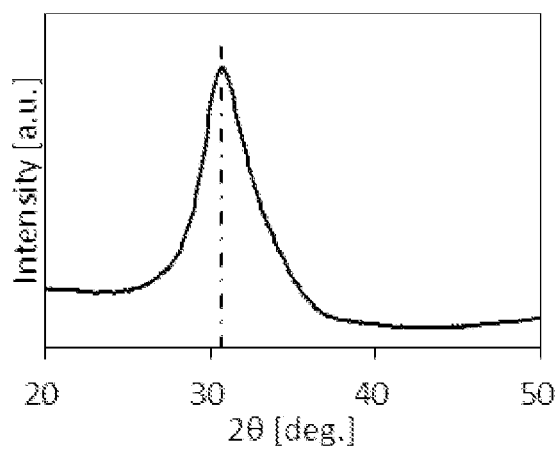
FIG. 31C
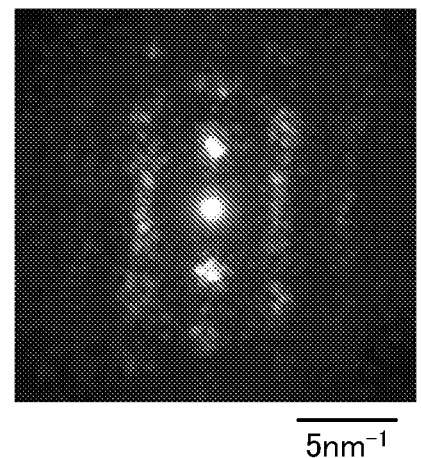

9100

9101

9102

9200

9201

9201

9201

DISPLAY DEVICE

CROSS REFERENCE TO RELATED APPLICATIONS

This application is a continuation of U.S. application Ser. No. 17/609,497, filed Nov. 8, 2021, now Allowed, which is incorporated by reference and is a U.S. National Phase Application under 35 U.S.C. § 371 of International Application PC T/IB2020/053958, filed on Apr. 28, 2020, which is incorporated by reference and claims the benefit of a foreign priority application filed in Japan on May 10, 2019, as Application No. 2019-089437.

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or μFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; thus, a high-performance display device provided with a driver circuit can be obtained.

In addition, as display devices for augmented reality (AR) or virtual reality (VR), wearable display devices and stationary display devices are becoming widespread. Examples of wearable display devices include a head mounted display (HMD) and an eyeglass-type display device. Examples of stationary display devices include a head-up display (HUD).

Furthermore, an electronic viewfinder is used as a viewfinder that is used to check an image to be taken before imaging and is provided in a digital camera or the like, which is an electronic device including an imaging device. A display portion is provided in the electronic viewfinder, and an image obtained by the imaging device can be displayed as an image in the display portion. For example, Patent Document 2 discloses an electronic viewfinder that can provide a good visibility state from a central portion of an image to a peripheral portion of the image.

REFERENCE

Patent Document

[Patent Document 1] Japanese Published Patent Application No. 2014-7399
[Patent Document 2] Japanese Published Patent Application No. 2012-42569

SUMMARY OF THE INVENTION

Problems to be Solved by the Invention

With a display device, such as a head mounted display (HMD), where the display surface and a user are close to each other, the user is likely to perceive pixels and strongly feel granularity, which might diminish the sense of immersion or realistic feeling of AR or VR. In an electronic viewfinder, as in an optical finder, an eyepiece is provided, and when the user brings his/her eyes closer to the eyepiece, an image displayed on a display portion of the electronic viewfinder is perceived. This makes the distance between the user and the display portion of the electronic viewfinder short. Accordingly, the user is likely to perceive pixels provided in the display portion and thus sometimes feels granularity strongly. In view of the foregoing, an HMD and an electronic viewfinder require a display device including fine pixels such that the user does not perceive the pixels. For example, the pixel density is preferably 1000 ppi or higher, further preferably 2000 ppi or higher, still further preferably 5000 ppi or higher. Moreover, it is preferable that in a display device provided in an electronic viewfinder, for example, an image having a resolution of 4K (the number of pixels: 3840×2160), 5K (the number of pixels: 5120×2880), or higher can be displayed.

Meanwhile, as the pixel density increases, transistors and the like provided in a driver circuit such as a data driver circuit need to be provided to be integrated in high density. However, the area occupied by the data driver circuit might become larger than the area of the display portion because of the limitations of high-density integration, for example. This might cause the size of a frame that is a region where the display portion is not provided to become larger.

An object of one embodiment of the present invention is to provide a display device with a narrower frame. Another object of one embodiment of the present invention is to provide a small display device. Another object of one embodiment of the present invention is to provide a display device with high layout flexibility. Another object of one embodiment of the present invention is to provide a display device with high pixel density. Another object of one embodiment of the present invention is to provide a display device that can display a high-resolution image. Another object of one embodiment of the present invention is to provide a display device that can display a high-quality image. Another object of one embodiment of the present invention is to provide a display device that can display a highly realistic image. Another object of one embodiment of the present invention is to provide a display device that can display a high-luminance image. Another object of one embodiment of the present invention is to provide a display device that operates at high speed. Another object of one embodiment of the present invention is to provide a display device with low power consumption. Another object of one embodiment of the present invention is to provide an inexpensive display device. Another object of one embodiment of the present invention is to provide a highly reliable display device. Another object of one embodiment of the present invention is to provide a novel display device. Another object of one embodiment of the present invention is to provide a method for operating the display device. Another object of one embodiment of the present invention is to provide an electronic device including the display device.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a display device in which a first layer, a second layer, and a third layer are provided to be stacked. The first layer includes a gate driver circuit and a data driver circuit. The second layer includes a demultiplexer circuit. The third layer includes a display portion. Pixels are arranged in a matrix in the display portion. An input terminal of the demultiplexer circuit is electrically connected to the data driver circuit. An output terminal of the demultiplexer circuit is electrically connected to the pixels. The gate driver circuit includes a region overlapping the pixels. The data driver circuit includes a region overlapping the pixels. The gate driver circuit includes a region overlapping the data driver circuit.

In the above-described embodiment, the demultiplexer circuit may include a region overlapping the pixels.

In the above-described embodiment, the display device may include a D/A converter circuit. The D/A converter circuit may include a potential generator circuit and pass transistor logic circuits. The potential generator circuit may be provided outside the data driver circuit. The pass transistor logic circuits may be provided in the data driver circuit. The number of the pass transistor logic circuits provided in the D/A converter circuit may be smaller than the number of columns of the pixels provided in the display portion. The number of the potential generator circuits provided in the D/A converter circuit may be smaller than the number of the pass transistor logic circuits. The potential generator circuit may have a function of generating a plurality of potentials with different levels from each other. The pass transistor logic circuits may have a function of receiving image data and outputting any of the potentials generated by the potential generator circuit on the basis of the digital value of the image data.

In the above-described embodiment, the number of the pass transistor logic circuits may be smaller than or equal to ½ the number of the columns of the pixels.

In the above-described embodiment, the pixels may include a transistor including a metal oxide in a channel formation region, and the metal oxide may contain In, an element M (M is Al, Ga, Y, or Sn), and Zn.

One embodiment of the present invention is a display device in which a first layer, a second layer, and a third layer are provided to be stacked. The first layer includes a gate driver circuit, a first data driver circuit, a second data driver circuit, a third data driver circuit, a fourth data driver circuit, and a fifth data driver circuit. The second layer includes a first demultiplexer circuit, a second demultiplexer circuit, a third demultiplexer circuit, a fourth demultiplexer circuit, and a fifth demultiplexer circuit. The third layer includes a first display portion, a second display portion, a third display portion, a fourth display portion, and a fifth display portion. First pixels are arranged in a matrix in the first display portion. Second pixels are arranged in a matrix in the second display portion. Third pixels are arranged in a matrix in the third display portion. Fourth pixels are arranged in a matrix in the fourth display portion. Fifth pixels are arranged in a matrix in the fifth display portion. An input terminal of the first demultiplexer circuit is electrically connected to the first data driver circuit. An input terminal of the second demultiplexer circuit is electrically connected to the second data driver circuit. An input terminal of the third demultiplexer circuit is electrically connected to the third data driver circuit. An input terminal of the fourth demultiplexer circuit is electrically connected to the fourth data driver circuit. An input terminal of the fifth demultiplexer circuit is electrically connected to the fifth data driver circuit. An output terminal of the first demultiplexer circuit is electrically connected to the first pixels. An output terminal of the second demultiplexer circuit is electrically connected to the second pixels. An output terminal of the third demultiplexer circuit is electrically connected to the third pixels. An output terminal of the fourth demultiplexer circuit is electrically connected to the fourth pixels. An output terminal of the fifth demultiplexer circuit is electrically connected to the fifth pixels. The gate driver circuit includes a region overlapping the first pixels. The first data driver circuit includes a region overlapping the first pixels. The second data driver circuit includes a region overlapping the second pixels. The third data driver circuit includes a region overlapping the third pixels. The fourth data driver circuit includes a region overlapping the fourth pixels. The fifth data driver circuit includes a region overlapping the fifth pixels. The gate driver circuit includes a region overlapping the first data driver circuit.

In the above-described embodiment, the first demultiplexer circuit may include a region overlapping the first pixels. The second demultiplexer circuit may include a region overlapping the second pixels. The third demultiplexer circuit may include a region overlapping the third pixels. The fourth demultiplexer circuit may include a region overlapping the fourth pixels. The fifth demultiplexer circuit may include a region overlapping the fifth pixels.

In the above-described embodiment, the display device may include a D/A converter circuit. The D/A converter circuit may include a potential generator circuit, first pass transistor logic circuits, second pass transistor logic circuits, third pass transistor logic circuits, fourth pass transistor logic circuits, and fifth pass transistor logic circuits. The potential generator circuit may be provided outside the first to fifth data driver circuits. The first pass transistor logic circuits may be provided in the first data driver circuit. The second pass transistor logic circuits may be provided in the second data driver circuit. The third pass transistor logic circuits may be provided in the third data driver circuit. The fourth pass transistor logic circuits may be provided in the fourth data driver circuit. The fifth pass transistor logic circuits may be provided in the fifth data driver circuit. The number of the first pass transistor logic circuits provided in the D/A converter circuit may be smaller than the number of columns of the first pixels provided in the first display portion. The number of the second pass transistor logic circuits provided in the D/A converter circuit may be smaller than the number of columns of the second pixels provided in the second display portion. The number of the third pass transistor logic circuits provided in the D/A converter circuit may be smaller than the number of columns of the third pixels provided in the third display portion. The number of the fourth pass transistor logic circuits provided in the D/A converter circuit may be smaller than the number of columns of the fourth pixels provided in the fourth display portion. The number of the fifth pass transistor logic circuits provided in the D/A converter circuit may be smaller than the number of columns of the fifth pixels provided in the fifth display portion. The number of the potential generator circuits provided in the D/A converter circuit may be smaller than the number of the first pass transistor logic circuits. The number of the potential generator circuits provided in the D/A converter circuit may be smaller than the number of the second pass transistor logic circuits. The number of the potential generator circuits provided in the D/A converter circuit may be smaller than the number of the third pass transistor logic circuits. The number of the potential generator circuits provided in the D/A converter circuit may be smaller than the number of the fourth pass transistor logic circuits. The number of the potential generator circuits provided in the D/A converter circuit may be smaller than the number of the fifth pass transistor logic circuits. The potential generator circuit may have a function of generating a plurality of potentials with different levels from each other. The first to fifth pass transistor logic circuits may have a function of receiving image data and outputting any of the potentials generated by the potential generator circuit on the basis of the digital value of the image data.

In the above-described embodiment, the number of the first pass transistor logic circuits may be smaller than or equal to ½ the number of the columns of the first pixels. The number of the second pass transistor logic circuits may be smaller than or equal to ½ the number of the columns of the second pixels. The number of the third pass transistor logic circuits may be smaller than or equal to ½ the number of the columns of the third pixels. The number of the fourth pass transistor logic circuits may be smaller than or equal to ½ the number of the columns of the fourth pixels. The number of the fifth pass transistor logic circuits may be smaller than or equal to ½ the number of the columns of the fifth pixels.

In the above-described embodiment, the first to fifth pixels may include a transistor including a metal oxide in a channel formation region, and the metal oxide may contain In, an element M (M is Al, Ga, Y, or Sn), and Zn.

Effect of the Invention

According to one embodiment of the present invention, a display device with a narrower frame can be provided. According to one embodiment of the present invention, a small display device can be provided. According to one embodiment of the present invention, a display device with high layout flexibility can be provided. According to one embodiment of the present invention, a display device with high pixel density can be provided. According to one embodiment of the present invention, a display device that can display a high-resolution image can be provided. According to one embodiment of the present invention, a display device that can display a high-quality image can be provided. According to one embodiment of the present invention, a display device that can display a highly realistic image can be provided. According to one embodiment of the present invention, a display device that can display a high-luminance image can be provided. According to one embodiment of the present invention, a display device that operates at high speed can be provided. According to one embodiment of the present invention, a display device with low power consumption can be provided. According to one embodiment of the present invention, an inexpensive display device can be provided. According to one embodiment of the present invention, a highly reliable display device can be provided. According to one embodiment of the present invention, a novel display device can be provided. According to one embodiment of the present invention, a method for driving the display device can be provided. According to one embodiment of the present invention, an electronic device including the display device can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 31A is a diagram illustrating the classification of crystal structures of IGZO. FIG. 31B is a diagram illustrating an XRD spectrum of a CAAC-IGZO film. FIG. 31C is a diagram illustrating a nanobeam electron diffraction pattern of a CAAC-IGZO film.

MODE FOR CARRYING OUT THE INVENTION

Figure 1A:
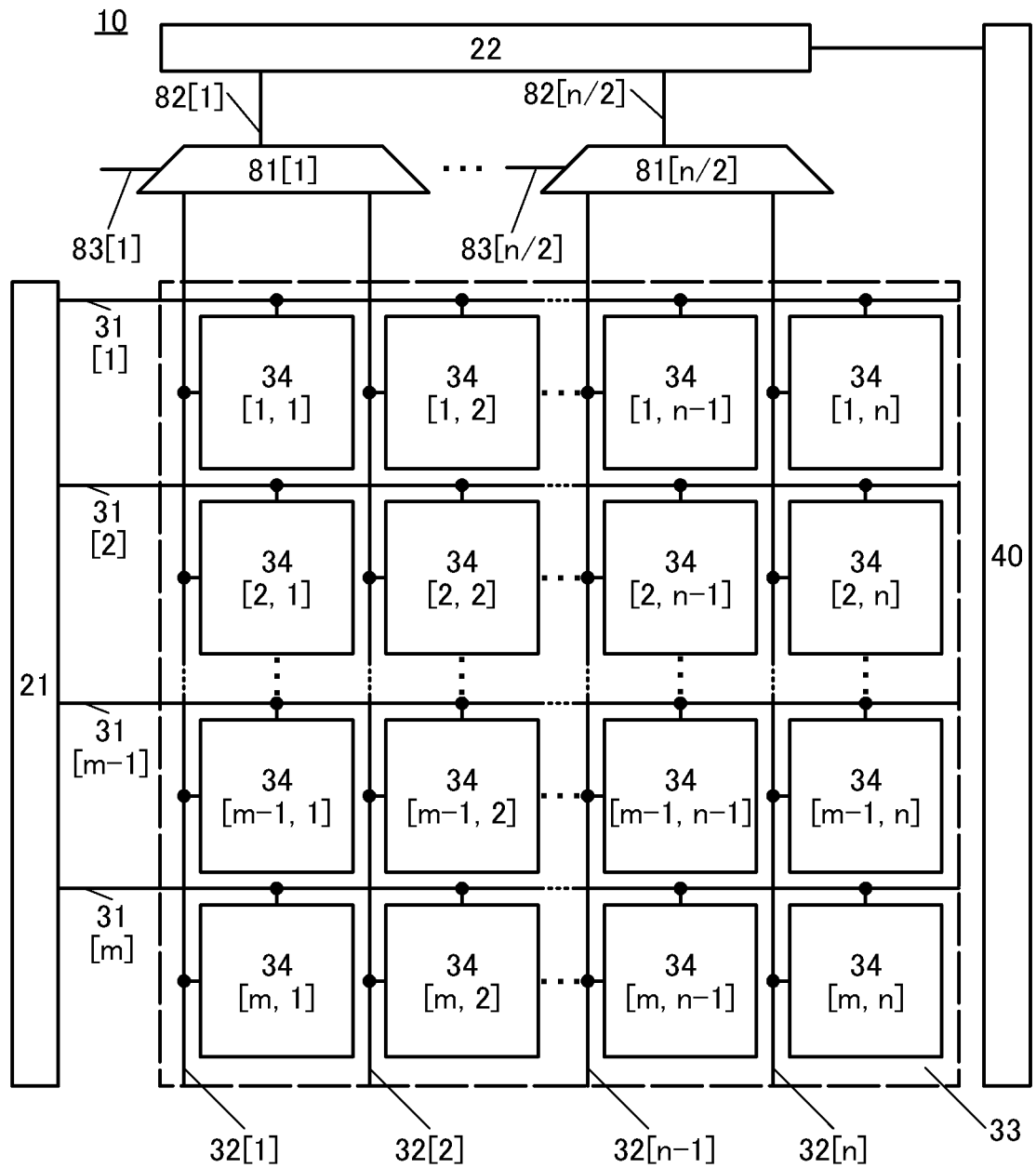
FIG. 1A is a block diagram illustrating a structure example of a display device.

Hereinafter, embodiments will be described with reference to the drawings. Note that the embodiments can be implemented in many different modes and it is readily understood by those skilled in the art that modes and details thereof can be changed in various ways without departing from the spirit and scope thereof. Therefore, the present invention should not be interpreted as being limited to the description of the embodiments below.

In each drawing described in this specification, the size, the layer thickness, or the region of each component is exaggerated for clarity in some cases.

Ordinal numbers such as "first," "second," and "third" used in this specification are used in order to avoid confusion among components and do not limit the components numerically.

In this specification and the like, terms for describing arrangement such as "over" and "under" are used for convenience to describe the positional relation between components with reference to drawings. The positional relation between components is changed as appropriate in accordance with the direction in which each component is described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, the terms "electrode," "wiring," and "terminal" do not functionally limit those components. For example, an "electrode" is used as part of a "wiring" in some cases, and vice versa. Furthermore, the term "electrode" or "wiring" can also mean the case where a plurality of "electrodes" or "wirings" are formed in an integrated manner, for example. For example, a "terminal" is used as part of a "wiring" or an "electrode" in some cases, and vice versa. Furthermore, the term "terminal" can also mean the case where a plurality of "electrodes," "wirings," "terminals," or the like are formed in an integrated manner, for example Therefore, for example, an "electrode" can be part of a "wiring" or a "terminal," and a "terminal" can be part of a "wiring" or an "electrode." The term "electrode," "wiring," or "terminal" is sometimes replaced with the term "region," for example.

In this specification and the like, the resistance value of a "resistor" is sometimes determined depending on the length of a wiring. Alternatively, the resistance value is sometimes determined by connection to a conductor with resistivity different from that of a conductor used for a wiring. Alternatively, the resistance value is sometimes determined by doping a semiconductor with an impurity.

In this specification and the like, the expression "electrically connected" includes the case where components are directly connected to each other and the case where components are connected through an "object having any electric function." Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where different conductors are connected to each other through a contact. Note that a wiring may be formed of conductors that contain one or more of the same elements or may be formed of conductors that contain different elements.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In the drawings, the size, the layer thickness, or the region is exaggerated for clarity in some cases. Therefore, they are not limited to the illustrated scale. Note that the drawings schematically show ideal examples, and embodiments of the present invention are not limited to shapes or values illustrated in the drawings. For example, in an actual manufacturing process, a layer, a resist mask, or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when an OS transistor is described, it can also be referred to as a transistor including a metal oxide or an oxide semiconductor.

Embodiment 1

In this embodiment, a display device that is one embodiment of the present invention will be described.

One embodiment of the present invention relates to a display device in which a first layer, a second layer, and a third layer are stacked. The first layer includes a gate driver circuit and a data driver circuit, the second layer includes a demultiplexer circuit, and the third layer includes a display portion. Pixels are arranged in a matrix in the display portion. The gate driver circuit and the data driver circuit are provided to have a region overlapping the display portion. Accordingly, the display device of one embodiment of the present invention can have a narrower frame and can be smaller.

The gate driver circuit and the data driver circuit have a region where they are not strictly separated from each other and overlap each other. Accordingly, the frame and size of the display device can be further reduced compared to the case where the overlap region is not included.

Here, in the case of a structure in which the gate driver circuit and the data driver circuit do not overlap the display portion, the gate driver circuit and the data driver circuit are provided in a portion around the display portion, for example In this case, it is difficult to provide display portions of more than two rows by more than two columns in terms of the positions where data driver circuits would be provided, for example. By contrast, in the display device of one embodiment of the present invention, the gate driver circuit and the data driver circuit can be provided in a layer different from the layer including the display portion, thereby having a region overlapping the display portion. Thus, display portions of more than two rows by more than two columns can be provided. In other words, five or more gate driver circuits and five or more data driver circuits can be provided in the display device of one embodiment of the present invention.

As described above, the gate driver circuit and the data driver circuit are provided to have a region overlapping the display portion; accordingly, for example, high speed operation is possible compared to a display device with a structure in which a gate driver circuit and a data driver circuit do not overlap a display portion. Thus, the pixel density of the display device of one embodiment of the present invention can be higher than that of the display device in which the gate driver circuit and the data driver circuit do not overlap the display portion. For example, the pixel density of the display device of one embodiment of the present invention can be 1000 ppi or higher, 2000 ppi or higher, or 5000 ppi or higher. Thus, the display device of one embodiment of the present invention can display a high-resolution image.

When the pixel density of the display device of one embodiment of the present invention is increased, transistors and the like provided in a driver circuit such as a data driver circuit need to be provided to be integrated in high density. However, the area occupied by the data driver circuit might become larger than the area of the display portion because of the limitations of high-density integration, for example. This might cause the area of a portion of the data driver circuit that does not overlap the display portion to be increased, and accordingly the size of a frame that is a region where the display portion is not provided might be increased.

By contrast, in the display device of one embodiment of the present invention, the demultiplexer circuit is provided in the second layer as described above. An input terminal of the demultiplexer circuit is electrically connected to the data driver circuit, and output terminals of the demultiplexer circuit are electrically connected to the pixels. Specifically, in the case where the demultiplexer circuit includes a first output terminal and a second output terminal as output terminals, the first output terminal and the second output terminal are electrically connected to pixels in different columns Thus, the demultiplexer circuit can have a function of switching a supply destination of image data generated by the data driver circuit. This can simplify the structure of the data driver circuit. Specifically, the number of elements such as transistors included in the data driver circuit can be reduced, for example. Thus, the area occupied by the data driver circuit can be reduced. Accordingly, the area of a portion of the data driver circuit that does not overlap the display portion can be reduced. Therefore, the display device of one embodiment of the present invention can have a narrower frame.

As described above, the demultiplexer circuit is provided in a layer that is different from both the layer where the data driver circuit is provided and the layer where the display portion is provided. This enables the demultiplexer circuit to be provided to have a region overlapping the display portion while the layout flexibility is increased. Accordingly, the display device of one embodiment of the present invention can have a narrower frame and can be smaller than in the case where the demultiplexer circuit is provided in the same layer as the data driver circuit, for example.

<Structure Example 1 of Display Device 10>

FIG. 1A is a block diagram illustrating a structure example of a display device 10 that is the display device of one embodiment of the present invention. The display device 10 includes a gate driver circuit 21, a data driver circuit 22, and a circuit 40. The display device 10 also includes a display portion 33 in which pixels 34 are arranged in a matrix of m rows and n columns (m and n are each an integer greater than or equal to 1). The display device 10 further includes a demultiplexer circuit 81.

In this specification and the like, when a plurality of components are denoted by the same reference numerals and, in particular, need to be distinguished from each other, an identification numeral such as "_1," "_2," "[n]," or "[m,n]" is sometimes added to the reference numerals. For example, the pixel 34 in the first row and the first column is denoted by a pixel 34[1,1], and the pixel 34 in the m-th row and the n-th column is denoted by a pixel 34[$m,n$].

The data driver circuit 22 is electrically connected to an input terminal of the demultiplexer circuit 81 through a wiring 82. A selection control signal input terminal of the demultiplexer circuit 81 is electrically connected to a wiring 83. The demultiplexer circuit 81 further includes a plurality of output terminals, and the plurality of output terminals are electrically connected to the pixels 34 through different wirings 32.

In this specification and the like, "output terminal of demultiplexer circuit" sometimes refers to any one of the plurality of output terminals included in the demultiplexer circuit. For example, "wiring is electrically connected to output terminal of demultiplexer circuit" sometimes means that the wiring is electrically connected to one of the plurality of output terminals.

The gate driver circuit 21 is electrically connected to the pixels 34 through a wiring 31. The circuit 40 is electrically connected to the data driver circuit 22. Note that the circuit 40 may be electrically connected to another circuit or the like.

FIG. 1A illustrates a structure in which the pixels 34 in one column are electrically connected to the same wiring 32 and the pixels 34 in one row are electrically connected to the same wiring 31. In this specification and the like, for example, the wiring 32 electrically connected to the pixels 34 in the first column is denoted by a wiring 32[1], and the wiring 32 electrically connected to the pixels 34 in the n-th column is denoted by a wiring 32[n]. For example, the wiring 31 electrically connected to the pixels 34 in the first row is denoted by a wiring 31[1], and the wiring 31 electrically connected to the pixels 34 in the m-th row is denoted by a wiring 31[m].

The data driver circuit 22 has a function of generating image data. The image data is supplied to the demultiplexer circuit 81 through the wiring 82.

The demultiplexer circuit 81 has a function of outputting, from any one of the plurality of output terminals, the image data input to the input terminal in accordance with a signal input to the selection control signal input terminal, that is, a potential of the wiring 83. For example, in the case where the demultiplexer circuit 81 includes the first output terminal and the second output terminal and a selection control signal is a 1-bit digital signal, the input image data can be output from the first output terminal when the selection control signal has a high potential. On the other hand, when the selection control signal has a low potential, the image data input to the demultiplexer circuit 81 can be output from the second output terminal Note that the image data input to the demultiplexer circuit 81 may be output from the first terminal when the selection control signal has a low potential and may be output from the second output terminal when the selection control signal has a high potential.

As described above, the image data input to the demultiplexer circuit 81 is output to the wiring 32 and supplied to the pixel 34. Accordingly, the wiring 32 can function as a data line.

As described above, the demultiplexer circuit 81 includes the plurality of output terminals, and one output terminal can be electrically connected to one wiring 32. Thus, the number of demultiplexer circuits 81 included in the display device 10 can be smaller than n that is the number of columns of the pixels 34. For example, in the case where the demultiplexer circuit 81 includes the first output terminal and the second output terminal as output terminals, the display device 10 can include n/2 demultiplexer circuits 81. In the case where the demultiplexer circuit 81 includes the first output terminal, the second output terminal, and a third output terminal as output terminals, the display device 10 can include n/3 demultiplexer circuits 81. In the case where the demultiplexer circuit 81 includes the first output terminal to a k-th (k is an integer greater than or equal to 2 and less than or equal to n) output terminal as output terminals, the display device 10 can include n/k demultiplexer circuits 81.

Note that the number of bits of the selection control signal can correspond to the number of output terminals included in the demultiplexer circuit 81. For example, in the case where the demultiplexer circuit 81 includes the first output terminal to a fourth output terminal, the selection control signal can be a 2-bit digital signal. For example, in the case where the demultiplexer circuit 81 includes the first to the k-th output terminals, the selection control signal can be a log 2(k)-bit digital signal.

FIG. 1A illustrates the case where the demultiplexer circuit 81 includes the first output terminal and the second output terminal as output terminals In this case, the display device 10 can include n/2 demultiplexer circuits 81 as described above.

In this specification and the like, the plurality of demultiplexer circuits 81 are distinguished by being denoted by a demultiplexer circuit 81[1], a demultiplexer circuit 81[2], and the like. For example, the n/2 demultiplexer circuits 81 are distinguished from one another by being denoted by the demultiplexer circuit 81[1] to a demultiplexer circuit 81[n/2]. For example, the wiring 82 electrically connected to an input terminal of the demultiplexer circuit 81[1] is denoted by a wiring 82[1], and the wiring 83 electrically connected to a selection control signal input terminal of the demultiplexer circuit 81[1] is denoted by a wiring 83[1]. In addition, for example, the wiring 82 electrically connected to an input terminal of the demultiplexer circuit 81[n/2] is denoted by a wiring 82[n/2], and the wiring 83 electrically connected to a selection control signal input terminal of the demultiplexer circuit 81[n/2] is denoted by a wiring 83[n/2].

The gate driver circuit 21 has a function of selecting the pixels 34 to which a potential corresponding to image data generated by the data driver circuit 22 is written. For example, the gate driver circuit 21 can generate a selection signal and supply the selection signal to the pixels 34 in a specific row. The potential corresponding to the image data can be written to the pixels 34 to which the selection signal is supplied.

Here, for example, the gate driver circuit 21 selects the pixels 34 in the first row, selects the pixels 34 in the second row, selects the pixels 34 up to the m-th row in sequence, and then selects the pixels 34 in the first row again. In other words, it can be said that the gate driver circuit 21 has a function of scanning the pixels 34. The selection signal can be supplied from the gate driver circuit 21 to the pixels 34 through the wiring 31. From the above, it can be said that the wiring 31 functions as a scan line. Note that in the case of interlace driving, after the pixels 34 in the first row are selected, the pixels 34 not in the second row but, for example, in the third row or the fourth and subsequent rows are selected. For example, in the case where m is an even number, the pixels 34 in the even-numbered rows can be sequentially selected after sequentially selecting the pixels 34 in the odd-numbered rows.

The circuit 40 has a function of receiving data that serves as a base for image data generated by the data driver circuit 22 and supplying the received data to the data driver circuit 22, for example. The circuit 40 also functions as a control circuit that generates a start pulse signal, a clock signal, and the like. In addition, the circuit 40 can have a function that the gate driver circuit 21 and the data driver circuit 22 do not have.

The display portion 33 has a function of displaying an image corresponding to image data supplied to the pixels 34. Specifically, light with luminance corresponding to the image data is emitted from the pixels 34, whereby an image is displayed on the display portion 33.

Note that the color of light emitted from the pixel 34 can be, for example, red, green, or blue. For example, the pixel 34 that emits red light, the pixel 34 that emits green light, and the pixel 34 that emits blue light are provided in the display portion 33, whereby the display device 10 can perform full-color display. In that case, it can be said that the pixels 34 are subpixels.

Figure 1B:
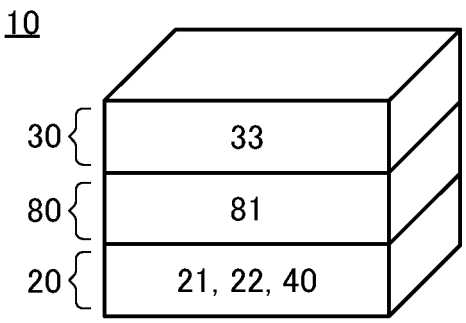
FIG. 1B is a schematic diagram illustrating a structure example of the display device.

FIG. 1B is a schematic diagram illustrating a structure example of the display device 10. As illustrated in FIG. 1B, the display device 10 can have a stacked-layer structure of a layer 20, a layer 80, and a layer 30. FIG. 1B illustrates a structure in which the layer 80 is provided above the layer 20 and the layer 30 is provided above the layer 80. An interlayer insulating layer can be provided between the layer 20 and the layer 80 and between the layer 80 and the layer 30. Note that the stacking order of the layer 20, the layer 80, and the layer 30 is not limited to the one illustrated in FIG. 1B. For example, the layer 80 may be provided above the layer 30 and the layer 20 may be provided above the layer 80.

The gate driver circuit 21, the data driver circuit 22, and the circuit 40 can be provided in the layer 20, for example. The demultiplexer circuit 81 can be provided in the layer 80, for example. The display portion 33 can be provided in the layer 30, for example Here, the gate driver circuit 21, the data driver circuit 22, the circuit 40, and the like provided in the layer 20 are circuits required to drive the display device 10. Therefore, these circuits can be referred to as driver circuits. Note that the demultiplexer circuit 81 may be referred to as a driver circuit.

Figure 2:
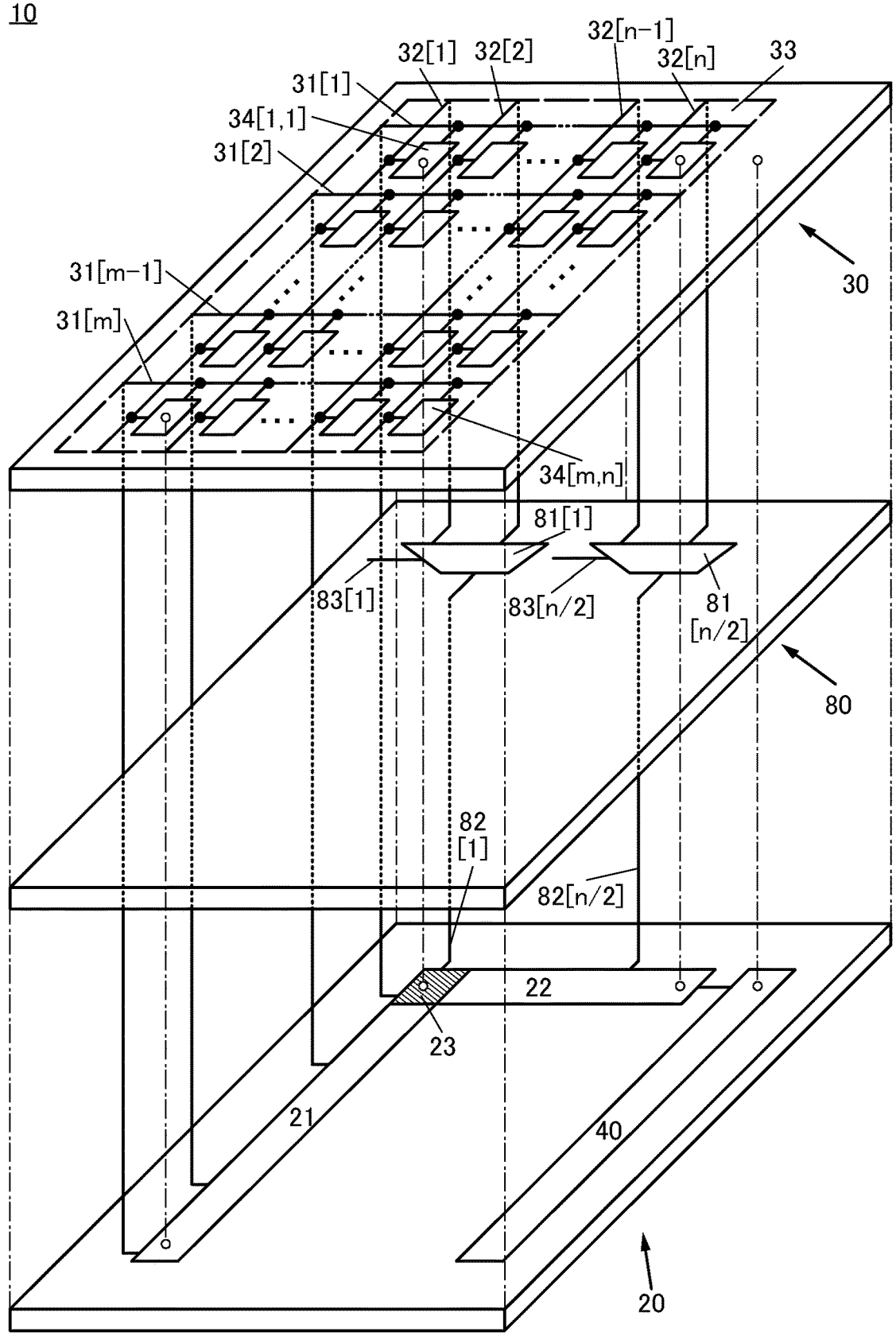
FIG. 2 is a block diagram illustrating a structure example of a display device.

FIG. 2 is a diagram illustrating structure examples of the layer 20, the layer 80, and the layer 30 illustrated in FIG. 1B. In FIG. 2, the positional relation between the layer 20 and the layer 30 is represented by dashed-dotted lines and blank circles; the blank circle of the layer 20 and the blank circle of the layer 30 that are connected by the dashed-dotted line overlap each other. Note that the same representation is used in other diagrams.

In the display device 10, the gate driver circuit 21 and the data driver circuit 22, which are provided in the layer 20, each have a region overlapping the display portion 33. For example, the gate driver circuit 21 and the data driver circuit 22 each have a region overlapping some of the pixels 34. The display portion 33 and each of the gate driver circuit 21 and the data driver circuit 22 are stacked to have a region where they overlap each other, whereby the area of a frame that is a region where the display portion 33 is not provided can be reduced. Accordingly, the display device 10 can have a narrower frame. Furthermore, the display device 10 has a narrower frame, whereby the display device 10 can be smaller.

The gate driver circuit 21 and the data driver circuit 22 have a region where they are not strictly separated from each other and overlap each other. The region is referred to as a region 23. With the region 23, the total area occupied by the gate driver circuit 21 and the data driver circuit 22 can be reduced. Thus, even when the area of the display portion 33 is small, the gate driver circuit 21 and the data driver circuit 22 can be provided without extending beyond the display portion 33. Alternatively, the area of the region where the gate driver circuit 21 and the data driver circuit 22 do not overlap the display portion 33 can be reduced. Accordingly, the frame and size of the display device 10 can be further reduced compared to the case where the region 23 is not included.

Here, a structure in which the display device 10 includes the demultiplexer circuit 81 is employed, whereby the data driver circuit 22 does not need to generate all the data to be supplied to the pixels 34 in the first column to the n-th column at the same time, for example. For example, the case is considered where the demultiplexer circuits 81 each include a first output terminal and a second output terminal as output terminals, the wirings 32 in the odd-numbered columns are electrically connected to the first output terminals, and the wirings 32 in the even-numbered columns are electrically connected to the second output terminals. In this case, the data driver circuit 22 generates image data to be supplied to the pixels 34 in the even-numbered columns after generating image data to be supplied to the pixels 34 in the odd-numbered columns. Thus, the amount of data generated by the data driver circuit 22 at a time can be reduced, and accordingly the structure of the data driver circuit 22 can be simplified. Specifically, the number of elements such as transistors included in the data driver circuit 22 can be reduced. Accordingly, the area occupied by the data driver circuit 22 can be reduced. Therefore, even in the case where the display portion 33 has a small area, the data driver circuit 22 can be inhibited from extending beyond the display portion 33. Alternatively, the area of the region where the data driver circuit 22 does not overlap the display portion 33 can be reduced. Thus, the display device 10 can have a narrower frame and a smaller size.

The demultiplexer circuit 81 is provided in a layer different from both the layer where the data driver circuit 22 is provided and the layer where the display portion 33 is provided. This enables the demultiplexer circuit 81 to be provided to have a region overlapping the display portion 33 while the layout flexibility is increased. For example, the demultiplexer circuit 81 can be provided to have a region overlapping some of the pixels 34. Accordingly, the display device 10 can have a narrower frame and can a smaller size than in the case where the demultiplexer circuit 81 is provided in the layer 20 where the data driver circuit 22 is provided, for example. Note that from the viewpoint of inhibiting signal delay due to the resistance of the wiring 82 and the resistance of the wiring 32 for example, the wiring 82 and the wiring 32 are preferably as short as possible. Therefore, the demultiplexer circuit 81 is preferably provided to have a region overlapping the data driver circuit 22.

The circuit 40 can be provided so as not to overlap the display portion 33. Note that the circuit 40 may be provided to have a region overlapping the display portion 33.

The gate driver circuit 21 and/or the circuit 40 may be provided in the layer 80. In the case where the gate driver circuit 21 is provided in the layer 80, the gate driver circuit 21 and the demultiplexer circuit 81 may have a region where they are not strictly separated from each other and overlap each other.

<Structure Examples of Circuit 40 and Data Driver Circuit 22>

Figure 3:
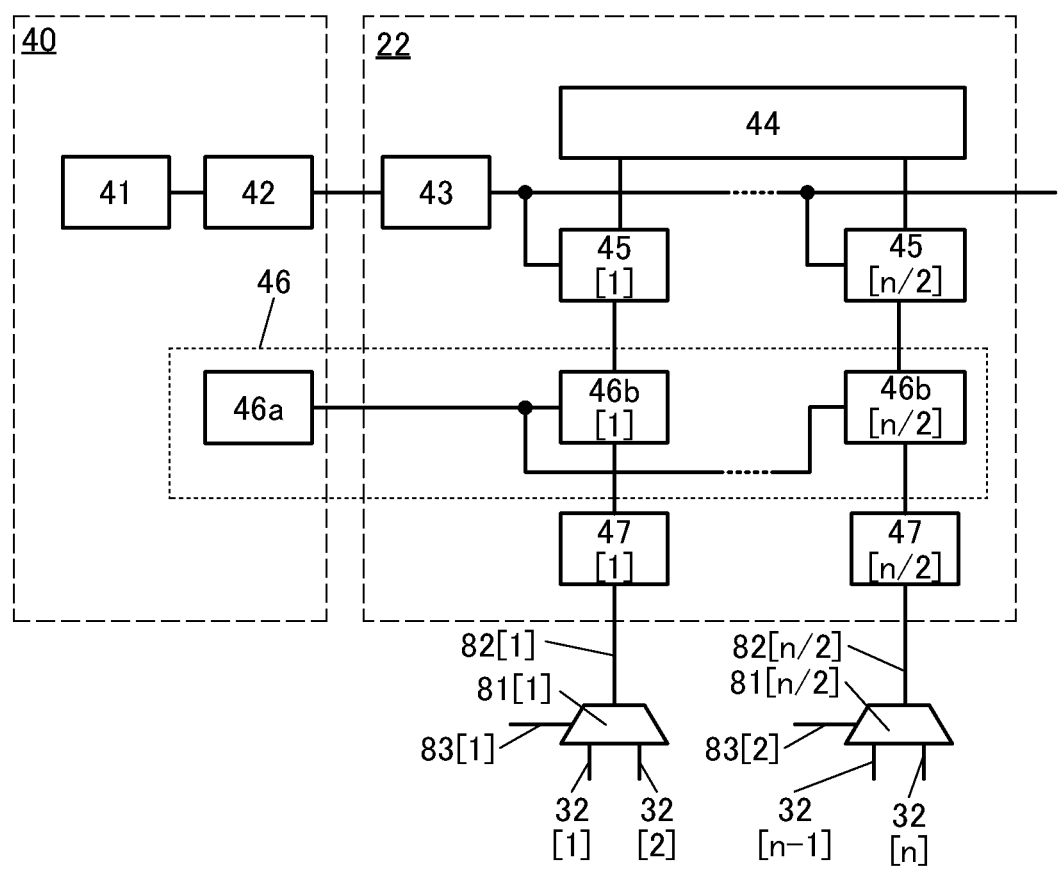
FIG. 3 is a block diagram illustrating a structure example of a display device.

FIG. 3 is a block diagram illustrating structure examples of the circuit 40 and the data driver circuit 22. Note that FIG. 3 illustrates the case where the demultiplexer circuit 81 includes two output terminals as illustrated in FIG. 1A and FIG. 2 and the display device 10 includes n/2 demultiplexer circuits 81.

The circuit 40 includes a receiver circuit 41, a serial-to-parallel converter circuit 42, and a potential generator circuit 46a. Note that in addition to the above circuits, a variety of circuits can be provided in the circuit 40. For example, a control circuit having a function of generating a start pulse signal, a clock signal, and the like can be provided in the circuit 40.

The data driver circuit 22 includes a buffer circuit 43, a shift register circuit 44, a latch circuit 45, a pass transistor logic circuit 46b, and an amplifier circuit 47. Here, the same number of latch circuits 45, pass transistor logic circuits 46b, and amplifier circuits 47 each as the demultiplexer circuits 81 can be provided. FIG. 3 illustrates the case where the data driver circuit 22 includes one shift register circuit 44, n/2 latch circuits 45, n/2 pass transistor logic circuits 46b, and n/2 amplifier circuits 47. In this specification and the like, for example, n/2 latch circuits 45, n/2 pass transistor logic circuits 46b, and n/2 amplifier circuits 47 are distinguished by being denoted by a latch circuit 45[1] to a latch circuit 45[n/2], a pass transistor logic circuit 46b[1] to a pass transistor logic circuit 46b[n/2], and an amplifier circuit 47[1] to an amplifier circuit 47[n/2], respectively. Here, for example, in the case where the data driver circuit 22 includes n/2 pass transistor logic circuits 46b, the potential generator circuit 46a and the pass transistor logic circuit 46b[1] to the pass transistor logic circuit 46b[n/2] constitute a D/A (Digital to Analog) converter circuit 46.

The receiver circuit 41 has a function of receiving data that serves as a base for image data generated by the data driver circuit 22. The data can be single-ended digital data. When the receiver circuit 41 receives data with the use of a data transmitting signal based on LVDS (Low Voltage Differential Signaling) or the like, the receiver circuit 41 may have a function of converting the received signal into a signal based on a standard that can undergo internal processing.

The serial-to-parallel converter circuit 42 has a function of performing parallel conversion of single-ended data output from the receiver circuit 41. Providing the serial-to-parallel converter circuit 42 in the circuit 40 allows data and the like to be transmitted from the circuit 40 to the data driver circuit 22 and the like even if the load is large at the time of transmitting data and the like from the circuit 40 to the data driver circuit 22 and the like.

The buffer circuit 43 can be a unity gain buffer, for example. The buffer circuit 43 has a function of outputting data identical to data output from the serial-to-parallel converter circuit 42. With the buffer circuit 43 provided in the data driver circuit 22, even if a potential corresponding to data output from the serial-to-parallel converter circuit 42 is lowered by wiring resistance or the like when being transmitted from the circuit 40 to the data driver circuit 22, a potential corresponding to the decrease amount can be recovered. Accordingly, the decrease in driving capability of the data driver circuit 22 and the like can be inhibited even if the load is large at the time of transmitting data and the like from the circuit 40 to the data driver circuit 22 and the like.

The shift register circuit 44 has a function of generating a signal for controlling the operation of the latch circuit 45. The latch circuit 45 has a function of holding or outputting data output from the buffer circuit 43. Whether the latch circuit 45 holds or outputs data is selected in accordance with a signal supplied from the shift register circuit 44.

The D/A converter circuit 46 has a function of converting digital data, which is output from the latch circuit 45, into an analog image data. The potential generator circuit 46a has a function of generating potentials that correspond to the number of bits of data capable of being subjected to D/A conversion and supplying the potentials to the pass transistor logic circuit 46b. For example, when the D/A converter circuit 46 has a function of converting 8-bit digital data into analog image data, the potential generator circuit 46a can generate 256 potentials with different levels from each other.

The pass transistor logic circuit 46b has a function of receiving data from the latch circuit and outputting, as an analog signal, any of the potentials generated by the potential generator circuit 46a on the basis of the digital value of the received data. For example, a potential output from the pass transistor logic circuit 46b can be higher as the digital value of data is higher.

As illustrated in FIG. 3, in the display device 10, the circuits constituting the D/A converter circuit 46 can be distributed between the data driver circuit 22 and the circuit 40. Specifically, a circuit that is preferably provided in each data driver circuit, such as the pass transistor logic circuit 46b, can be provided in the data driver circuit 22, and a circuit that is not necessarily provided in each data driver circuit, such as the potential generator circuit 46a, can be provided in the circuit 40. Accordingly, the number of potential generator circuits 46a included in the display device 10 can be smaller than the number of pass transistor logic circuits 46b. Thus, the area occupied by the data driver circuit 22 can be reduced. Therefore, even in the case where the display portion 33 has a small area, the data driver circuit 22 can be inhibited from extending beyond the display portion 33. Alternatively, the area of the region where the data driver circuit 22 does not overlap the display portion 33 can be reduced. Thus, the display device 10 can have a narrower frame and can have a smaller size. Here, the components of a circuit other than the D/A converter circuit 46 can also be distributed between the data driver circuit 22 and the circuit 40.

The amplifier circuit 47 has a function of amplifying an analog signal output from the pass transistor logic circuit 46b and outputting the amplified signal to the wiring 82. Providing the amplifier circuit 47 allows image data represented by an analog signal to be stably supplied to the demultiplexer circuit 81. As the amplifier circuit 47, a voltage follower circuit including an operational amplifier and the like can be used, for example. Note that in the case where a circuit including a differential input circuit is used as the amplifier circuit, the offset voltage of the differential input circuit is preferably set as close to 0 V as possible.

In the case where the display device 10 does not include the demultiplexer circuit 81, the data driver circuit 22 needs to include n latch circuits 45, n pass transistor logic circuits 46b, and n amplifier circuits 47, for example By contrast, in the case where the display device 10 includes the demultiplexer circuit 81, as illustrated in FIG. 3, the data driver circuit 22 can have a structure including n/2 latch circuits 45, n/2 pass transistor logic circuits 46b, and n/2 amplifier circuits 47. Accordingly, the numbers of the latch circuits 45, the pass transistor logic circuits 46b, and the amplifier circuits 47 included in the data driver circuit 22 can be reduced. Specifically, the numbers of the latch circuits 45, the pass transistor logic circuits 46b, and the amplifier circuits 47 included in the data driver circuit 22 can be smaller than n that is the number of columns of the pixels 34. Thus, for example, the number of elements such as transistors included in the data driver circuit 22 can be reduced, and accordingly the area occupied by the data driver circuit 22 can be reduced. Therefore, even in the case where the display portion 33 has a small area, the data driver circuit 22 can be inhibited from extending beyond the display portion 33. Alternatively, the area of the region where the data driver circuit 22 does not overlap the display portion 33 can be reduced. Accordingly, the display device 10 can have a narrower frame and a smaller size.

Here, FIG. 3 illustrates the case where the demultiplexer circuit 81 includes two output terminals. In the case where the demultiplexer circuit 81 includes three or more output terminals, the numbers of the latch circuits 45, the pass transistor logic circuits 46b, and the amplifier circuits 47 included in the data driver circuit 22 can be further reduced. Accordingly, the area occupied by the data driver circuit 22 can be further reduced.

<Structure Examples of Pixel 34>

Figure 4A:
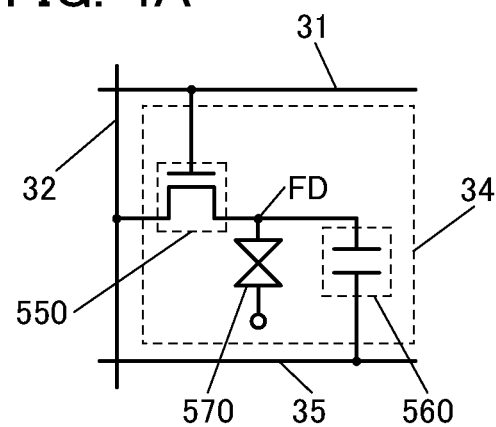
FIG. 4A to FIG. 4C are circuit diagrams illustrating pixel structure examples.
Figure 4B:
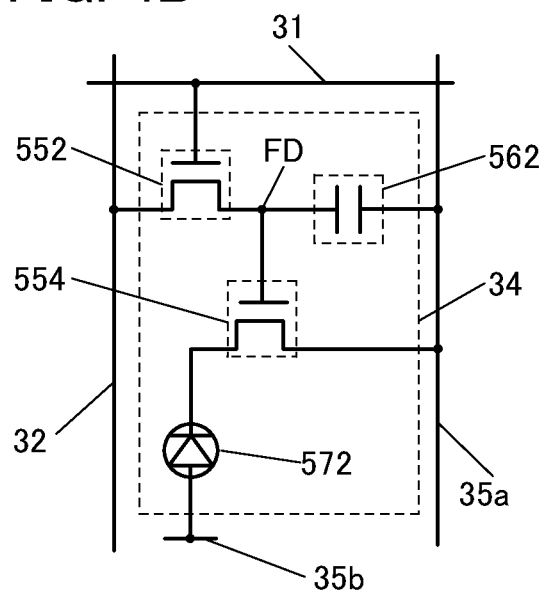

FIG. 4A and FIG. 4B are circuit diagrams illustrating structure examples of the pixel 34. The pixel 34 with the structure illustrated in FIG. 4A includes a liquid crystal element 570, a transistor 550, and a capacitor 560. Note that the capacitor 560 is not necessarily provided if the capacitance of the liquid crystal element 570 or the like is sufficiently large in the pixel 34 with the structure illustrated in FIG. 4A.

One of a source and a drain of the transistor 550 is electrically connected to one electrode of the liquid crystal element 570. The one electrode of the liquid crystal element 570 is electrically connected to one electrode of the capacitor 560. The other of the source and the drain of the transistor 550 is electrically connected to the wiring 32. A gate of the transistor 550 is electrically connected to the wiring 31. The other electrode of the capacitor 560 is electrically connected to a wiring 35. Note that a node at which the one of the source and the drain of the transistor 550, the one electrode of the liquid crystal element 570, and the one electrode of the capacitor 560 are electrically connected to each other is referred to as a node FD.

The potential of the other electrode of the liquid crystal element 570 is set in accordance with the specifications of the pixel 34 as appropriate. The alignment state of the liquid crystal element 570 is set depending on image data written to the pixel 34. Note that a common potential may be supplied to the other electrode of the liquid crystal element 570 included in each of the plurality of pixels 34. The potential supplied to the other electrode of the liquid crystal element 570 in the pixel 34 may differ between rows.

In addition, the pixel 34 with the structure illustrated in FIG. 4B includes a transistor 552, a transistor 554, a capacitor 562, and a light-emitting element 572. Note that the capacitor 562 is not necessarily provided if the gate capacitance of the transistor 554 is sufficiently high, for example.

One of a source and a drain of the transistor 552 is electrically connected to a gate of the transistor 554. The gate of the transistor 554 is electrically connected to one electrode of the capacitor 562. One of a source and a drain of the transistor 554 is electrically connected to one electrode of the light-emitting element 572. The other of the source and the drain of the transistor 552 is electrically connected to the wiring 32. A gate of the transistor 552 is electrically connected to the wiring 31. The other of the source and the drain of the transistor 554 and the other electrode of the capacitor 562 are electrically connected to a wiring 35*a*. The other electrode of the light-emitting element 572 is electrically connected to a wiring 35*b*. Here, a node at which the one of the source and the drain of the transistor 552, the gate of the transistor 554, and the one electrode of the capacitor 562 are electrically connected to each other is referred to as the node FD.

In the pixel 34 with the structure illustrated in FIG. 4B, a low potential can be supplied to the wiring 35*a* and a high potential can be supplied to the wiring 35*b*, for example.

In the pixel 34 with the structure illustrated in FIG. 4B, a current flowing through the light-emitting element 572 is controlled in accordance with the potential of the node FD, whereby the luminance of light emitted from the light-emitting element 572 is controlled.

As the light-emitting element 572, an EL element utilizing electroluminescence can be used, for example. The EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, these carriers (electrons and holes) are recombined, which makes a light-emitting organic compound form an excited state and emit light when it returns from the excited state to a ground state. On the basis of such a mechanism, this light-emitting element is referred to as a current-excitation light-emitting element.

In this specification and the like, a voltage supplied to the display element such as a light-emitting element or a liquid crystal element refers to a difference between the potential applied to the one electrode of the display element and the potential applied to the other electrode of the display element.

The EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like in addition to the light-emitting compound.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions.

In order that light emitted from the light-emitting element can be extracted, at least one of the pair of electrodes is transparent. A transistor and a light-emitting element are formed over a substrate; the light-emitting element can have any of a top emission structure in which light emission is extracted from the surface on the side opposite to the substrate, a bottom emission structure in which light emission is extracted from the surface on the substrate side, or a dual emission structure in which light emission is extracted from both surfaces.

Figure 4C:
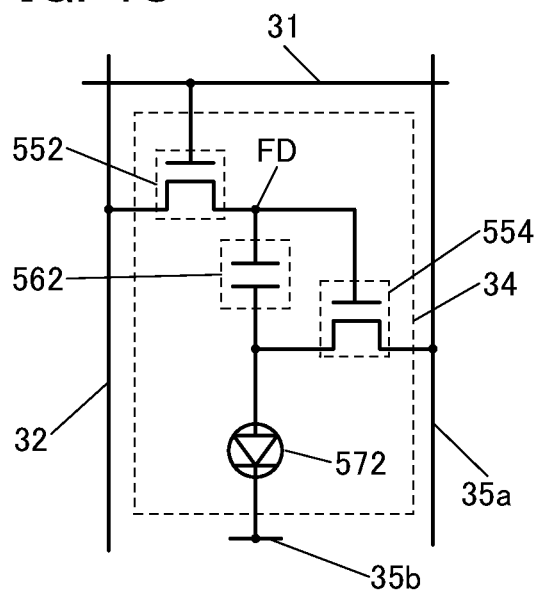

FIG. 4C illustrates a modification example of the pixel 34 with the structure illustrated in FIG. 4B. In the pixel 34 with the structure illustrated in FIG. 4C, the one of the source and the drain of the transistor 554 is electrically connected to the one electrode of the light-emitting element 572 and the other electrode of the capacitor 562. Meanwhile, the wiring 35*a* is not electrically connected to the other electrode of the capacitor 562. In the pixel 34 with the structure illustrated in FIG. 4C, a high potential can be supplied to the wiring 35a and a low potential can be supplied to the wiring 35b, for example.

<Example of Method for Operating Display Device 10>

Figure 5:
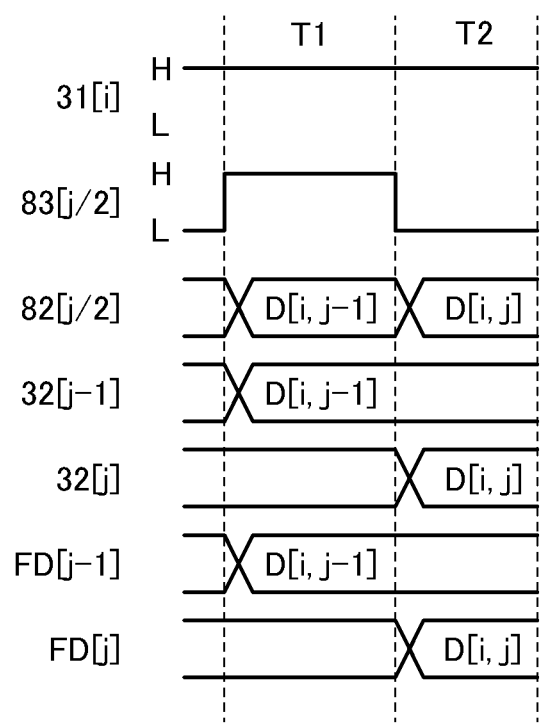
FIG. 5 is a timing chart illustrating an example of a method for operating a display device.

FIG. 5 is a timing chart illustrating an example of a method for operating the display device 10 including the pixels 34 with any of the structures illustrated in FIG. 4A to FIG. 4C. The timing chart of FIG. 5 illustrates an example of a method for operating the display device 10 in the case where the demultiplexer circuit 81 includes two output terminals and the display device 10 includes n/2 demultiplexer circuits 81, for example. FIG. 5 illustrates an example of a method for operating a pixel 34[$i,j$−1] and a pixel 34[$i,j$] (i is an integer greater than or equal to 1 and less than or equal to m, and j is an even number greater than or equal to 2 and less than or equal to n). Specifically, FIG. 5 illustrates changes over time in the potential of a wiring 31[$i$], the potential of a wiring 83[$j/2$], the potential of a wiring 82[$j/2$], the potential of a wiring 32[$j$−1], the potential of a wiring 32[$j$], the potential of a node FD[j−1], and the potential of a node FD[j]. Here, the node FD[j−1] represents the node FD included in the pixel 34 in the (j−1)th column, and the node FD[j] represents the node FD included in the pixel 34 in the j-th column.

The timing chart of FIG. 5 illustrates operation for generation of image data by the data driver circuit 22 and display of an image corresponding to the image data on the display portion 33. Specifically, operation in which an analog signal of a potential corresponding to data D[i,j−1] is supplied to the pixel 34[$i,j$−1] and an analog signal of a potential corresponding to data D[i,j] is supplied to the pixel 34[$i,j$] is illustrated. A selection control signal input from the wiring 83 to the demultiplexer circuit 81 is a 1-bit digital signal. In the case where the potential of the wiring 83[$j/2$] is a high potential, a demultiplexer circuit 81[$j/2$,] outputs the above analog signal, which is input from an input terminal, to the wiring 32[$j$−1]. By contrast, in the case where the potential of the wiring 83[$j/2$] is a low potential, the demultiplexer circuit 81[$j/2$] outputs the above analog signal, which is input from the input terminal, to the wiring 32[$j$].

In the timing chart of FIG. 5, the high potential is denoted by "H" and the low potential is denoted by "L." For simplification of description, the influence of various kinds of resistance such as wiring resistance; parasitic capacitance of a transistor, a wiring, or the like; and the threshold voltage of a transistor, for example, is not taken into account here.

In Period T1, the potential of the wiring 83[$j/2$] is set to a high potential, and the potential of the wiring 82[$j/2$] is set to a potential corresponding to the data D[i,j−1]. Accordingly, the potential of the wiring 32[$j$−1] becomes the potential corresponding to the data D[i,j−1]. Furthermore, the wiring 32[$j$−1] and the node FD[i,j−1] are electrically connected to each other by setting the potential of the wiring 31[$i$] to a high potential. In the above manner, the potential of the node FD[j−1] becomes the potential corresponding to the data D[i,j−1]; thus, the data D[i,j−1] is written to the pixel 34[$i,j$−1].

In Period T2, the potential of the wiring 83[$j/2$] is set to a low potential, and the potential of the wiring 82[$j/2$] is set to a potential corresponding to the data D[i,j]. Accordingly, the potential of the wiring 32[$j$] becomes the potential corresponding to the data D[i,j]. Furthermore, the wiring 32[$j$] and the node FD[i,j] are electrically connected to each other by setting the potential of the wiring 31[$i$] to a high potential. In the above manner, the potential of the node FD[j] becomes the potential corresponding to the data D[i,j]; thus, the data D[i,j] is written to the pixel 34[$i,j$]. The above-described operation is performed on all the pixels 34 included in the display device 10, for example. Accordingly, an image can be displayed on the display portion 33.

<Structure Example 2 of Display Device 10>

Figure 6:
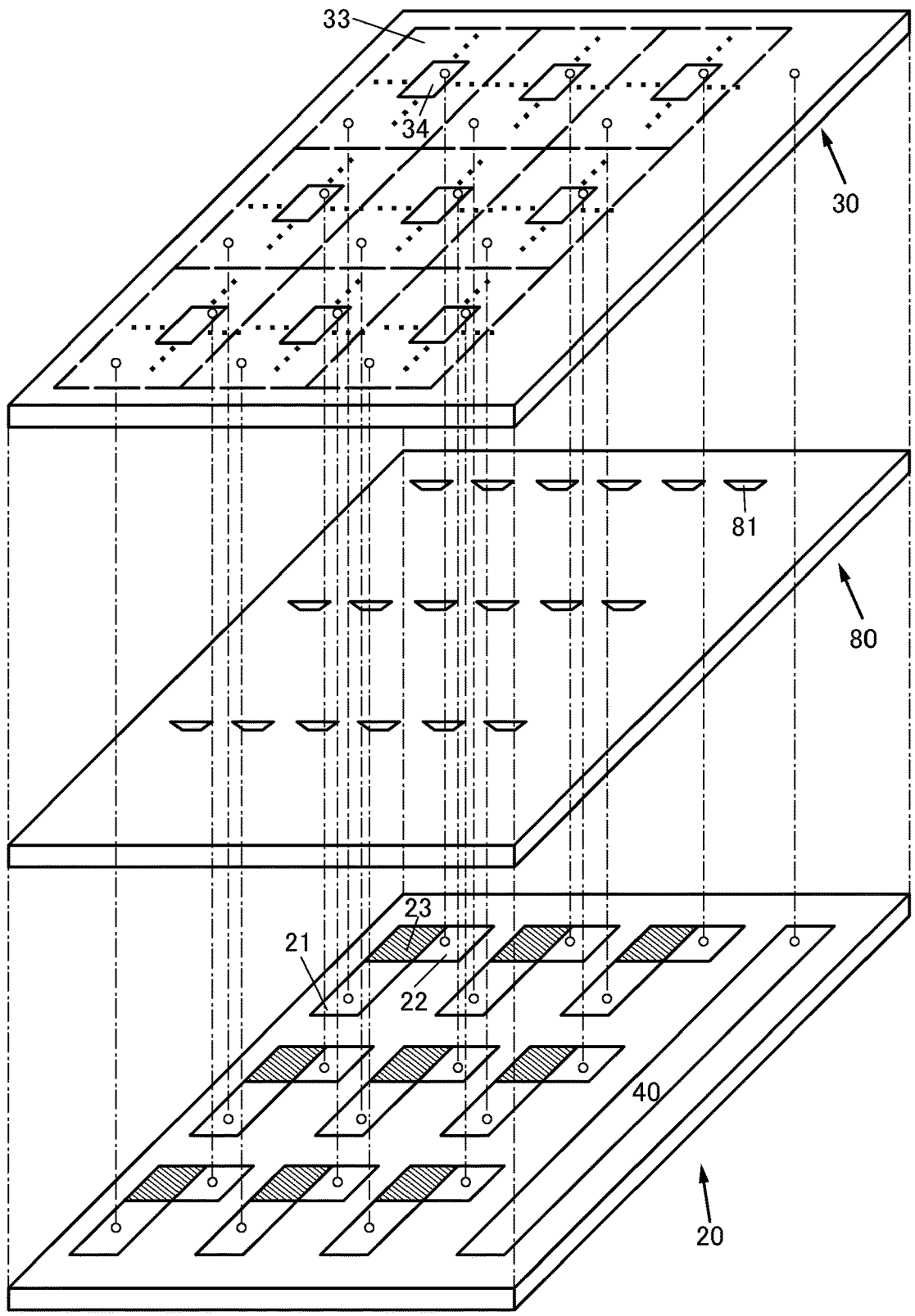
FIG. 6 is a block diagram illustrating a structure example of a display device.

FIG. 6 is a diagram illustrating a structure example of the display device 10. The display device 10 with the structure illustrated in FIG. 6 is different from the display device 10 with the structure illustrated in FIG. 2 in that a plurality of display portions 33 are provided in the layer 30, that is, the display portion provided in the layer 30 is divided. FIG. 6 illustrates a structure example of the display device 10 in which the display portions 33 of three rows by three columns are provided in the layer 30. Note that the layer 30 may include the display portions 33 of two rows by two columns, or the display portions 33 of four or more rows by four or more columns. The number of rows and the number of columns of the display portions 33 provided in the layer 30 may be different from each other. In the display device 10 with the structure illustrated in FIG. 6, one image can be displayed using all the display portions 33, for example.

Although the wiring 31, the wiring 32, the wiring 82, and the wiring 83 are omitted for simplicity in FIG. 6, the wiring 31, the wiring 32, the wiring 82, and the wiring 83 are actually provided in the display device 10 with the structure illustrated in FIG. 6. In addition, although the electrical connection relation of the circuit 40 is not illustrated, the circuit 40 is actually electrically connected to the data driver circuit 22. Note that as in FIG. 6, some components and the like may be omitted in other diagrams.

The layer 20 can be provided with the same number of gate driver circuits 21 as the display portions 33 and the same number of data driver circuits 22 as the display portions 33. In this case, each of the gate driver circuits 21 can be provided to overlap the display portion 33 including the pixel 34 to which the gate driver circuit 21 supplies a signal. Moreover, each of the data driver circuits 22 can be provided to overlap the display portion 33 including the pixel 34 to which the data driver circuit 22 supplies image data.

When a plurality of display portions 33 are provided and a plurality of gate driver circuits 21 and data driver circuits 22 are provided accordingly, the number of pixels 34 provided in one display portion 33 can be reduced. A plurality of gate driver circuits 21 can be operated in parallel and a plurality of data driver circuits 22 can be operated in parallel; thus, the time required for writing image data corresponding to a one-frame image to the pixels 34 can be shortened, for example. Thus, the length of one frame period can be shortened, and the display device 10 can operate at higher speed. Therefore, the number of pixels 34 included in the display device 10 can be increased, so that the resolution of an image displayed by the display device 10 can be increased. In addition, the resolution of an image that can be displayed by the display device of one embodiment of the present invention can be higher than the resolution of an image that can be displayed by a display device in which gate driver circuits and data driver circuits do not overlap display portions. Furthermore, the clock frequency can be lowered, so that the power consumption of the display device 10 can be reduced.

Here, in the case of a structure in which the gate driver circuits and the data driver circuits do not overlap the display portions, the gate driver circuits and the data driver circuits are provided in a portion around the display portions, for example. In this case, it is difficult to provide display portions of more than two rows by more than two columns in terms of the positions where data driver circuits would be provided, for example. On the other hand, in the display device 10, the gate driver circuits and the data driver circuits can be provided in a layer different from the layer including the display portions, thereby having a region overlapping the display portions. Thus, as illustrated in FIG. 6, display portions of more than two rows by more than two columns can be provided. In other words, five or more gate driver circuits and five or more data driver circuits can be provided in the display device 10.

As described above, the display device 10 can operate at higher speed, for example, than a display device in which gate driver circuits and data driver circuits do not overlap display portions. Thus, the pixel density of the display device 10 can be higher than that of the display device in which the gate driver circuits and the data driver circuits do not overlap the display portions. For example, the pixel density of the display device 10 can be 1000 ppi or higher, 2000 ppi or higher, or 5000 ppi or higher. Thus, the display device 10 can display a high-resolution image. Consequently, the display device 10 can display high-quality images with little graininess and highly realistic images. Thus, the display device 10 can be suitably used for, in particular, a device having a display surface close to a user, especially a portable electronic device, a wearable electronic device (wearable device), an e-book reader, and the like. The display device 10 can also be suitably used for a VR device, an AR device, and the like. Furthermore, the display device 10 can be suitably used for a viewfinder such as an electronic viewfinder that is provided in a digital camera or the like that is an electronic device including an imaging device.

The resolution of an image that can be displayed by the display device 10 can be higher than the resolution of an image that can be displayed by the display device in which the gate driver circuit and the data driver circuit do not overlap the display portion. For example, in the case where the display device 10 is used for a viewfinder, the display device 10 can display an image having a resolution of 4K, 5K, or higher.

When the pixel density of the display device 10 is increased, transistors and the like provided in a driver circuit such as the data driver circuit 22 need to be provided to be integrated in high density. However, the area occupied by the data driver circuit 22 might become larger than the area of the display portion 33 because of the limitations of high-density integration, for example. Accordingly, the data driver circuit 22 might extend beyond the display portion 33. Alternatively, the area of a region of the data driver circuit 22 that does not overlap the display portion 33 might be increased. Thus, the size of a frame might be increased.

On the other hand, providing the demultiplexer circuit 81 in the display device 10 enables the number of elements such as transistors included in the data driver circuit 22 to be reduced as described above for example, and accordingly the area occupied by the data driver circuit 22 can be reduced. Therefore, even in the case where the pixel density of the display device 10 is high, the data driver circuit 22 can be inhibited from extending beyond the display portion 33. Alternatively, the area of the region where the data driver circuit 22 does not overlap the display portion 33 can be reduced. Thus, the display device 10 can have a narrower frame and can be smaller.

Note that even in the structure in which a plurality of data driver circuits 22 and the like are provided in the layer 20 and a plurality of display portions 33 are provided in the layer 30, the number of circuits 40 provided in the display device 10 can be one as in the structure illustrated FIG. 2.

Thus, as illustrated in FIG. 6, the circuit 40 can be provided not to overlap any of the display portions 33. Note that the circuit 40 may be provided to have a region overlapping any of the display portions 33.

Figure 7:
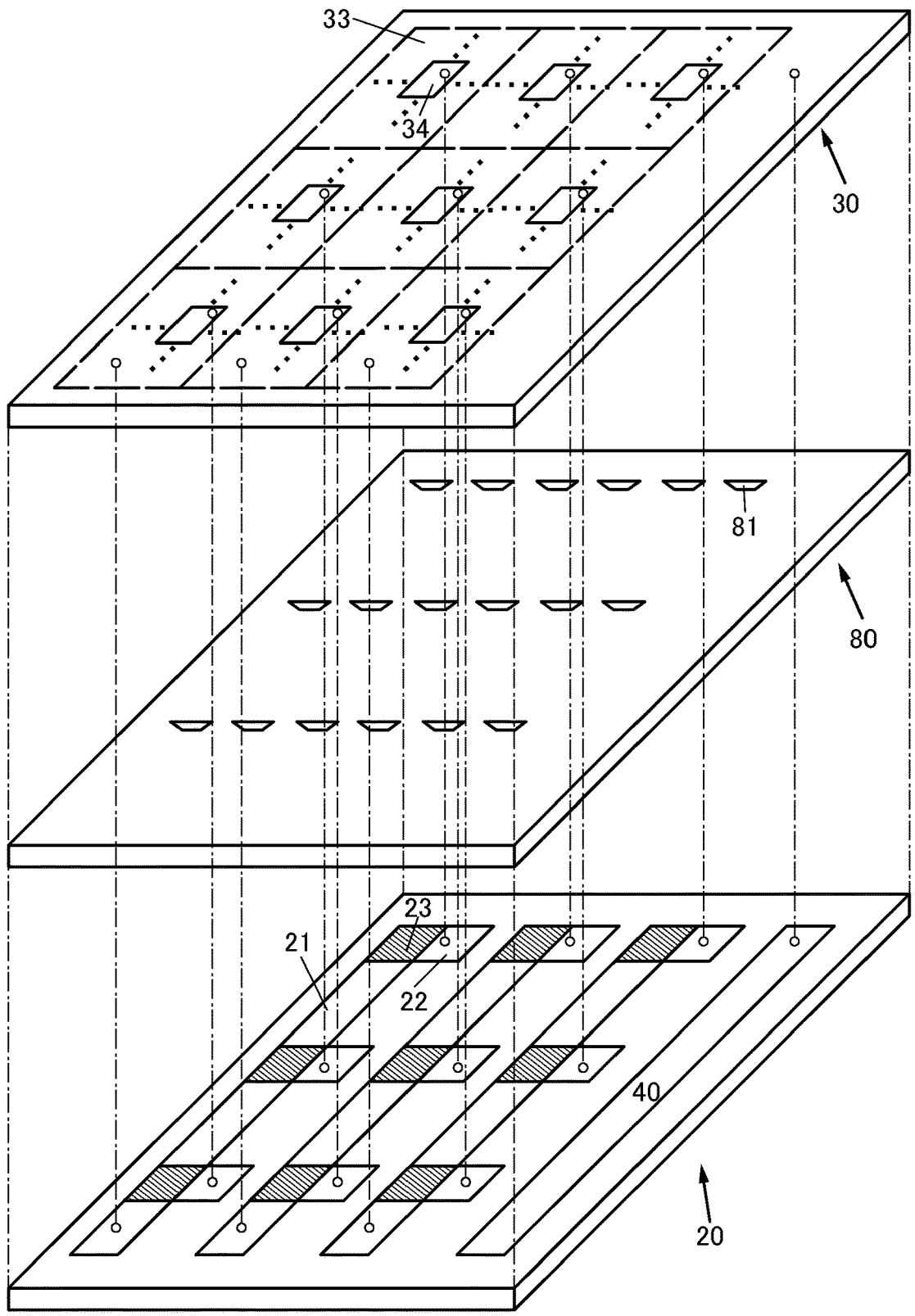
FIG. 7 is a block diagram illustrating a structure example of a display device.

Although FIG. 6 illustrates the structure example in which the number of gate driver circuits 21 is the same as the number of display portions 33, one embodiment of the present invention is not limited thereto. FIG. 7 illustrates a modification example of the structure illustrated in FIG. 6 and illustrates a structure example of the display device 10 in which the number of gate driver circuits 21 is the same as the number of columns of the display portions 33. In the display device 10 with the structure illustrated in FIG. 7, the display portions 33 of three columns are provided, and three gate driver circuits 21 are provided accordingly. In addition, the display portions 33 of three rows are provided, and the display portions 33 of three rows and one column share one gate driver circuit 21.

Figure 8:
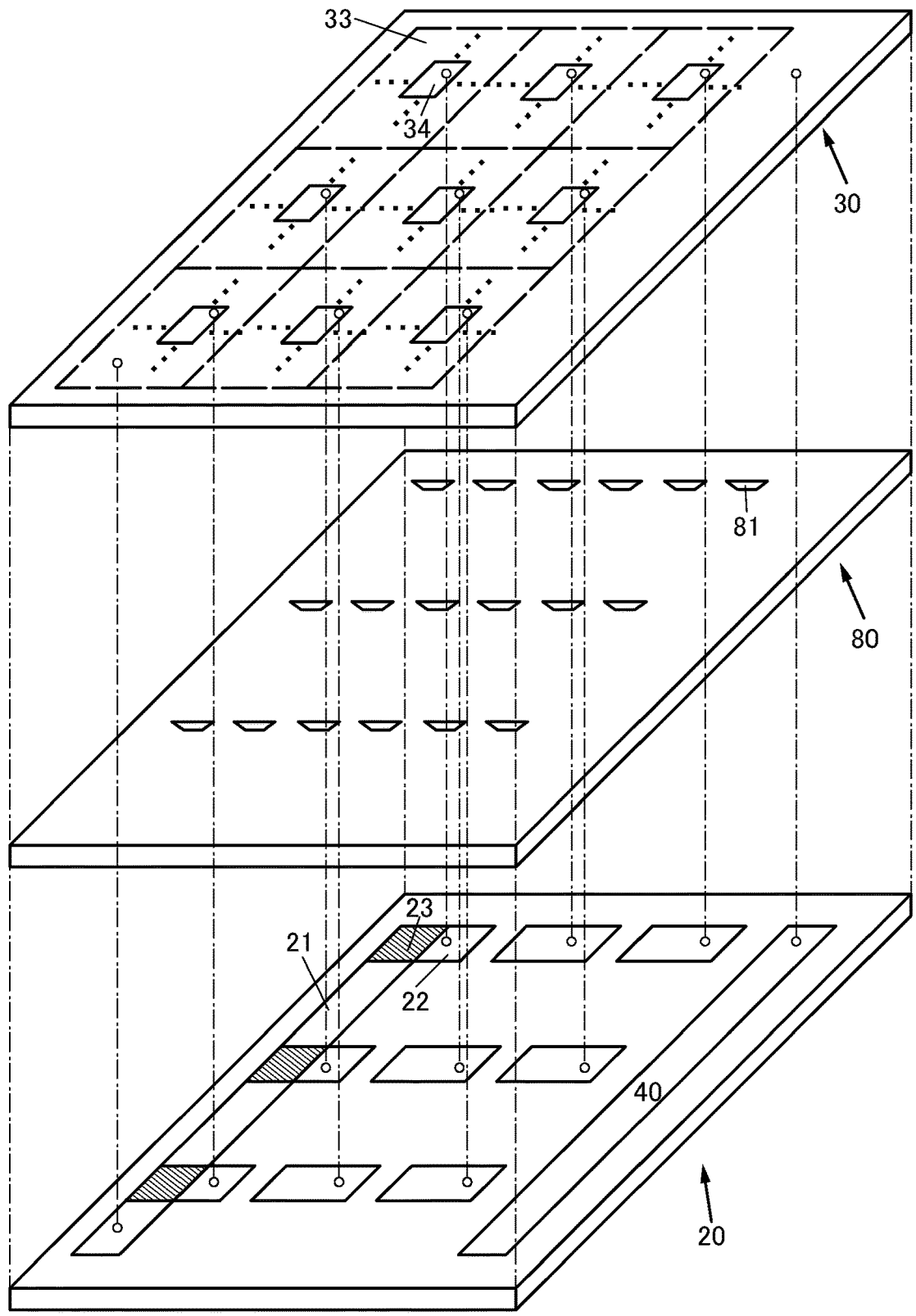
FIG. 8 is a block diagram illustrating a structure example of a display device.

FIG. 8 illustrates a modification example of the structure illustrated in FIG. 6 and illustrates a structure example of the display device 10 in which a plurality of display portions 33 and one gate driver circuit 21 are provided. In the display device 10 with the structure illustrated in FIG. 8, the display portions 33 of three rows and three columns share one gate driver circuit 21. Note that in the display device 10 with the structure illustrated in FIG. 8, the gate driver circuit 21 can be provided not to overlap the display portion 33.

Although not illustrated, the number of data driver circuits 22 is not necessarily the same as the number of display portions 33. The number of data driver circuits 22 in the display device 10 may be larger than or smaller than the number of display portions 33 in the display device 10.

Figure 9:
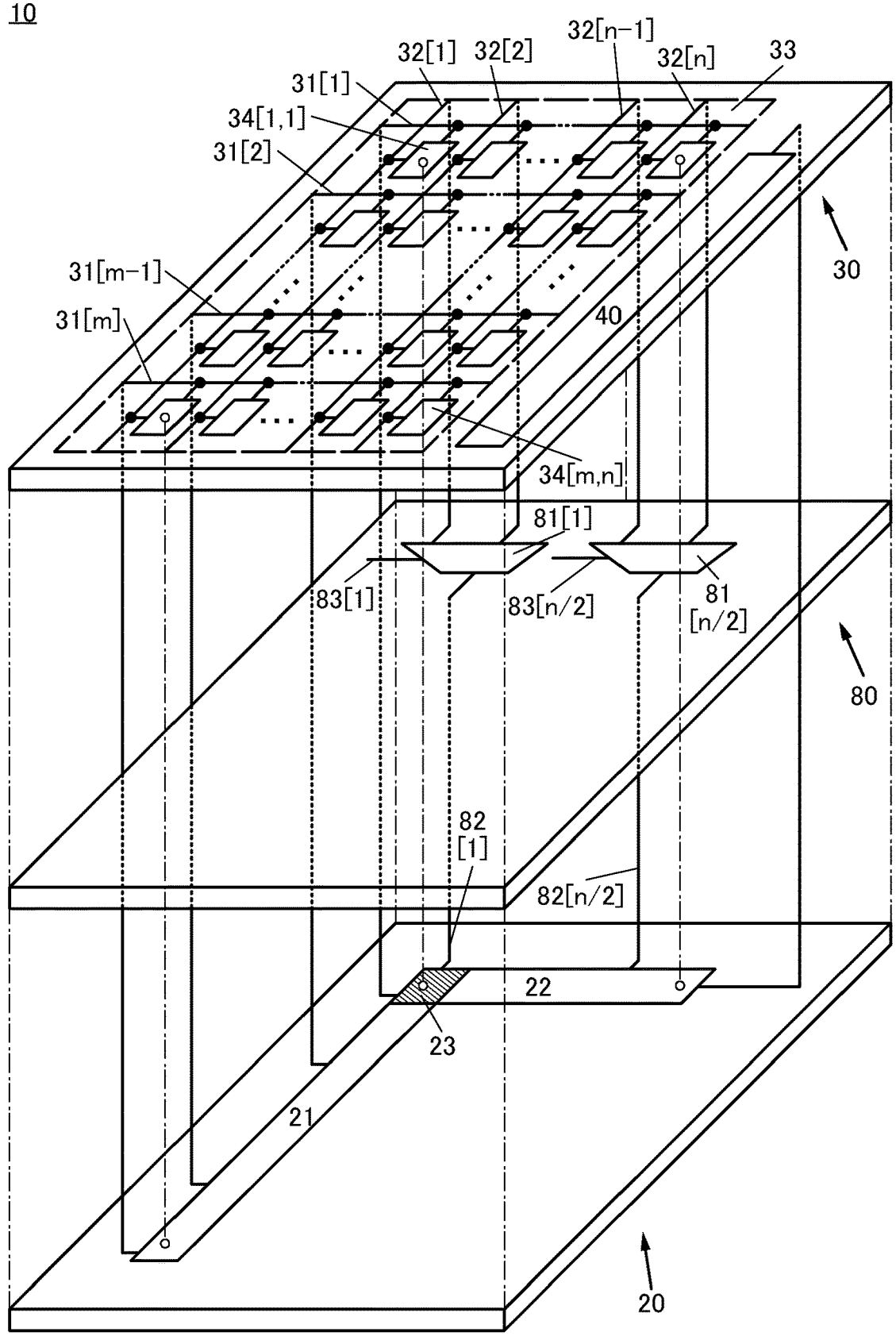
FIG. 9 is a block diagram illustrating a structure example of a display device.

Although FIG. 2 illustrates the structure example in which the circuit 40 is provided in the layer 20, the circuit 40 is not necessarily provided in the layer 20. FIG. 9 illustrates a modification example of the structure illustrated in FIG. 2 and illustrates a structure example of the display device 10 in which the circuit 40 is provided in the layer 30. Alternatively, the circuit 40 may be provided in the layer 80. Note that the components constituting the circuit 40 may be distributed among two or three layers of the layer 20, the layer 80, and the layer 30.

Figure 10:
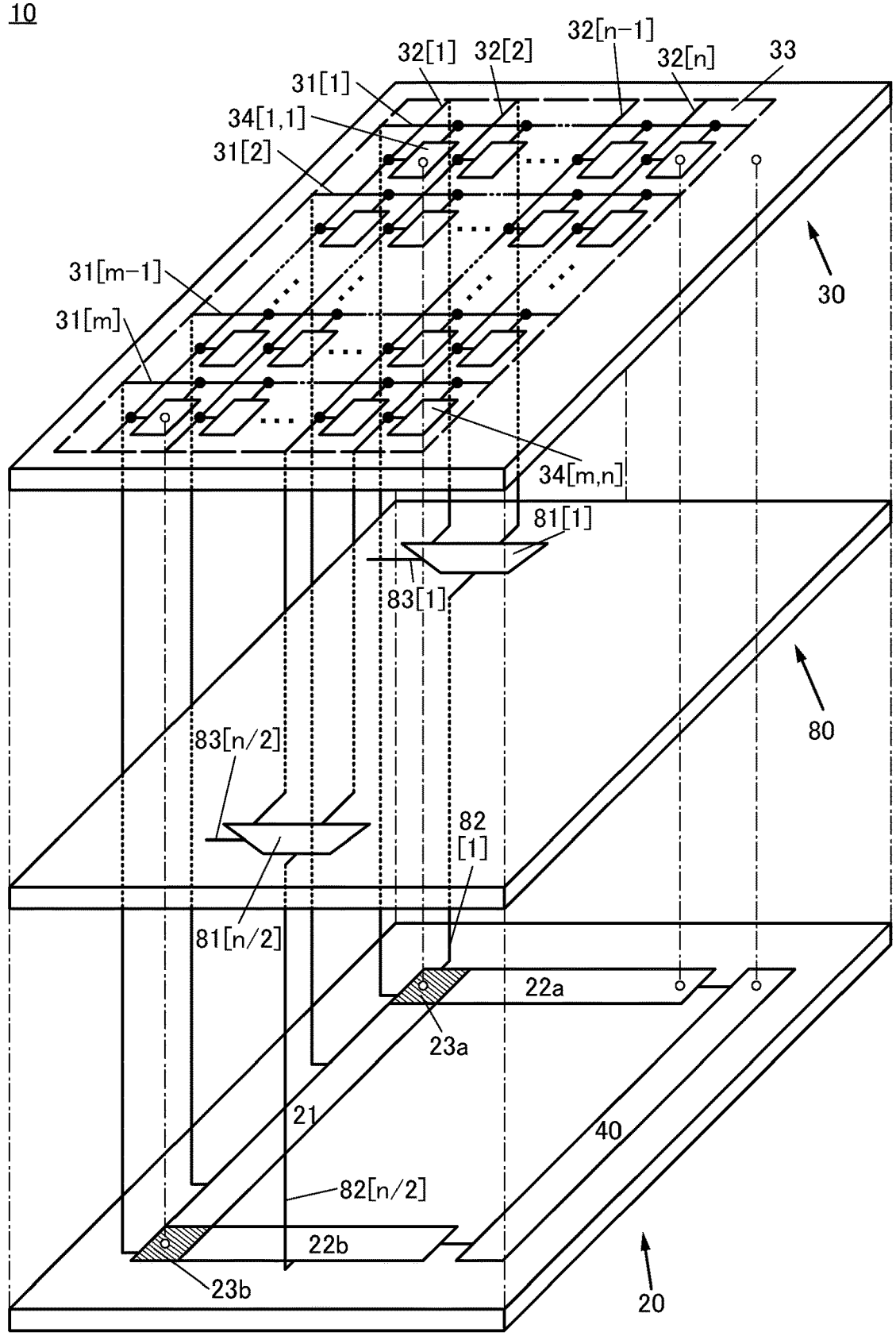
FIG. 10 is a block diagram illustrating a structure example of a display device.

Although FIG. 2 illustrates the structure example in which one display portion 33 and one data driver circuit are provided, the number of data driver circuits 22 may be larger than that of the display portions 33. FIG. 10 illustrates a modification example of the structure illustrated in FIG. 2 and illustrates a structure example of the display device 10 in which two data driver circuits (a data driver circuit 22a and a data driver circuit 22b) are provided for one display portion 33.

In the display device 10 with the structure illustrated in FIG. 10, an input terminal of the odd-numbered demultiplexer circuit 81 (the demultiplexer circuit 81[1], a demultiplexer circuit 81[3], or the like) is electrically connected to the data driver circuit 22a, and an input terminal of the even-numbered demultiplexer circuit 81 (the demultiplexer circuit 81[2], a demultiplexer circuit 81[4], or the like) is electrically connected to the data driver circuit 22b. Note that n/2 is an even number in FIG. 10.

The data driver circuit 22a has a function of generating image data that represents an image displayed with the use of the pixel 34 electrically connected to the output terminal of the odd-numbered demultiplexer circuit 81. The data driver circuit 22b has a function of generating image data that represents an image displayed with the use of the pixel 34 electrically connected to the output terminal of the even-numbered multiplexer circuit 81. It can be said that the image data generated by the data driver circuit 22*a* and the image data generated by the data driver circuit 22*b* enable one image to be displayed.

Like the data driver circuit 22, the data driver circuit 22*a* and the data driver circuit 22*b* include a region overlapping the display portion 33. For example, the data driver circuit 22*a* and the data driver circuit 22*b* include a region overlapping some of the pixels 34, like the data driver circuit 22. The data driver circuit 22*a* includes a region 23*a* where the data driver circuit 22*a* overlaps the gate driver circuit 21 without being strictly separated from the gate driver circuit 21. The data driver circuit 22*b* includes a region 23*b* where the data driver circuit 22*b* overlaps the gate driver circuit 21 without being strictly separated from the gate driver circuit 21.

As illustrated in FIG. 10, providing a larger number of data driver circuits than the display portion 33 allows the density of transistors constituting the data driver circuits to be reduced. Accordingly, the layout flexibility of the display device 10 can be increased.

Note that the data driver circuit 22*a* and the data driver circuit 22*b* can have a structure similar to that of the data driver circuit 22 illustrated in FIG. 3.

Figure 11:
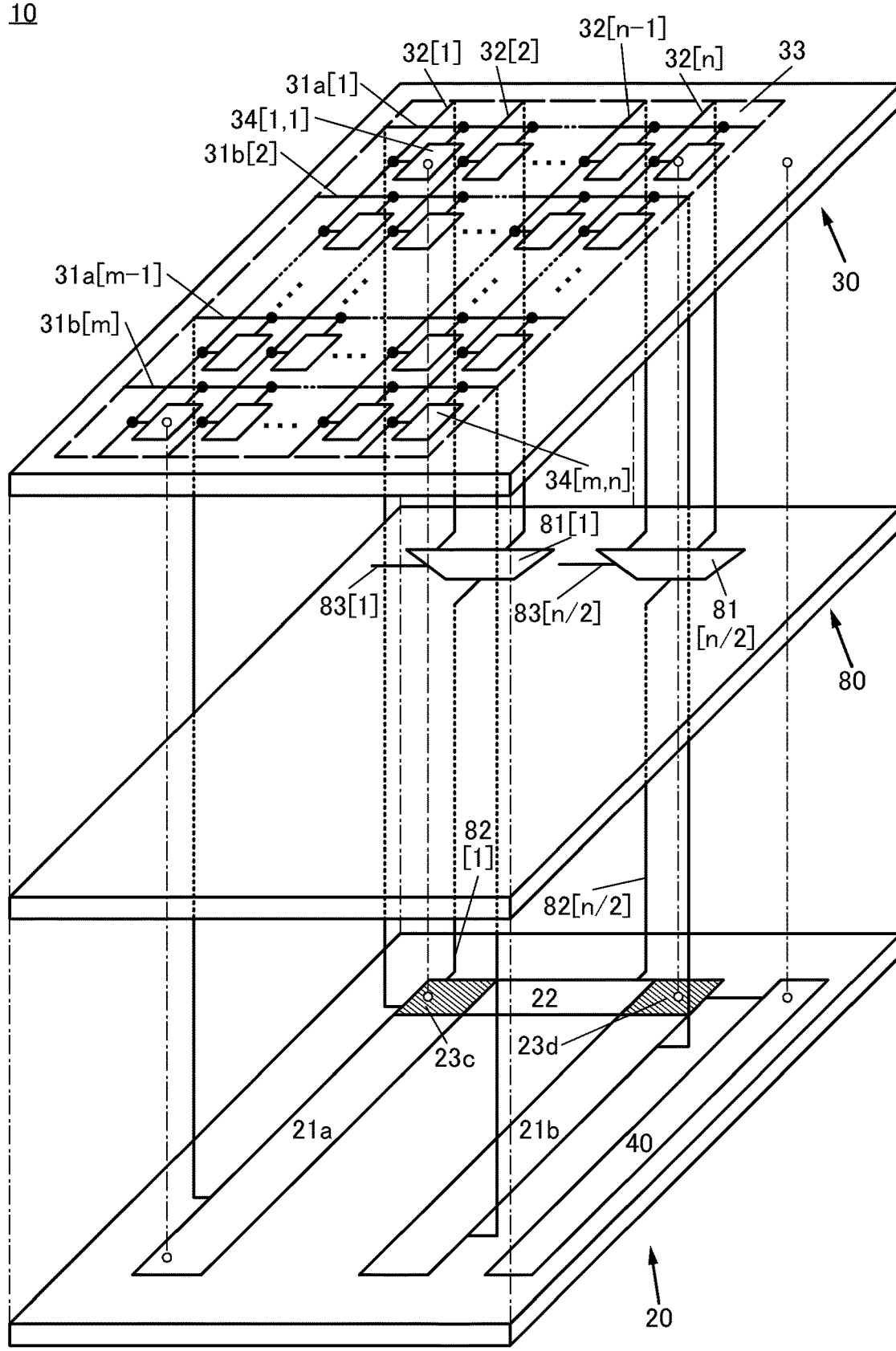
FIG. 11 is a block diagram illustrating a structure example of a display device.

Although FIG. 2 illustrates the structure example in which one display portion 33 and one gate driver circuit are provided, the number of gate driver circuits may be larger than that of the display portions 33. FIG. 11 illustrates a modification example of the structure illustrated in FIG. 2 and illustrates a structure example of the display device 10 in which two gate driver circuits (a gate driver circuit 21*a* and a gate driver circuit 21*b*) are provided for one display portion 33.

In the display device 10 with the structure illustrated in FIG. 11, the pixels 34 in an odd-numbered row are electrically connected to the gate driver circuit 21*a* through a wiring 31*a*, and the pixels 34 in an even-numbered row are electrically connected to the gate driver circuit 21*b* through a wiring 31*b*. The wiring 31*a* and the wiring 31*b* function as scan lines like the wiring 31.

The gate driver circuit 21*a* has a function of generating a signal for controlling the operation of the pixels 34 in the odd-numbered row and supplying the signal to the pixels 34 through the wiring 31*a*. The gate driver circuit 21*b* has a function of generating a signal for controlling the operation of the pixels 34 in the even-numbered row and supplying the signal to the pixels 34 through the wiring 31*b*.

Like the gate driver circuit 21, the gate driver circuit 21*a* and the gate driver circuit 21*b* include a region overlapping the display portion 33. For example, the gate driver circuit 21*a* and the gate driver circuit 21*b* include a region overlapping some of the pixels 34, like the gate driver circuit 21. The gate driver circuit 21*a* includes a region 23*c* where the gate driver circuit 21*a* overlaps the data driver circuit 22 without being strictly separated from the data driver circuit 22. The gate driver circuit 21*b* includes a region 23*d* where the gate driver circuit 21*b* overlaps the data driver circuit 22 without being strictly separated from the data driver circuit 22.

As illustrated in FIG. 11, providing a larger number of gate driver circuits than the display portion 33 allows the density of the transistors constituting the gate driver circuit to be reduced. Accordingly, the layout flexibility of the display device 10 can be increased.

In the display device 10 with the structure illustrated in FIG. 11, the gate driver circuit 21*a* can operate to write image data to all the pixels 34 in the odd-numbered rows, and then the gate driver circuit 21*b* can operate to write image data to all the pixels 34 in the even-numbered rows. In other words, the display device 10 with the structure illustrated in FIG. 11 can operate by an interlace method. With an interlace method, the operating speed of the display device 10 can be increased and the frame frequency can be increased. In addition, the number of pixels 34 to which image data is written in one frame period can be half that when the display device 10 operates by a progressive method. Thus, in the display device 10, the clock frequency can be lower in interlace driving than in progressive driving; hence, the power consumption of the display device 10 can be reduced.

Figure 12:
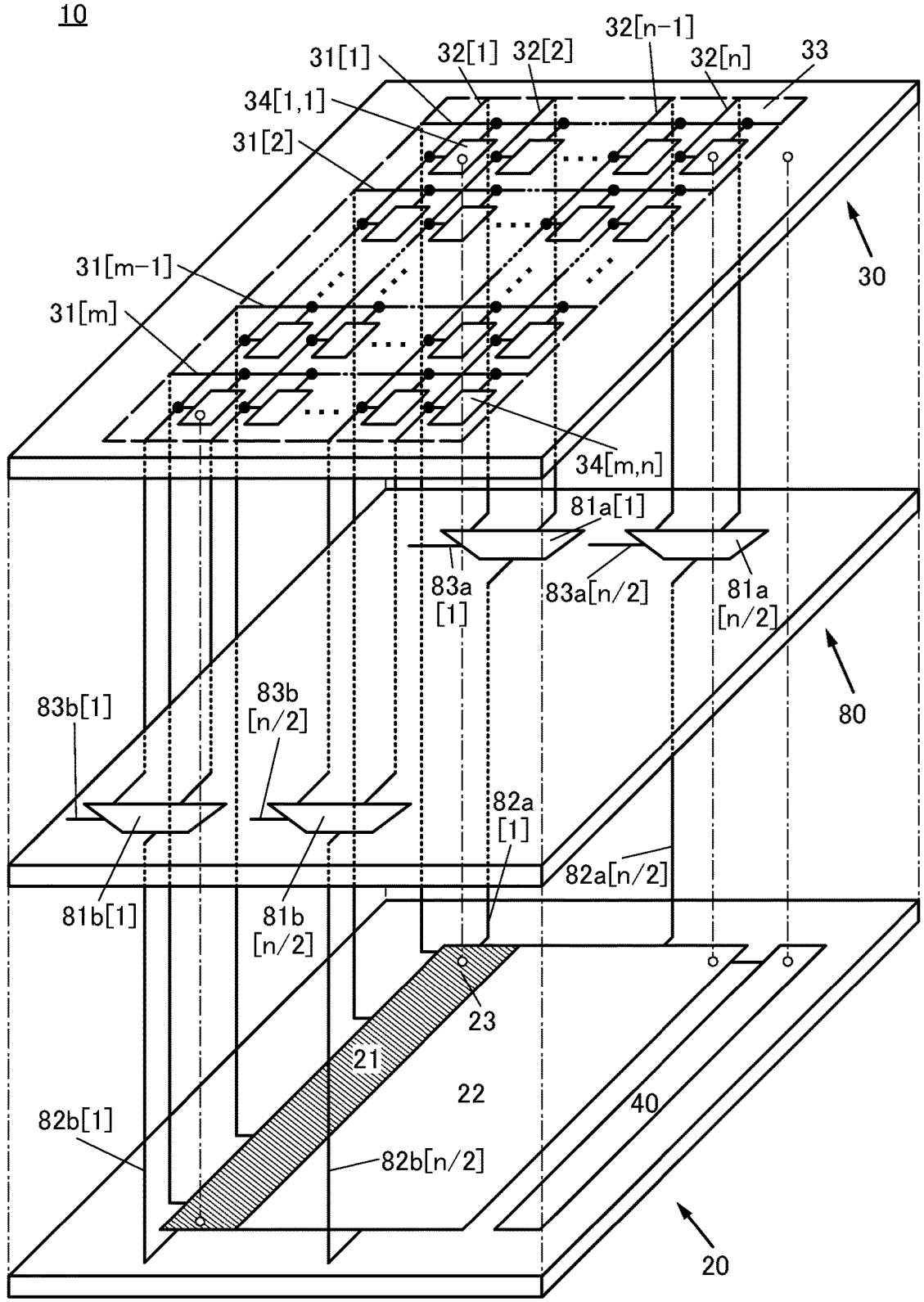
FIG. 12 is a block diagram illustrating a structure example of a display device.

Although FIG. 2 illustrates the structure in which only one end of the wiring 32 is connected to the output terminal of the demultiplexer circuit 81, a plurality of portions of the wiring 32 may be connected to the output terminal of the demultiplexer circuit. The plurality of portions of the wiring 32 may be connected to the data driver circuit 22, whereby the wiring length from the output terminal of the demultiplexer circuit to the pixel 34 can be shortened. This can inhibit signal delay and the like due to wiring resistance, parasitic capacitance, and the like, thereby increasing the operating speed of the display device 10. FIG. 12 illustrates a structure example of the display device 10 in the case where both ends of the wiring 32 are connected to output terminals of multiplexer circuits.

In FIG. 12, a demultiplexer circuit that is connected to one end of the wiring 32 is a demultiplexer circuit 81*a*, and a demultiplexer circuit that is connected to the other end of the wiring 32 is a demultiplexer circuit 81*b*. An input terminal of the demultiplexer circuit 81*a* is electrically connected to a wiring 82*a*, and an input terminal of the demultiplexer circuit 81*b* is electrically connected to a wiring 82*b*. Furthermore, a selection control signal input terminal of the demultiplexer circuit 81*a* is electrically connected to the wiring 83*a*, and a selection control signal input terminal of the demultiplexer circuit 81*b* is electrically connected to the wiring 83*b*.

Note that not only the one end and the other end of the wiring 32 but also another portion of the wiring 32 may be connected to the output terminal of the demultiplexer circuit. For example, a central portion of the wiring 32 may be connected to the output terminal of the demultiplexer circuit. By increasing the number of portions where the wiring 32 and the output terminal of the demultiplexer circuit are connected, signal delay and the like can be further inhibited and the operating speed of the display device 10 can be further increased. Note that, for example, a structure may be employed in which one end of the wiring 32 and a central portion of the wiring 32 are connected to the output terminal of the demultiplexer circuit and the other end of the wiring 32 is not connected to the output terminal of the demultiplexer circuit.

Note that a plurality of portions of the wiring 31 may be connected to one gate driver circuit 21. Thus, signal delay and the like can be inhibited and the operating speed of the display device 10 can be increased.

<Structure Example of D/A Converter Circuit 46>

Figure 13:
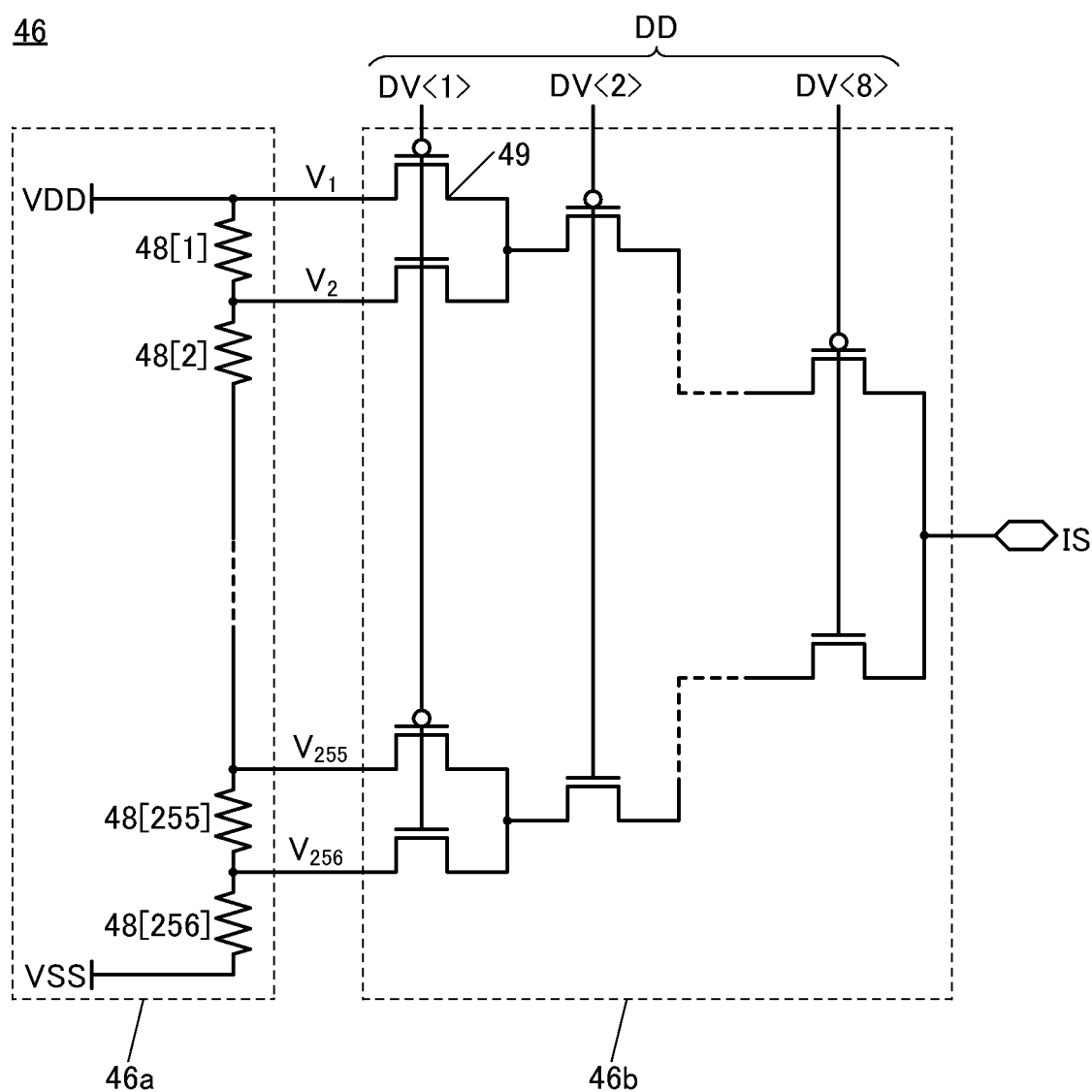
FIG. 13 is a circuit diagram illustrating a structure example of a D/A converter circuit.

FIG. 13 is a circuit diagram illustrating structure examples of the potential generator circuit 46*a* and the pass transistor logic circuit 46*b*, which constitute the D/A converter circuit 46. The D/A converter circuit 46 with the structure illustrated in FIG. 13 is capable of converting 8-bit digital data DD into analog image data IS. Note that although the data driver circuit 22 can include a plurality of pass transistor logic circuits 46b as illustrated in FIG. 3, one pass transistor logic circuit 46b is illustrated in FIG. 13 for convenience of explanation.

Here, for example, in the case where the digital data DD is 8-bit digital data, the digital data DD can be regarded as being formed of 8-digit digital values DV. In this specification and the like, the 8-digit digital values DV are denoted by a digital value DV<1> to a digital value DV<8> in ascending order of place, for example. In other words, for example, the digital value DV<1> to the digital value DV<8> each represent a 1-bit value (e.g., 0 or 1).

The potential generator circuit 46a with the structure illustrated in FIG. 13 includes a resistor 48[1] to a resistor 48[256] that are connected in series. In other words, the D/A converter circuit 46 can be a resistor-string D/A converter circuit.

A potential VDD can be supplied to one terminal of the resistor 48[1]. A potential VSS can be supplied to one terminal of the resistor 48[256]. Thus, potentials $V_1$ to $V_{256}$ that have different levels can be output from the terminals of the resistor 48[1] to the resistor 48[256]. Although FIG. 13 illustrates a structure example of the potential generator circuit 46a in which the potential $V_1$ is the potential VDD, the potential $V_{256}$ may be the potential VSS. Alternatively, the potential $V_1$ may be the potential VDD and the potential $V_{256}$ may be the potential VSS without providing the resistor 48[256].

In this specification and the like, the potential VDD can be a high potential and the potential VSS can be a low potential, for example.

The pass transistor logic circuit 46b with the structure illustrated in FIG. 13 is formed of 8-stage pass transistors 49. Specifically, the pass transistor logic circuit 46b has a structure in which one stage is split into two electrical paths; i.e., the pass transistor logic circuit 46b has a total of 256 paths. In other words, the pass transistors 49 can be regarded as being electrically connected in a tournament manner. The analog image data IS can be output from one of a source and a drain of the pass transistor 49 in the eighth stage, which is the last stage.

For example, the digital value DV<1> can be supplied to the pass transistor 49 in the first stage, the digital value DV<2> can be supplied to the pass transistors 49 in the second stage, and the digital value DV<8> can be supplied to the pass transistors 49 in the eighth stage. In this manner, the potential of the image data IS can be set to any of the potential $V_1$ to the potential $V_{256}$ in accordance with the digital data DD. Consequently, digital image data can be converted into the analog image data IS.

The pass transistor logic circuit 46b illustrated in FIG. 13 includes n-channel pass transistors 49 and p-channel pass transistors 49; alternatively, the pass transistor logic circuit 46b can include only n-channel pass transistors 49. For example, the pass transistors 49 provided in the pass transistor logic circuit 46b can be all n-channel transistors when the digital value DV<1> to the digital value DV<8> and their complementary data are supplied to gates of the pass transistors 49.

The structure illustrated in FIG. 13 can also be applied to the D/A converter circuit 46 having a function of performing D/A conversion on the digital data DD with bits other than 8 bits. For example, when 1024 or 1023 resistors 48 are provided in the potential generator circuit 46a and 10-stage pass transistors 49 are provided in the pass transistor logic circuit 46b, the D/A converter circuit 46 can have a function of performing D/A conversion on 10-bit digital data DD.

<Structure Example of Gate Driver Circuit 21>

Figure 14:
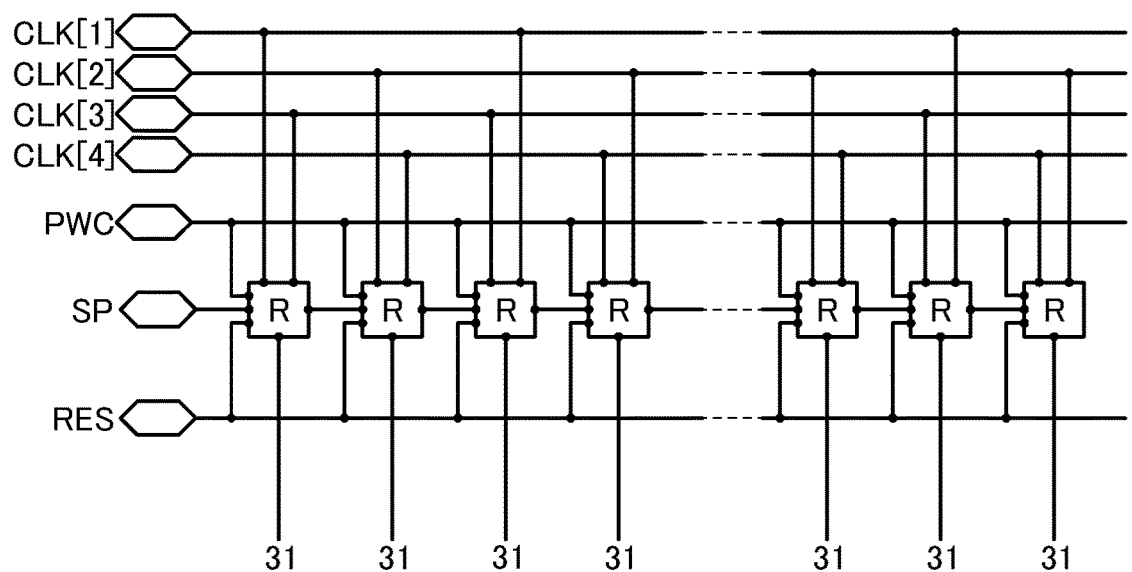
FIG. 14 is a block diagram illustrating a structure example of a gate driver circuit.

FIG. 14 is a block diagram illustrating a structure example of the gate driver circuit 21. Note that the structure can be applied to the gate driver circuit 21a and the gate driver circuit 21b illustrated in FIG. 11.

The gate driver circuit 21 includes shift register circuits R composed of a plurality of set-reset flip-flops. The shift register circuit R is electrically connected to the wiring 31 functioning as a scan line and has a function of outputting a signal to the wiring 31.

A signal RES is a reset signal; when the signal RES is set to a high potential, for example, all the outputs of the shift register circuits R can be a low potential. A signal SP is a start pulse signal; when the signal SP is input to the gate driver circuit 21, the shift operation of the register circuits R can be started. A signal PWC is a pulse width control signal and has a function of controlling the pulse width of a signal output from the register circuit R to the wiring 31. A signal CLK[1], a signal CLK[2], a signal CLK[3], and a signal CLK[4] are clock signals; for example, two of the signal CLK[1] to the signal CLK[4] can be input to one register circuit R.

Note that the structure illustrated in FIG. 14 can be applied to the shift register circuit 44 or the like included in the data driver circuit 22 when the wiring 31 electrically connected to the register circuit R is replaced with another wiring, for example.

Figure 15A:
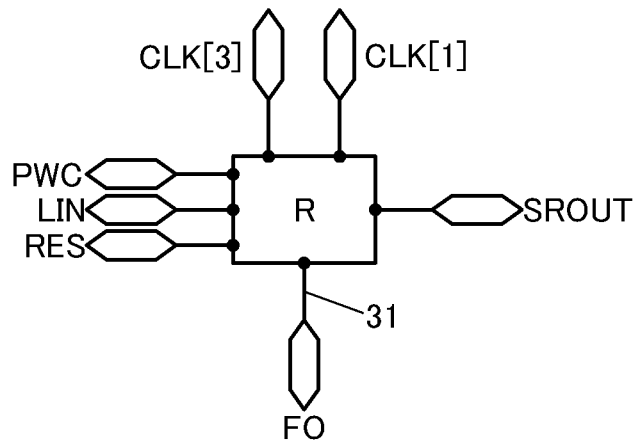
FIG. 15A is a block diagram illustrating a structure example of a register circuit.

FIG. 15A illustrates signals input to the register circuit R and signals output from the register circuit R. Here, FIG. 15A illustrates the case where the signal CLK[1] and the signal CLK[3] are input as the clock signals.

A signal FO is an output signal and is output to the wiring 31, for example. A signal SROUT is a shift signal and can be used as a signal LIN that is input to the next-stage register circuit R. Among the signals illustrated in FIG. 15A, the signal RES, the signal PWC, the signal CLK[1], the signal CLK[3], and the signal LIN are input to the register circuit R; the signal FO and the signal SROUT are output from the register circuit R.

Figure 15B:
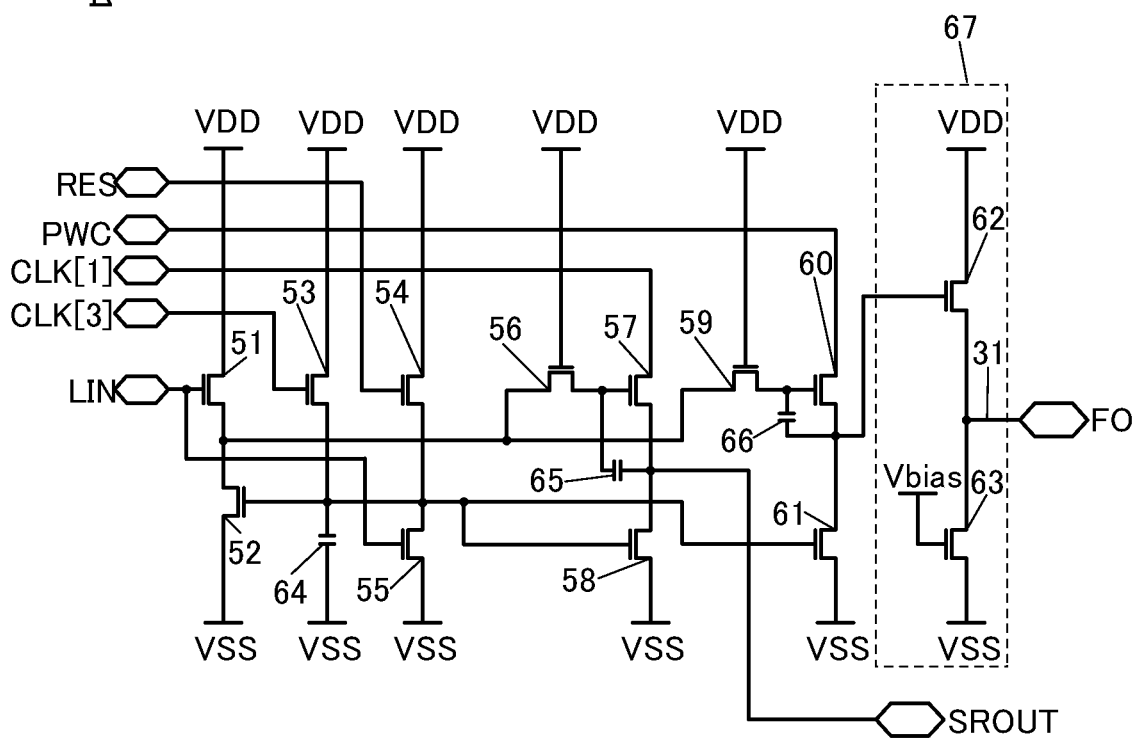
FIG. 15B is a circuit diagram illustrating a structure example of the register circuit.

FIG. 15B is a circuit diagram illustrating a structure example of the register circuit R that inputs and outputs the signals illustrated in FIG. 15A. The register circuit R includes a transistor 51 to a transistor 63 and a capacitor 64 to a capacitor 66.

One of a source and a drain of the transistor 51 is electrically connected to one of a source and a drain of the transistor 52, one of a source and a drain of the transistor 56, and one of a source and a drain of the transistor 59. A gate of the transistor 52 is electrically connected to one of a source and a drain of the transistor 53, one of a source and a drain of the transistor 54, one of a source and a drain of the transistor 55, a gate of the transistor 58, a gate of the transistor 61, and one electrode of the capacitor 64. The other of the source and the drain of the transistor 56 is electrically connected to a gate of the transistor 57 and one electrode of the capacitor 65. The other of the source and the drain of the transistor 59 is electrically connected to a gate of the transistor 60 and one electrode of the capacitor 66. One of a source and a drain of the transistor 60 is electrically connected to one of a source and a drain of the transistor 61, a gate of the transistor 62, and the other electrode of the capacitor 66.

The signal LIN is input to a gate of the transistor 51 and a gate of the transistor 55. The signal CLK[3] is input to a gate of the transistor 53. The signal RES is input to a gate of the transistor 54. The signal CLK[1] is input to one of a source and a drain of the transistor 57. The signal PWC is input to the other of the source and the drain of the transistor 60.

One of a source and a drain of the transistor 62 and one of a source and a drain of the transistor 63 are electrically connected to the wiring 31, and the signal FO is output from the wiring 31 as described above. The signal SROUT is output from the other of the source and the drain of the transistor 57, one of a source and a drain of the transistor 58, and the other electrode of the capacitor 65.

The potential VDD is supplied to the other of the source and the drain of the transistor 51, the other of the source and the drain of the transistor 53, the other of the source and the drain of the transistor 54, a gate of the transistor 56, a gate of the transistor 59, and other of the source and drain of the transistor 62. The potential VSS is supplied to the other of the source and the drain of the transistor 52, the other of the source and the drain of the transistor 55, the other of the source and the drain of the transistor 58, the other of the source and the drain of the transistor 61, the other of the source and the drain of the transistor 63, and the other electrode of the capacitor 64.

The transistor 63 is a bias transistor and functions as a constant current source. A potential Vbias that is a bias potential can be supplied to a gate of the transistor 63.

The transistor 62 and the transistor 63 constitute a source follower circuit 67. The source follower circuit can function as a buffer circuit. Thus, even if signal decay or the like due to wiring resistance, parasitic capacitance, or the like occurs inside the register circuit R, the source follower circuit 67 provided in the register circuit R can inhibit a decrease in the potential of the signal FO due to the signal decay or the like. This increases the operating speed of the display device 10. Note that the source follower circuit 67 may be replaced with another circuit as long as the circuit functions as a buffer. For example, a source-grounded circuit may be used.

<Structure Example of Region 23>

Figure 16:
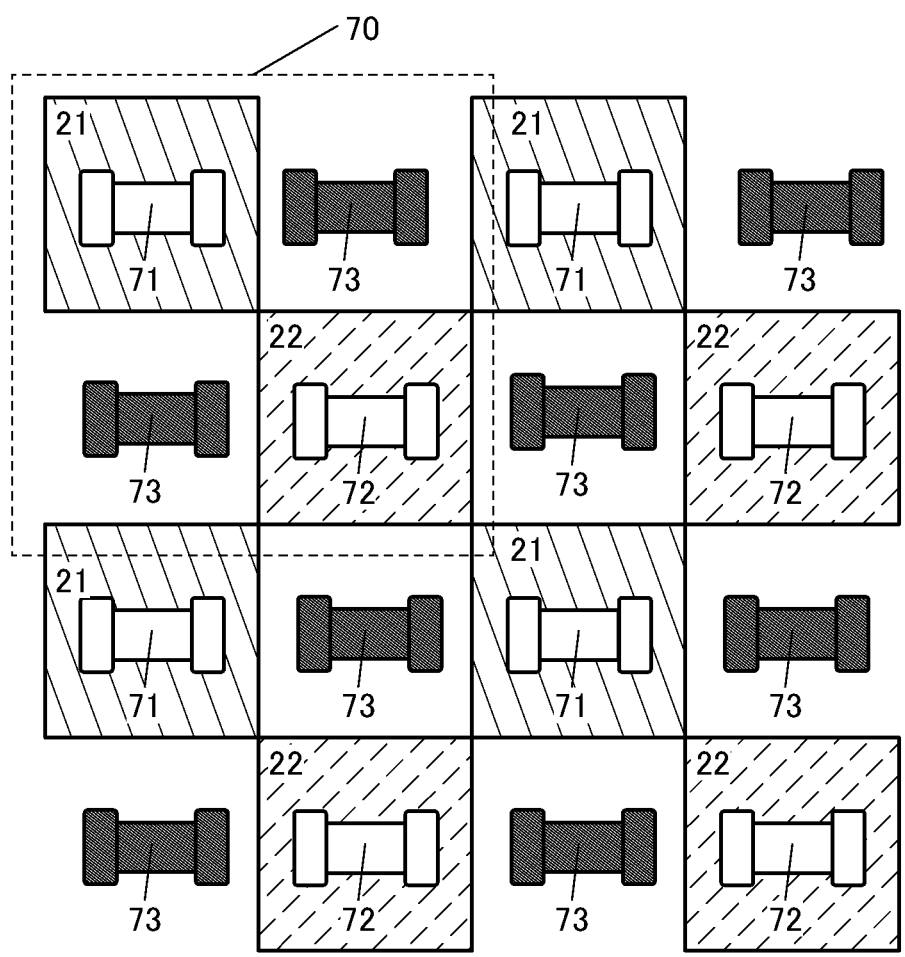
FIG. 16 is a schematic diagram illustrating arrangement of a gate driver circuit and a data driver circuit.

FIG. 16 illustrates a structure example of the region 23 where the gate driver circuit 21 and the data driver circuit 22 overlap each other. Note that the structure can be applied to the region 23a and the region 23b illustrated in FIG. 10 and the region 23c and the region 23d illustrated in FIG. 11.

As illustrated in FIG. 16, regions including a component of the gate driver circuit 21 and regions including a component of the data driver circuit 22 are arranged in a certain regular pattern in the region 23. FIG. 16 illustrates a transistor 71 as a component of the gate driver circuit 21 and a transistor 72 as a component of the data driver circuit 22.

FIG. 16 illustrates the case where the regions including the component of the gate driver circuit 21 are provided in the first row and the third row, and the regions including the component of the data driver circuit 22 are provided in the second row and the fourth row. In the region 23, a dummy element is provided between the regions including the component of the gate driver circuit 21. A dummy element is provided between the regions including the component of the data driver circuit 22. FIG. 16 illustrates a structure example of the region 23 in which four dummy transistors 73 are provided as dummy elements around the transistor 71 and around the transistor 72.

When the dummy elements such as the dummy transistors 73 are provided in the region 23, the dummy elements can absorb impurities and inhibit diffusion of impurities into the transistor 71, the transistor 72, and the like. Thus, the reliability of the transistor 71, the transistor 72, and the like can be increased, leading to higher reliability of the display device 10. Although the transistors 71, the transistors 72, and the dummy transistors 73 are arranged in a matrix in FIG. 16, they are not necessarily arranged in a matrix.

Figure 17:
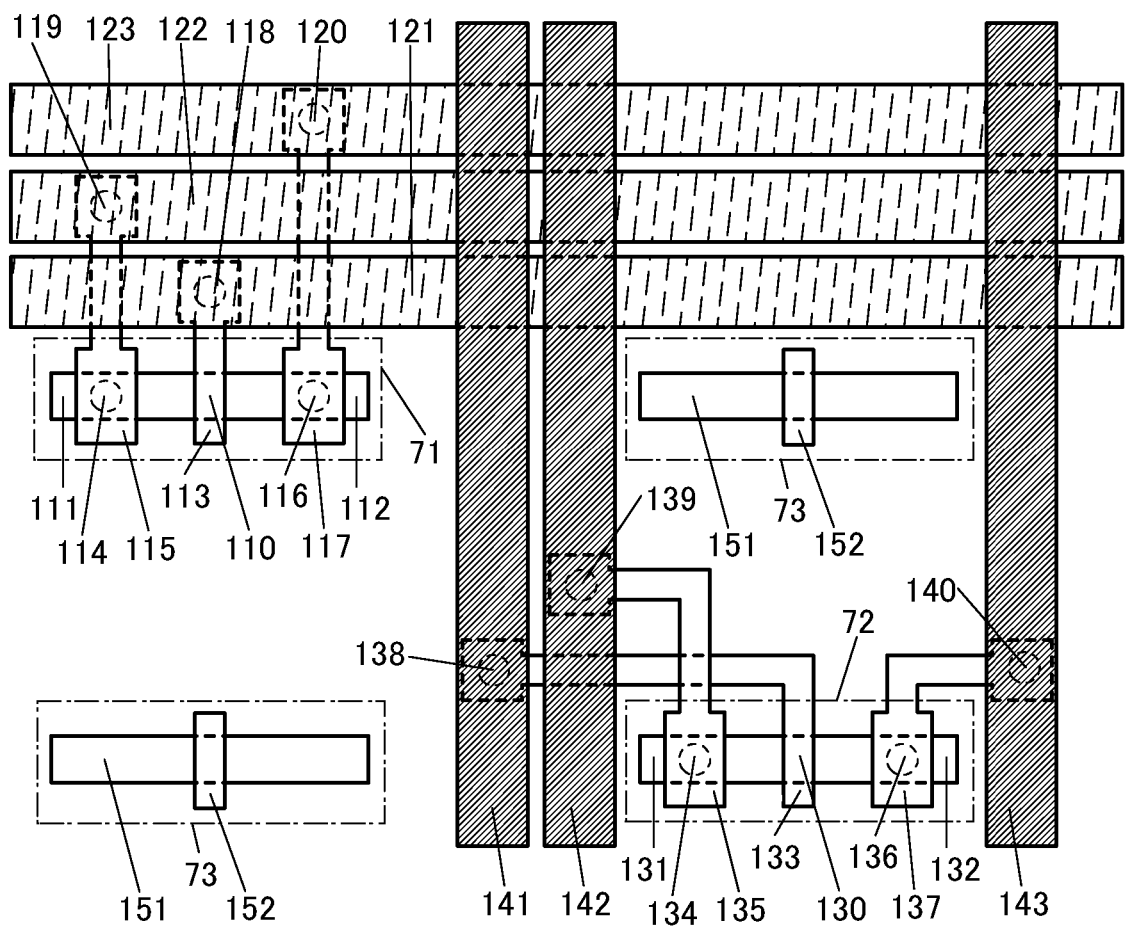
FIG. 17 is a top view illustrating structure examples of a gate driver circuit and a data driver circuit.

FIG. 17 is a top view illustrating a structure example of a region 70 that is part of the region 23. As illustrated in FIG. 16 and FIG. 17, one transistor 71, one transistor 72, and two dummy transistors 73 are provided in the region 70. As illustrated in FIG. 17, the transistor 71 includes a channel formation region 110, a source region 111, and a drain region 112. The transistor 71 also includes a gate electrode 113 that has a region overlapping the channel formation region 110.

Note that components such as a gate insulator are not illustrated in FIG. 17. The channel formation region, the source region, and the drain region are not illustrated as clearly separated regions in FIG. 17.

An opening 114 is provided in the source region 111, and the source region 111 is electrically connected to a wiring 115 through the opening 114. An opening 116 is provided in the drain region 112, and the drain region 112 is electrically connected to a wiring 117 through the opening 116.

An opening 118 is provided in the gate electrode 113, and the gate electrode 113 is electrically connected to a wiring 121 through the opening 118. An opening 119 is provided in the wiring 115, and the wiring 115 is electrically connected to a wiring 122 through the opening 119. An opening 120 is provided in the wiring 117, and the wiring 117 is electrically connected to a wiring 123 through the opening 120. In other words, the source region 111 is electrically connected to the wiring 122 through the wiring 115, and the drain region 112 is electrically connected to the wiring 123 through the wiring 117.

The transistor 72 includes a channel formation region 130, a source region 131, and a drain region 132. The transistor 72 also includes a gate electrode 133 that has a region overlapping the channel formation region 130.

An opening 134 is provided in the source region 131, and the source region 131 is electrically connected to a wiring 135 through the opening 134. An opening 136 is provided in the drain region 132, and the drain region 132 is electrically connected to a wiring 137 through the opening 136.

An opening 138 is provided in the gate electrode 133, and the gate electrode 133 is electrically connected to a wiring 141 through the opening 138. An opening 139 is provided in the wiring 135, and the wiring 135 is electrically connected to a wiring 142 through the opening 139. An opening 140 is provided in the wiring 137, and the wiring 137 is electrically connected to a wiring 143 through the opening 140. In other words, the source region 131 is electrically connected to the wiring 142 through the wiring 135, and the drain region 132 is electrically connected to the wiring 143 through the wiring 137.

Note that the channel formation region 110 can be provided in the same layer as the channel formation region 130. The source region 111 and the drain region 112 can be provided in the same layer as the source region 131 and the drain region 132. The gate electrode 113 can be provided in the same layer as the gate electrode 133. The wiring 115 and the wiring 117 can be provided in the same layer as the wiring 135 and the wiring 137. In other words, the transistor 71 can be provided in the same layer as the transistor 72. Consequently, the manufacturing process of the display device 10 can be simpler than the case where the transistor 71 and the transistor 72 are provided in different layers, making the display device 10 inexpensive.

The wiring 121 to the wiring 123 electrically connected to the transistor 71 included in the gate driver circuit 21 are provided in one layer. The wiring 141 to the wiring 143 electrically connected to the transistor 72 included in the data driver circuit 22 are provided in one layer. The wiring 121 to the wiring 123 are provided in a layer different from the layer where the wiring 141 to the wiring 143 are provided. In the above manner, an electrical short circuit between the transistor 71, which is the component of the gate driver circuit 21, and the transistor 72, which is the component of the data driver circuit 22, can be inhibited. Accordingly, a malfunction of the gate driver circuit 21 and the data driver circuit 22 can be inhibited even when the gate driver circuit 21 and the data driver circuit 22 have a region where they are not strictly separated from each other and overlap each other. As a result, the reliability of the display device 10 can be increased.

In this specification and the like, the expression "the same layer as A" means a layer that is formed in the same step as A and contains the same material as A, for example.

Although FIG. 17 illustrates the structure in which the wiring 141 to the wiring 143 are provided above the wiring 121 to the wiring 123, the wiring 141 to the wiring 143 may be provided below the wiring 121 to the wiring 123.

Although FIG. 17 illustrates the structure in which the wiring 121 to the wiring 123 extend in the horizontal direction and the wiring 141 to the wiring 143 extend in the perpendicular direction, one embodiment of the present invention is not limited thereto. For example, the wiring 121 to the wiring 123 may extend in the perpendicular direction, and the wiring 141 to the wiring 143 may extend in the horizontal direction. Alternatively, the wiring 121 to the wiring 123 and the wiring 141 to the wiring 143 may all extend in the horizontal direction or in the perpendicular direction.

The dummy transistor 73 includes a semiconductor 151 and a conductor 152. The conductor 152 includes a region overlapping the semiconductor 151. The semiconductor 151 can be formed in the same layer as the channel formation regions of the transistor 71 and the transistor 72. The conductor 152 can be formed in the same layer as the gate electrodes of the transistor 71 and the transistor 72. Note that one of the semiconductor 151 and the conductor 152 may be omitted in the dummy transistor 73.

The semiconductor 151 and the conductor 152 can be electrically isolated from other wirings or the like. A constant potential may be supplied to the semiconductor 151 and/or the conductor 152. For example, a ground potential may be supplied.

<Cross-Sectional Structure Example of Display Device 10>

Figure 18:
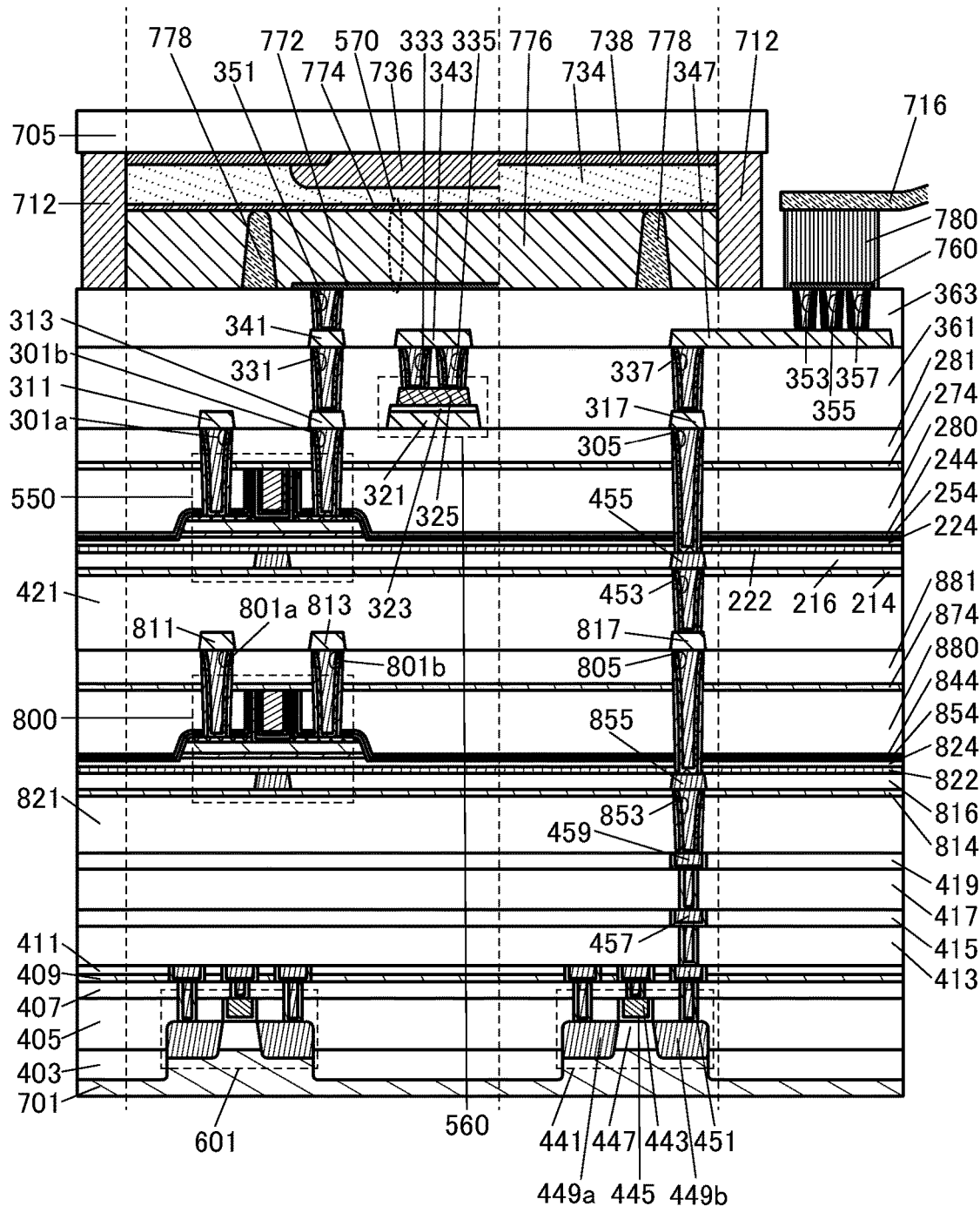
FIG. 18 is a cross-sectional view illustrating a structure example of a display device.

FIG. 18 is a cross-sectional view illustrating a structure example of the display device 10. The display device 10 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 can be a transistor provided in the circuit 40. The transistor 601 can be a transistor provided in the gate driver circuit 21 or a transistor provided in the data driver circuit 22. In other words, the transistor 441 and the transistor 601 can be provided in the layer 20 illustrated in FIG. 1B and the like.

The transistor 441 is formed of a conductor 443 functioning as a gate electrode, an insulator 445 functioning as a gate insulator, and part of the substrate 701 and includes a semiconductor region 447 including a channel formation region, a low-resistance region 449a functioning as one of a source region and a drain region, and a low-resistance region 449b functioning as the other of the source region and the drain region. The transistor 441 can be a p-channel transistor or an n-channel transistor.

The transistor 441 is electrically isolated from other transistors by an element isolation layer 403. FIG. 18 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 18, the semiconductor region 447 has a projecting shape. Moreover, the conductor 443 is provided to cover the side surface and the top surface of the semiconductor region 447 with the insulator 445 therebetween. Note that FIG. 18 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 18 illustrates the structure in which the projecting portion is formed by processing part of the substrate 701, a semiconductor having a projecting shape may be formed by processing an SOI substrate.

Note that the structure of the transistor 441 illustrated in FIG. 18 is only an example; the structure of the transistor 441 is not limited thereto and can be changed as appropriate in accordance with the circuit structure, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. The conductor 457 can be provided in the same layer as the wiring 121 to the wiring 123 illustrated in FIG. 17. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. The conductor 459 can be provided in the same layer as the wiring 141 to the wiring 143 illustrated in FIG. 17. Here, the top surface of the conductor 459 and the top surface of the insulator 419 can be substantially level with each other.

An insulator 821 and an insulator 814 are provided over the conductor 459 and the insulator 419. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 844, an insulator 880, an insulator 874, and an insulator 881 are provided over the conductor 855 and the insulator 816. A conductor 805 is embedded in the insulator 822, the insulator 824, the insulator 854, the insulator 844, the insulator 880, the insulator 874, and the insulator 881. Here, the top surface of the conductor 805 and the top surface of the insulator 881 can be substantially level with each other.

The insulator 421 and the insulator 214 are provided over the conductor 817 and the insulator 881. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display device 10 from outside of the display device 10 through the FPC 716.

As illustrated in FIG. 18, the low-resistance region 449b functioning as the other of the source region and the drain region of the transistor 441 is electrically connected to the FPC 716 through the conductor 451, the conductor 457, the conductor 459, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 18 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 800 is provided over the insulator 814. The transistor 800 can be a transistor provided in the demultiplexer circuit 81. In other words, the transistor 800 can be a transistor provided in the layer 80 illustrated in FIG. 1B. The transistor 800 can be an OS transistor.

A conductor 801a and a conductor 801b are embedded in the insulator 854, the insulator 844, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

A transistor 550 is provided over the insulator 214. As described above, the transistor 550 can be a transistor provided in the pixel 34. In other words, the transistor 550 can be provided in the layer 30 illustrated in FIG. 1B and the like. The transistor 550 can be an OS transistor. The OS transistor has a feature of extremely low off-state current. Thus, image data or the like can be held for a longer time, so that the refresh operation can be less frequent. Thus, the power consumption of the display device 10 can be reduced.

A conductor 301a and a conductor 301b are embedded in the insulator 254, the insulator 244, the insulator 280, the insulator 274, and the insulator 281. The conductor 301a is electrically connected to one of a source and a drain of the transistor 550, and the conductor 301b is electrically connected to the other of the source and the drain of the transistor 550. Here, the top surfaces of the conductor 301a and the conductor 301b and the top surface of the insulator 281 can be substantially level with each other.

Note that an OS transistor or the like may be provided between the layer where the transistor 441, the transistor 601, and the like are provided and the layer where the transistor 800 and the like are provided. Alternatively, an OS transistor or the like may be provided between the layer where the transistor 800 and the like are provided and the layer where the transistor 550 and the like are provided. Further alternatively, an OS transistor or the like may be provided above the layer where the transistor 550 and the like are provided.

A conductor 311, a conductor 313, a conductor 331, a capacitor 560, a conductor 333, and a conductor 335 are embedded in the insulator 361. The conductor 311 and the conductor 313 are electrically connected to the transistor 550 and function as wirings. The conductor 333 and the conductor 335 are electrically connected to the capacitor 560. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 821, the insulator 814, the insulator 880, the insulator 874, the insulator 881, the insulator 421, the insulator 214, the insulator 280, the insulator 274, the insulator 281, the insulator 361, and the insulator 363 function as an interlayer films and may also function as a planarization film that covers unevenness thereunder. For example, the top surface of the insulator 363 may be planarized by planarization treatment using a chemical mechanical polishing (CMP) method or the like to increase the level of planarity.

As illustrated in FIG. 18, the capacitor 560 includes a lower electrode 321 and an upper electrode 325. An insulator 323 is provided between the lower electrode 321 and the upper electrode 325. In other words, the capacitor 560 has a stacked-layer structure in which the insulator 323 functioning as a dielectric is positioned between the pair of electrodes. Although FIG. 18 illustrates the example in which the capacitor 560 is provided over the insulator 281, the capacitor 560 may be provided over an insulator other than the insulator 281.

FIG. 18 illustrates the example in which the conductor 801*a*, the conductor 801*b*, and the conductor 805 are formed in the same layer. FIG. 18 also illustrates the example in which the conductor 811, the conductor 813, and the conductor 817 are formed in the same layer. FIG. 18 also illustrates the example in which the conductor 301*a*, the conductor 301*b*, and the conductor 305 are formed in the same layer. FIG. 18 also illustrates the example in which the conductor 311, the conductor 313, the conductor 317, and the lower electrode 321 are formed in the same layer. FIG. 18 also illustrates the example in which the conductor 331, the conductor 333, the conductor 335, and the conductor 337 are formed in the same layer. FIG. 18 also illustrates the example in which the conductor 341, the conductor 343, and the conductor 347 are formed in the same layer. FIG. 18 also illustrates the example in which the conductor 351, the conductor 353, the conductor 355, and the conductor 357 are formed in the same layer. Forming a plurality of conductors in the same layer in this manner simplifies the manufacturing process of the display device 10; thus, the display device 10 can be inexpensive.

The display device 10 illustrated in FIG. 18 includes the liquid crystal element 570. The liquid crystal element 570 includes a conductor 772, a conductor 774, and a liquid crystal layer 776 provided therebetween. The conductor 774 is provided on the substrate 705 side and functions as a common electrode. The conductor 772 is electrically connected to the other of the source and the drain of the transistor 550 through the conductor 351, the conductor 341, the conductor 331, the conductor 313, and the conductor 301*b*. The conductor 772 is formed over the insulator 363 and functions as a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

When a reflective material is used for the conductor 772, the display device 10 is a reflective liquid crystal display device. By contrast, when a light-transmitting material is used for the conductor 772 and a light-transmitting material is also used for the substrate 701 and the like, the display device 10 is a transmissive liquid crystal display device. In the case where the display device 10 is a reflective liquid crystal display device, a polarizing plate is provided on the viewer side. On the other hand, in the case where the display device 10 is a transmissive liquid crystal display device, a pair of polarizing plates are provided such that the liquid crystal element is sandwiched therebetween.

Although not illustrated in FIG. 18, an alignment film in contact with the liquid crystal layer 776 may be provided. An optical member (optical substrate) such as a polarizing member, a retardation member, or an anti-reflection member and a light source such as a backlight or a side light can be provided as appropriate.

A structure body 778 are provided between the insulator 363 and the conductor 774. The structure body 778 is a columnar spacer and has a function of controlling the distance (cell gap) between the substrate 701 and the substrate 705. Note that a spherical spacer may be used as the structure body 778.

On the substrate 705 side, a light-blocking layer 738, a coloring layer 736, and an insulator 734 that is in contact with these layers are provided. The light-blocking layer 738 has a function of blocking light emitted from adjacent regions. Alternatively, the light-blocking layer 738 has a function of preventing external light from reaching the transistor 550 or the like. Note that coloring layer 736 is provided to have a region overlapping the liquid crystal element 570.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. In this case, monochrome image display may be performed without the coloring layer 736, or color display may be performed using the coloring layer 736.

As a driving method of the liquid crystal element, a time-division display method (also referred to as a field-sequential driving method) by which color display is performed by a successive additive color mixing method may be employed. In that case, a structure in which the coloring layer 736 is not provided may be employed. In the case where the time-division display method is employed, advantages such as an improvement in the aperture ratio of each pixel and an increase in the resolution can be obtained because it is not necessary to provide subpixels that emit light of, for example, R (red), G (green), and B (blue).

Figure 19:
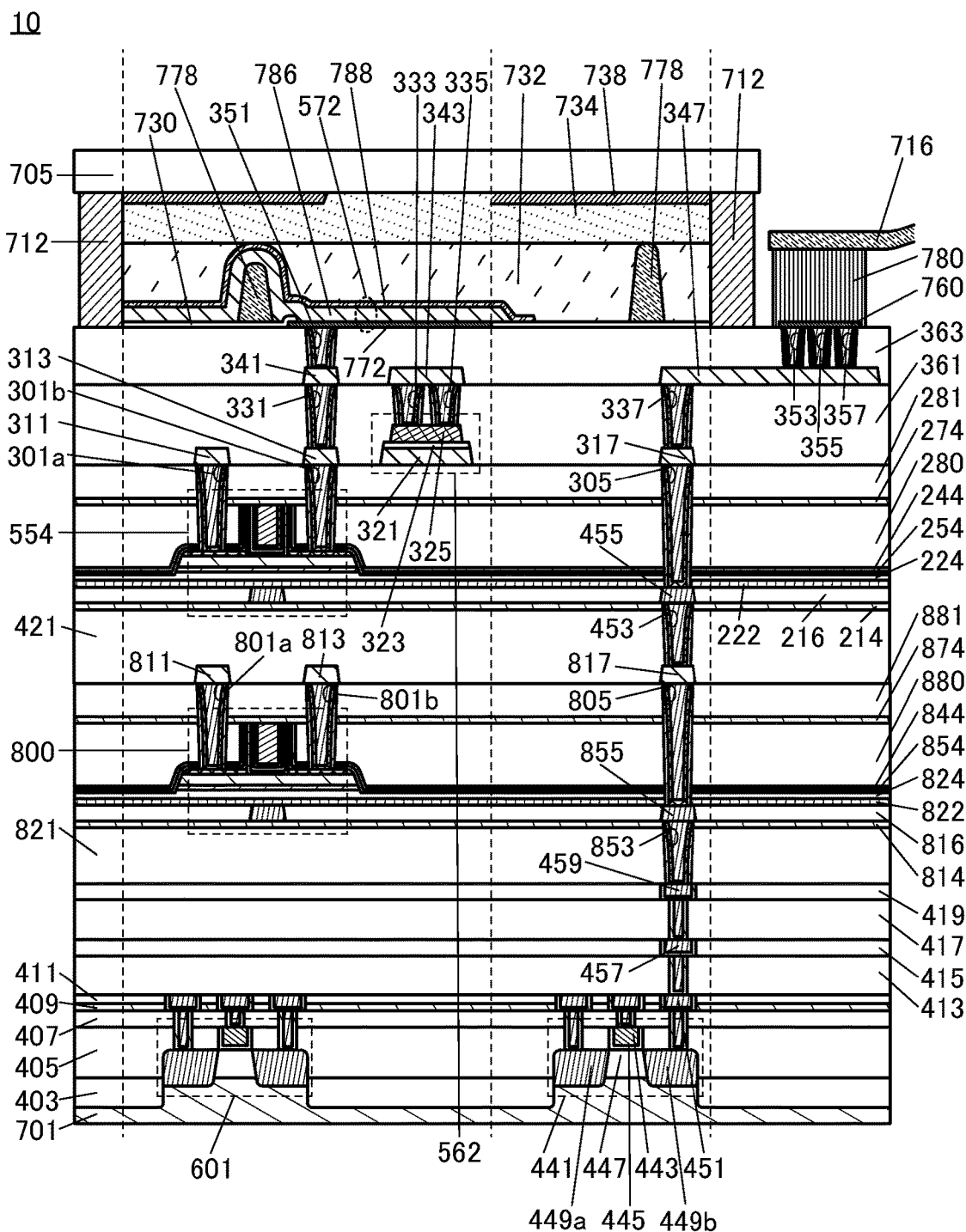
FIG. 19 is a cross-sectional view illustrating a structure example of a display device.

In the display device 10 with the structure illustrated in FIG. 18, a liquid crystal element is used as a display element; however, one embodiment of the present invention is not limited thereto. FIG. 19 illustrates a modification example of the display device 10 illustrated in FIG. 18, which is different from the display device 10 illustrated in FIG. 18 in that a light-emitting element is used as a display element.

The display device 10 illustrated in FIG. 19 includes the light-emitting element 572. The light-emitting element 572 includes the conductor 772, an EL layer 786, and a conductor 788. The EL layer 786 can contain an organic compound as a light-emitting material. Alternatively, it can contain an inorganic compound such as a quantum dot. In FIG. 19, the transistor 554 is illustrated instead of the transistor 550, and the capacitor 562 is illustrated instead of the capacitor 560. As illustrated in FIG. 19, the transistor 554 can have a structure similar to that of the transistor 550, and the capacitor 562 can have a structure similar to that of the capacitor 560.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 10 illustrated in FIG. 19, an insulator 730 is provided over the insulator 363. Here, the insulator 730 can cover part of the conductor 772. The light-emitting element 572 includes the conductor 788 with a light-transmitting property, and thus is a top-emission light-emitting element. Note that the light-emitting element 572 may have a bottom-emission structure in which light is emitted to the conductor 772 side or a dual-emission structure in which light is emitted to both the conductor 772 and the conductor 788.

The light-emitting element 572 can have a microcavity structure, which will be described later in detail. Thus, light of predetermined colors (e.g., RGB) can be extracted without a coloring layer, and the display device 10 can perform color display. The structure without a coloring layer can prevent light absorption due to the coloring layer. As a result, the display device 10 can display high-luminance images, and the power consumption of the display device 10 can be reduced. Note that a structure in which a coloring layer is not provided can be employed even when the EL layer 786 is formed into an island shape for each pixel or into a stripe shape for each pixel column, i.e., the EL layer 786 is formed by separate coloring.

The light-blocking layer 738 is provided to have a region overlapping the insulator 730. The light-blocking layer 738 is covered with the insulator 734. A space between the light-emitting element 572 and the insulator 734 is filled with a sealing layer 732.

The structure body 778 is provided between the insulator 730 and the EL layer 786. Furthermore, the structure body 778 is provided between the insulator 730 and the insulator 734.

Figure 20:
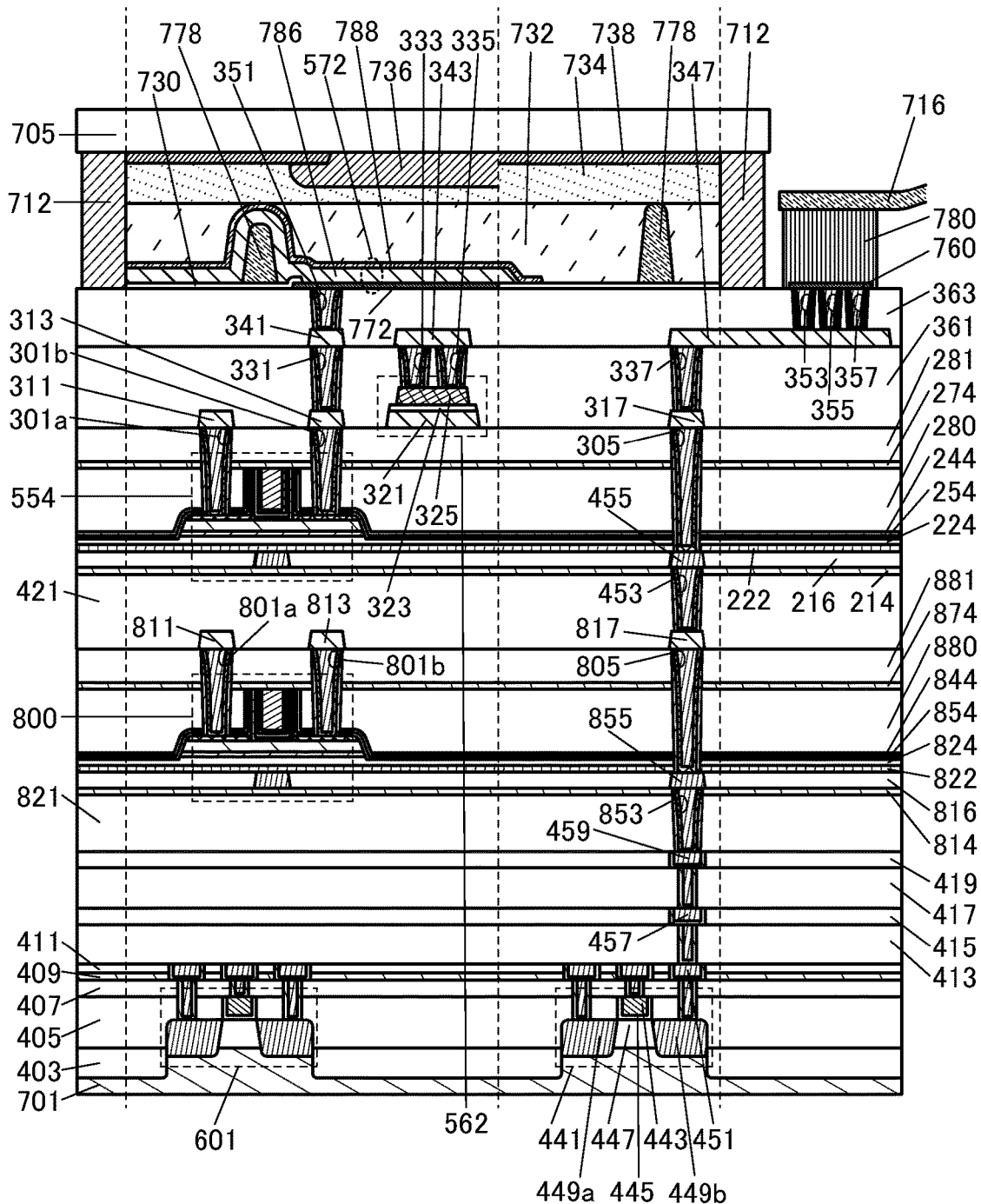
FIG. 20 is a cross-sectional view illustrating a structure example of a display device.

FIG. 20 illustrates a modification example of the display device 10 illustrated in FIG. 19, which is different from the display device 10 illustrated in FIG. 19 in that the coloring layer 736 is provided. Providing the coloring layer 736 can improve the color purity of light extracted from the light-emitting element 572. Thus, the display device 10 can display high-quality images. Furthermore, all the light-emitting elements 572, for example, in the display device 10 can be light-emitting elements that emit white light; hence, the EL layers 786 are not necessarily formed by separate coloring, leading to higher pixel density of the display device 10.

Figure 21:
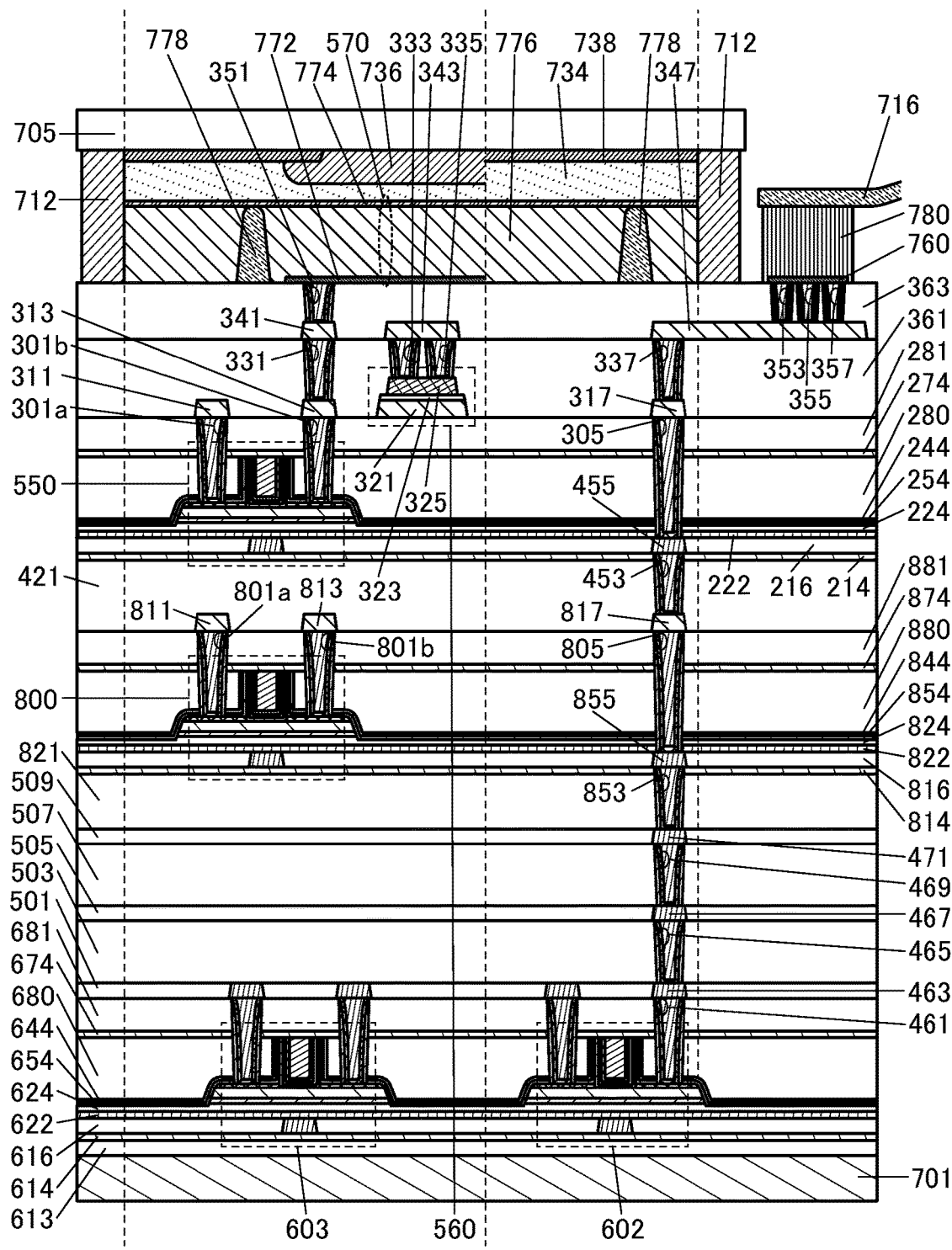
FIG. 21 is a cross-sectional view illustrating a structure example of a display device.
Figure 22:
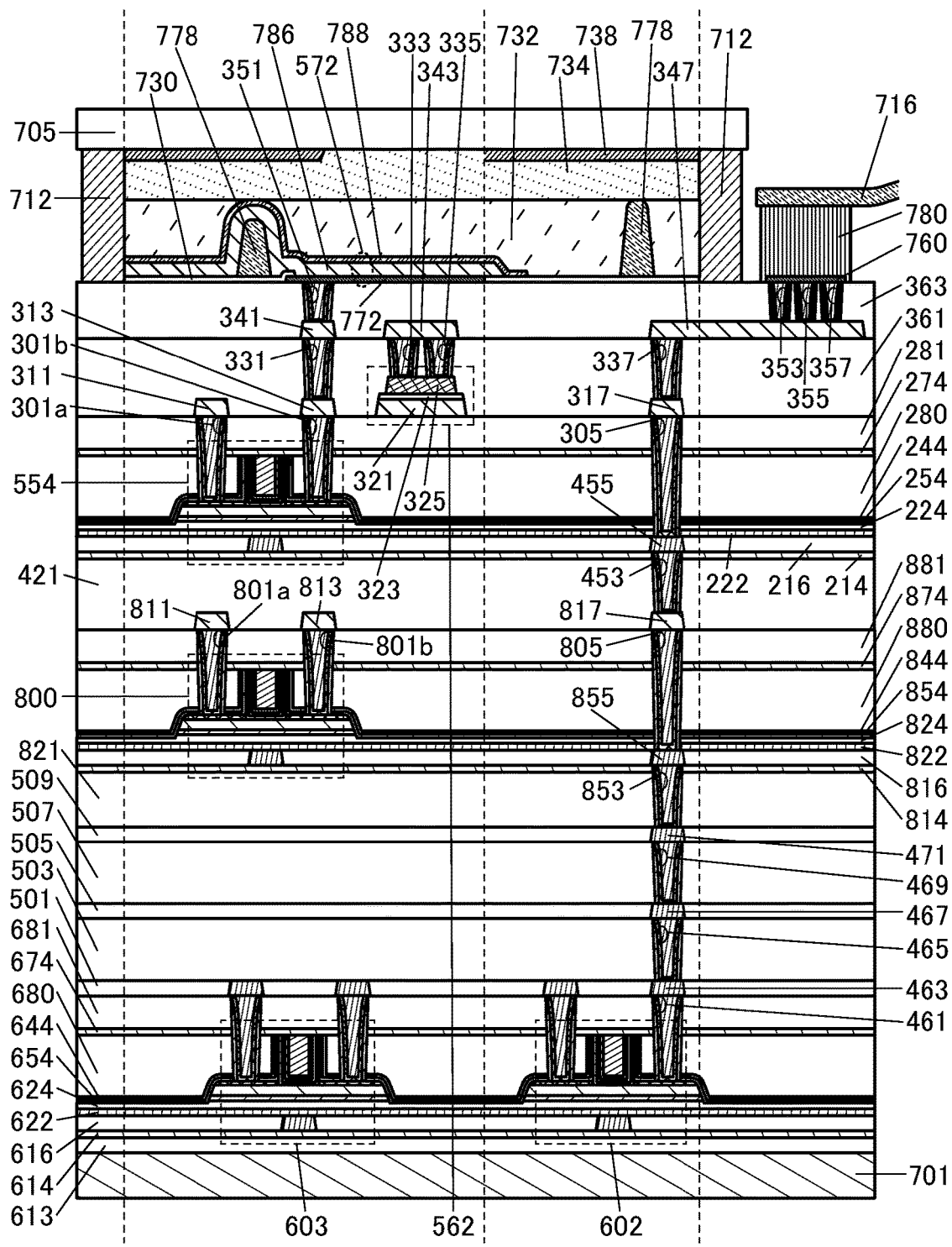
FIG. 22 is a cross-sectional view illustrating a structure example of a display device.
Figure 23:
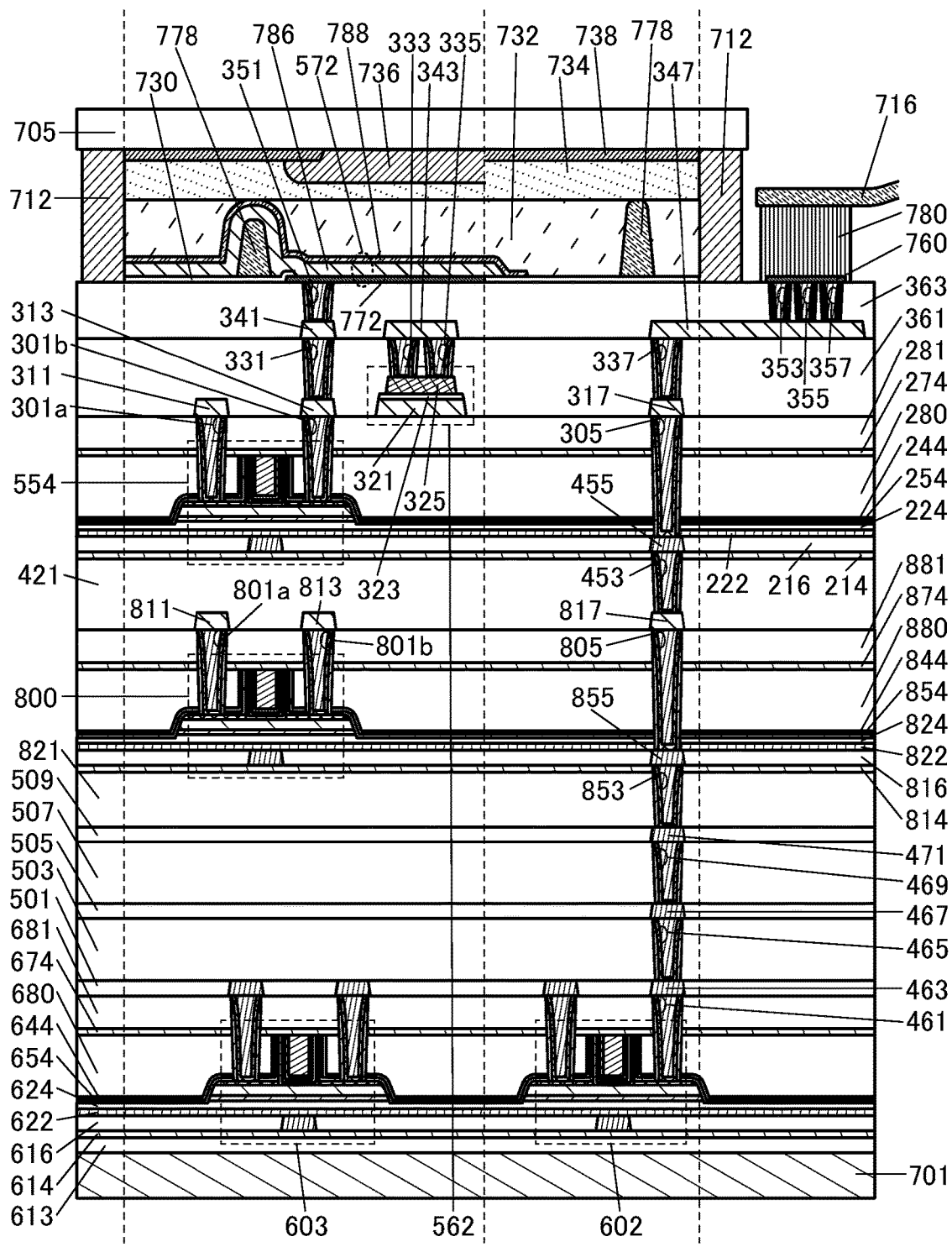
FIG. 23 is a cross-sectional view illustrating a structure example of a display device.

Although FIG. 18 to FIG. 20 each illustrate a structure in which the transistor 441 and the transistor 601 are provided so that their channel formation regions are formed inside the substrate 701 and the OS transistor is stacked over the transistor 441 and the transistor 601, one embodiment of the present invention is not limited thereto. FIG. 21 illustrates a modification example of FIG. 18, FIG. 22 illustrates a modification example of FIG. 19, and FIG. 23 illustrates a modification example of FIG. 20. The display devices 10 with the structures illustrated in FIG. 21 to FIG. 23 are different from those with the structures illustrated in FIG. 18 to FIG. 20 in that the transistor 800, the transistor 550, or the transistor 554 is stacked not over the transistor 441 and the transistor 601 but over a transistor 602 and a transistor 603 that are OS transistors. In other words, the display devices 10 with the structures illustrated in FIG. 21 to FIG. 23 each include a stack of three OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor with a structure similar to those of the transistor 441 and the transistor 601 illustrated in FIG. 18 to FIG. 20 may be provided between the substrate 701 and the insulator 613. An OS transistor or the like may be provided between a layer including the transistor 602, the transistor 603, and the like and a layer including the transistor 800 and the like. Alternatively, an OS transistor or the like may be provided between the layer including the transistor 800 and the like and a layer including the transistor 550 or the transistor 554. Further alternatively, an OS transistor or the like may be provided above the layer including the transistor 550 or the transistor 554.

The transistor 602 can be a transistor provided in the circuit 40. The transistor 603 can be a transistor provided in the gate driver circuit 21 or a transistor provided in the data driver circuit 22. In other words, the transistor 602 and the transistor 603 can be provided in the layer 20 illustrated in FIG. 1B and the like.

The transistor 602 and the transistor 603 can have a structure similar to that of the transistor 550 or the like. Note that the transistor 602 and the transistor 603 may be an OS transistor with a structure different from those of the transistor 550, the transistor 554, and the like.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. The top surface of the conductor 465 and the top surface of the insulator 503 can be substantially level with each other.

An insulator 505 is provided over the conductor 465 and the insulator 503. A conductor 467 is embedded in the insulator 505. The conductor 467 can be provided in the same layer as the wiring 121 to the wiring 123 illustrated in FIG. 19. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. The conductor 471 can be provided in the same layer as the wiring 141 to the wiring 143 illustrated in FIG. 19. Here, the top surface of the conductor 471 and the top surface of the insulator 509 can be substantially level with each other.

The insulator 821 and the insulator 814 are provided over the conductor 471 and the insulator 509. A conductor 853 is embedded in the insulator 821 and the insulator 814. Here, the top surface of the conductor 853 and the top surface of the insulator 814 can be substantially level with each other.

As illustrated in FIG. 21 to FIG. 23, one of a source and a drain of the transistor 602 is electrically connected to the FPC 716 through the conductor 461, the conductor 463, the conductor 465, the conductor 467, the conductor 469, the conductor 471, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 function as an interlayer film and may also function as a planarization film that covers unevenness thereunder.

When the display device 10 has the structures illustrated in FIG. 21 to FIG. 23, all the transistors in the display device 10 can be OS transistors while the frame and size of the display device 10 are reduced. This eliminates the need to manufacture different kinds of transistors; thus, the manufacturing cost of the display device 10 can be reduced, making the display device 10 inexpensive.

<Structure Example of Subpixel>

Figure 24A:
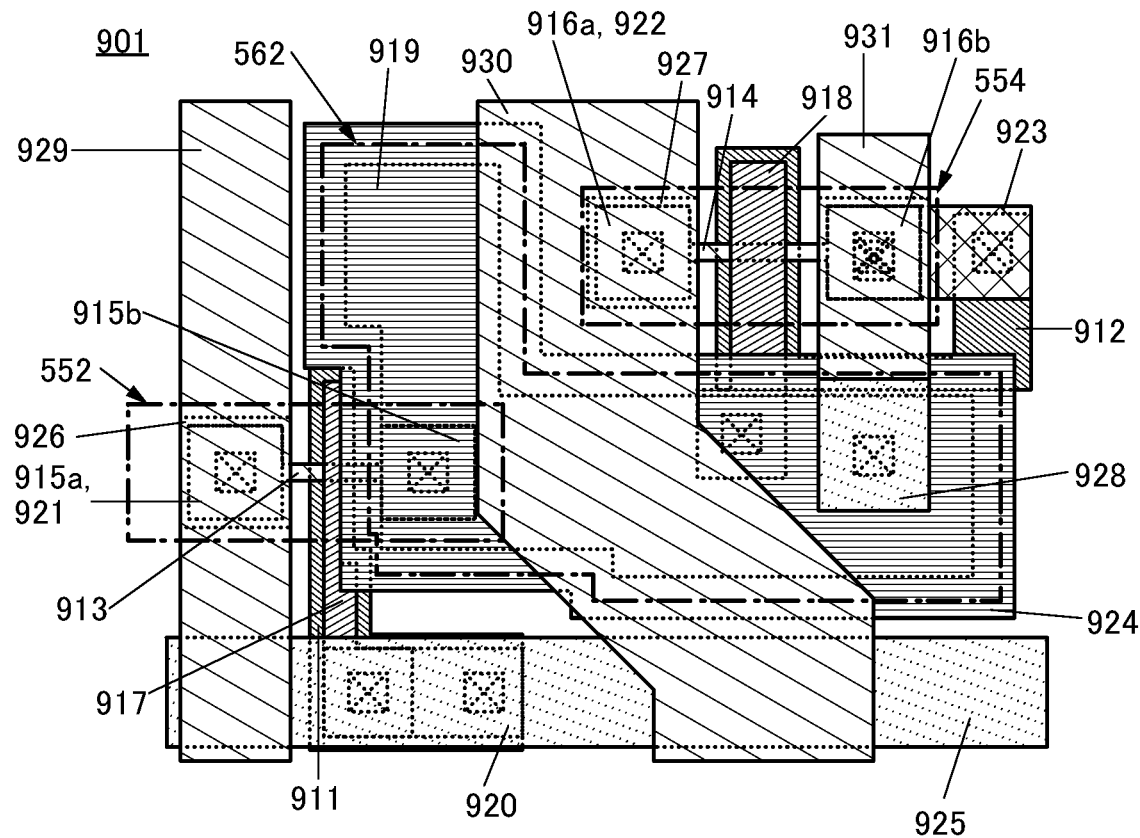
FIG. 24A and FIG. 24B are top views illustrating pixel structure examples.
Figure 24B:
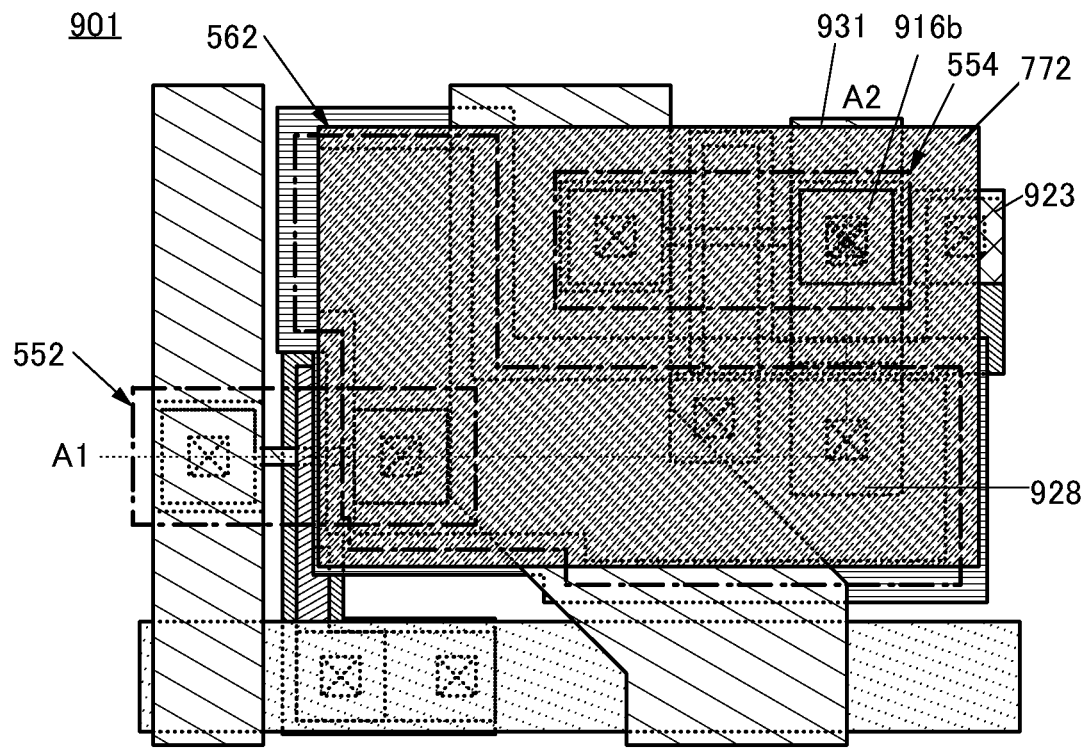

FIG. 24A and FIG. 24B are top views illustrating structure examples of a subpixel 901 that can be used in the display device of one embodiment of the present invention. The subpixel 901 can have the circuit structure illustrated in FIG. 4C. In other words, in the case where the pixel 34 includes the light-emitting element 572, the pixel 34 can have a structure similar to that of the subpixel 901 illustrated in FIG. 24A and FIG. 24B. Here, the transistor 552 includes a back gate in addition to a gate, and the back gate is electrically connected to the wiring 31. The transistor 554 includes a back gate in addition to a gate, and the back gate is electrically connected to the other of the source and the drain of the transistor 554, the other electrode of the capacitor 562, and one electrode of the light-emitting element 572.

FIG. 24A illustrates conductors and semiconductors that constitute the transistors, the capacitor, the wirings, and the like included in the subpixel 901. FIG. 24B illustrates the conductor 772 functioning as one electrode of the light-emitting element 572, in addition to the components illustrated in FIG. 24A. Note that the conductor functioning as the other electrode of the light-emitting element 572, or the like is omitted in both FIG. 24A and FIG. 24B. Here, the one electrode of the light-emitting element 572 functions as a pixel electrode, and the other electrode of the light-emitting element 572 functions as a common electrode.

As illustrated in FIG. 24A and FIG. 24B, the subpixel 901 includes a conductor 911, a conductor 912, a semiconductor 913, a semiconductor 914, a conductor 915a, a conductor 915b, a conductor 916a, a conductor 916b, a conductor 917, a conductor 918, a conductor 919, a conductor 920, a conductor 921, a conductor 922, a conductor 923, a conductor 924, a conductor 925, a conductor 926, a conductor 927, a conductor 928, a conductor 929, a conductor 930, a conductor 931, and the conductor 772.

The conductor 911 and the conductor 912 can be formed in the same step. The semiconductor 913 and the semiconductor 914 are formed in the same step and can be formed in a step after the formation of the conductor 911 and the conductor 912. The conductors 915a and 915b and the conductors 916a and 916b are formed in the same step and can be formed in a step after the formation of the conductors 911 and 912. The conductor 917 and the conductor 918 are formed in the same step and can be formed in a step after the formation of the semiconductors 913 and 914 and the conductors 915a, 915b, 916a, and 916b.

The conductors 919 to 923 are formed in the same step and can be formed in a step after the formation of the conductors 917 and 918. The conductor 924 can be formed in a step after the formation of the conductors 919 to 923. The conductors 925 to 928 are formed in the same step and can be formed in a step after the formation of the conductor 924. The conductors 929 to 931 are formed in the same step and can be formed in a step after the formation of the conductors 925 to 928. The conductor 772 can be formed in a step after the formation of the conductors 929 to 931.

In this specification and the like, it can be said that components formed in the same step are provided in one layer. For example, since the conductor 911 and the conductor 912 can be formed in the same step, it can be said that the conductor 911 and the conductor 912 are provided in the same layer. In addition, it can be said that components formed in a given step are provided above components formed in a step prior to the given step. For example, since the conductor 929 to the conductor 931 can be formed in a step after the formation of the conductor 925 to the conductor 928, it can be said that the conductor 929 to the conductor 931 are provided above the conductor 925 to the conductor 928.

The conductor 911 functions as the back gate electrode of the transistor 552. The semiconductor 913 includes a channel formation region of the transistor 552. The conductor 915a functions as one of a source electrode and a drain electrode of the transistor 552. The conductor 915b functions as the other of the source electrode and the drain electrode of the transistor 552. The conductor 917 functions as the gate electrode of the transistor 552.

The conductor 912 functions as the back gate electrode of the transistor 554. The semiconductor 914 includes a channel formation region of the transistor 554. The conductor 916a functions as one of a source electrode and a drain electrode of the transistor 554. The conductor 916b functions as the other of the source electrode and the drain electrode of the transistor 554. The conductor 918 functions as the gate electrode of the transistor 554.

The conductor 919 functions as one electrode of the capacitor 562. The conductor 924 functions as the other electrode of the capacitor 562. The conductor 925 corresponds to the wiring 31 functioning as a scan line. The conductor 929 corresponds to the wiring 32 functioning as a data line. The conductor 930 corresponds to the wiring 35a functioning as a power supply line. The conductor 772 functions as the one electrode of the light-emitting element 572 as described above.

The conductor 911 is electrically connected to the conductor 920. The conductor 912 is electrically connected to the conductor 923. The conductor 915a is electrically connected to the conductor 921. The conductor 915b is electrically connected to the conductor 919. The conductor 916a is electrically connected to the conductor 922.

The conductor 916b is electrically connected to the conductor 923. In other words, the conductor 912 functioning as the back gate electrode of the transistor 554 and the conductor 916b functioning as the other of the source electrode and the drain electrode of the transistor 554 are electrically connected to each other through the conductor 923.

The conductor 917 is electrically connected to the conductor 920. In other words, the conductor 911 functioning as the back gate electrode of the transistor 552 and the conductor 917 functioning as the gate electrode of the transistor 552 are electrically connected to each other through the conductor 920.

The conductor 920 is electrically connected to the conductor 925. In other words, the conductor 917 functioning as the gate electrode of the transistor 552 and the conductor 925 functioning as a scan line are electrically connected to each other through the conductor 920.

The conductor 918 is electrically connected to the conductor 919. The conductor 921 is electrically connected to the conductor 926. The conductor 922 is electrically connected to the conductor 927. The conductor 923 is electrically connected to the conductor 928. The conductor 924 is electrically connected to the conductor 928.

The conductor 926 is electrically connected to the conductor 929. In other words, the conductor 915a functioning as one of the source electrode and the drain electrode of the transistor 552 and the conductor 929 functioning as a data line are electrically connected to each other through the conductor 921 and the conductor 926.

The conductor 927 is electrically connected to the conductor 930. In other words, the conductor 916a functioning as one of the source electrode and the drain electrode of the transistor 554 and the conductor 930 functioning as a power supply line are electrically connected to each other through the conductor 922 and the conductor 927.

The conductor 928 is electrically connected to the conductor 931. The conductor 931 is electrically connected to the conductor 772.

The semiconductor 913 and the semiconductor 914 can contain a metal oxide, for example. Thus, the transistor 552 and the transistor 554 can be OS transistors.

Figure 25:
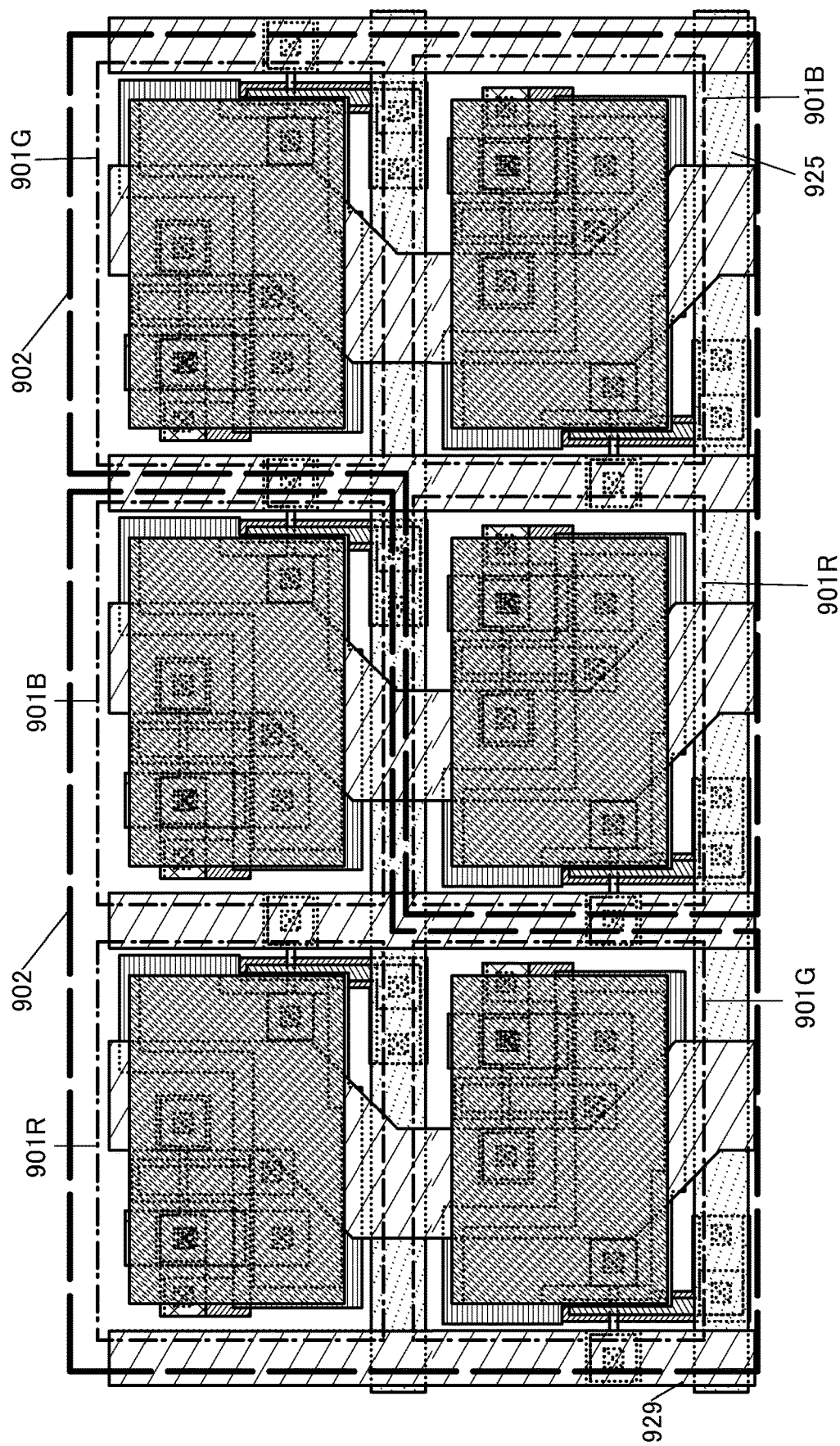
FIG. 25 is a top view illustrating a pixel structure example.

FIG. 25 is a top view illustrating a structure example of a pixel 902 composed of subpixels 901 with the structure illustrated in FIG. 24B. In FIG. 25, a subpixel 901R indicates the subpixel 901 having a function of emitting red light, a subpixel 901G indicates the subpixel 901 having a function of emitting green light, and a subpixel 901B indicates the subpixel 901 having a function of emitting blue light. As illustrated in FIG. 25, the pixel 902 is composed of the subpixel 901R, the subpixel 901G, and the subpixel 901B. Specifically, one pixel 902 is composed of the subpixel 901R and the subpixel 901B that are placed on the upper side, and the subpixel 901G placed on the lower side. Another pixel 902 is composed of the subpixel 901G placed on the upper side, and the subpixel 901R and the subpixel 901B that are placed on the lower side.

In FIG. 25, the subpixel 901R, the subpixel 901G, and the subpixel 901B placed on the upper side are laterally inverted with respect to the subpixel 901R, the subpixel 901G, and the subpixel 901B placed on the lower side. With such a structure, the subpixels 901 of the same color can be alternately arranged in the direction where the conductor 925 functioning as a scan line extends. Thus, the subpixels 901 having a function of emitting light of the same color can be electrically connected to one data line. In other words, two or more kinds of subpixels 901 selected from the subpixel 901R, the subpixel 901G, and the subpixel 901B can be prevented from being electrically connected to one data line.

Figure 26:
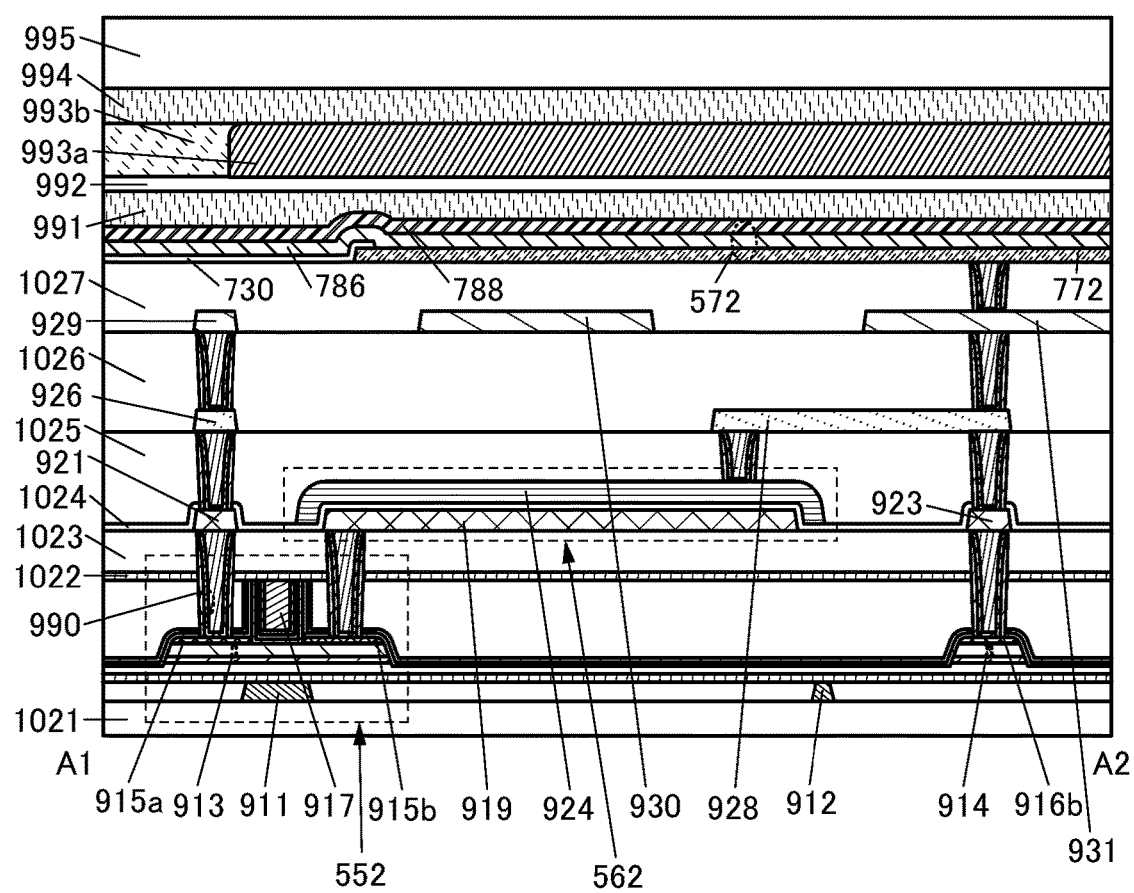
FIG. 26 is a cross-sectional view illustrating a pixel structure example.

FIG. 26 is a cross-sectional view of a portion indicated by the dashed-dotted line A1-A2 in FIG. 24B. The transistor 552 and the transistor 554 are provided over an insulator 1021. An insulator 1022 is provided over the transistor 552 and the transistor 554, and an insulator 1023 is provided over the insulator 1022. Note that a substrate is provided below the insulator 1021. The components in the layer 20 illustrated in FIG. 1B and the like (e.g., the gate driver circuit 21, the data driver circuit 22, and the circuit 40) and the components in the layer 80 (e.g., the demultiplexer circuit 81) can be provided between the substrate and the insulator 1021.

As illustrated in FIG. 26, the conductors provided in different layers are electrically connected to each other through the conductor 990 functioning as a plug. For example, the conductor 915a and the conductor 921 provided above the conductor 915a are electrically connected to each other through the conductor 990. The conductor 990 can have a structure similar to those of the conductor 853, the conductor 805, the conductor 453, the conductor 305, the conductor 337, the conductor 353, the conductor 355, the conductor 357, the conductor 301a, the conductor 301b, the conductor 331, the conductor 351, the conductor 333, and the conductor 335 illustrated in FIG. 18 and the like.

An insulator 1024 is provided over the conductor 919 to the conductor 923 and the insulator 1023. The conductor 924 is provided over the insulator 1024. The conductor 919, the insulator 1024, and the conductor 924 form the capacitor 562.

An insulator 1025 is provided over the conductor 924 and the insulator 1024. An insulator 1026 is provided over the conductor 925 to the conductor 928 and the insulator 1025. An insulator 1027 is provided over the conductor 929 to the conductor 931 and the insulator 1026.

The conductor 772 and the insulator 730 are provided over the insulator 1027. Here, the insulator 730 can cover part of the conductor 772. The conductor 772, the EL layer 786, and the conductor 788 form the light-emitting element 572.

A bonding layer 991 is provided over the conductor 788, and an insulator 992 is provided over the bonding layer 991. The insulator 992 over the bonding layer 991 can be formed in the following manner. First, the insulator 992 is formed over a substrate different from the substrate where the light-emitting element 572 and the like are formed. Next, the conductor 788 and the insulator 992 are bonded to each other with the bonding layer 991. After that, the substrate where the insulator 992 is formed is separated. Through the above steps, the insulator 992 can be formed over the conductor 788.

A coloring layer 993 is provided over the insulator 992. FIG. 26 illustrates a coloring layer 993a and a coloring layer 993b as the coloring layer 993. A substrate 995 is attached onto the coloring layer 993 with a bonding layer 994.

The coloring layer 993b has a function of transmitting light of a color that is different from the color of light that the coloring layer 993a transmits. For example, when the pixel 902 includes the subpixel 901R with a function of emitting red light, the subpixel 901G with a function of emitting green light, and the subpixel 901B with a function of transmitting blue light and the coloring layer 993a has a function of transmitting red light, the coloring layer 993b has a function of transmitting green light or blue light.

Forming the coloring layer 993 over the insulator 992 facilitates alignment between the coloring layer 993 and the light-emitting element 572. Thus, the pixel density of the display device of one embodiment of the present invention can be reduced.

<Structure Example of Light-Emitting Element 572>

Figure 27A:
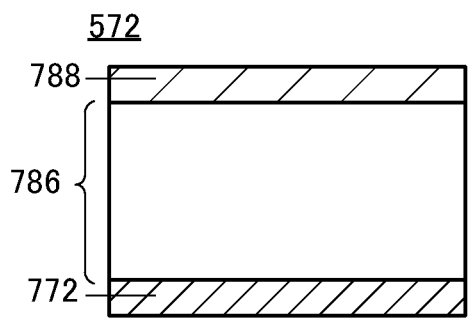
FIG. 27A to FIG. 27E are diagrams illustrating structure examples of a light-emitting element.

FIG. 27A to FIG. 27E illustrate structure examples of the light-emitting element 572. FIG. 27A illustrates the structure in which the EL layer 786 is positioned between the conductor 772 and the conductor 788 (single structure). As described above, the EL layer 786 contains a light-emitting material, for example, a light-emitting material of an organic compound.

Figure 27B:
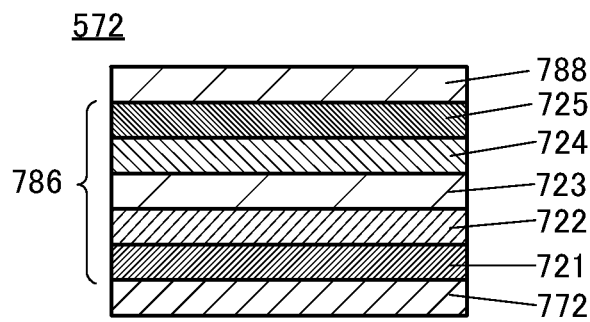

FIG. 27B illustrates a stacked-layer structure of the EL layer 786. In the light-emitting element 572 with the structure illustrated in FIG. 27B, the conductor 772 functions as an anode and the conductor 788 functions as a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 functions as a cathode and the conductor 788 functions as an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances are different between the stacked light-emitting layers.

For example, when the light-emitting element 572 has a micro optical resonator (microcavity) structure with the conductor 772 and the conductor 788 illustrated in FIG. 27B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting element 572 is a reflective electrode having a stacked-layer structure of a reflective conductive material and a light-transmitting conductive material (transparent conductive film), optical adjustment can be performed by controlling the thickness of the transparent conductive film. Specifically, when the wavelength of light from the light-emitting layer 723 is $\lambda$, the distance between the conductor 772 and the conductor 788 is preferably adjusted to around $m\lambda/2$ (m is a natural number).

To amplify desired light (wavelength: $\lambda$) obtained from the light-emitting layer 723, the optical path length from the conductor 772 to a region where desired light is obtained in the light-emitting layer 723 (light-emitting region) and the optical path length from the conductor 788 to the region where desired light is obtained in the light-emitting layer 723 (light-emitting region) are preferably adjusted to around $(2m'+1)\lambda/4$ (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 is, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained is, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in conductor 772 being supposed to be the reflective region and a given position in the light-emitting layer where desired light is obtained being supposed to be the light-emitting region.

The light-emitting element 572 illustrated in FIG. 27B has a microcavity structure, so that light (monochromatic light) with different wavelengths can be extracted from different light-emitting elements including the same EL layer. Thus, separate coloring for obtaining a plurality of emission colors (e.g., RGB) is not necessary. Therefore, high definition can be easily achieved. In addition, a combination with coloring layers is also possible. Furthermore, the emission intensity of light with a specific wavelength in the front direction can be increased, whereby power consumption can be reduced.

Note that the light-emitting element 572 illustrated in FIG. 27B does not necessarily have a microcavity structure. In that case, light of predetermined colors (e.g., RGB) can be extracted when the light-emitting layer 723 has a structure for emitting white light and coloring layers are provided. When the EL layers 786 are formed by separate coloring for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance higher than or equal to 40%. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. These electrodes preferably have a resistivity less than or equal to $1\times10^{-2}$ $\Omega$cm.

When the conductor 772 or the conductor 788 is an electrode having reflectivity (reflective electrode), the visible light reflectance of the reflective electrode is higher than or equal to 40% and lower than or equal to 100%, preferably higher than or equal to 70% and lower than or equal to 100%. This electrode preferably has a resistivity less than or equal to $1\times10^{-2}$ $\Omega$cm.

Figure 27C:
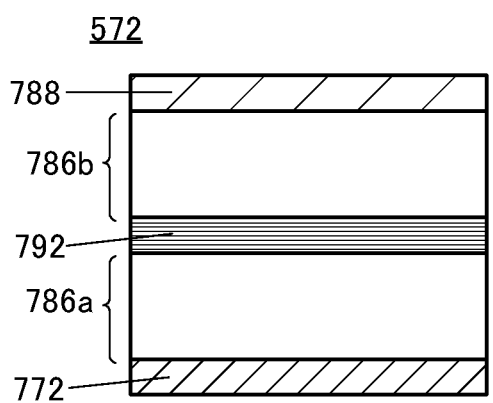

The light-emitting element 572 may have a structure illustrated in FIG. 27C. FIG. 27C illustrates the light-emitting element 572 having a stacked-layer structure (tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting element 572 has the tandem structure, the current efficiency and external quantum efficiency of the light-emitting element 572 can be increased. Thus, the display device 10 can display high-luminance images. In addition, the power consumption of the display device 10 can be reduced. Here, the EL layer 786a and the EL layer 786b can have a structure similar to that of the EL layer 786 illustrated in FIG. 27B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than that of the conductor 772 or the conductor 788.

Figure 27D:
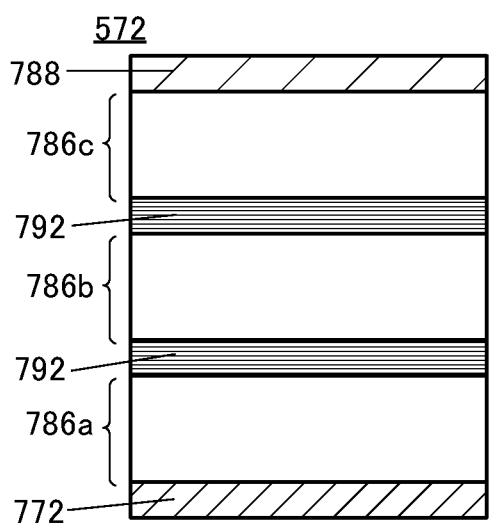

The light-emitting element 572 may have a structure illustrated in FIG. 27D. FIG. 27D illustrates the light-emitting element 572 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 27B. When the light-emitting element 572 has the structure illustrated in FIG. 27D, the current efficiency and external quantum efficiency of the light-emitting element 572 can be further increased. As a result, the display device 10 can display higher-luminance images. Moreover, the power consumption of the display device 10 can be further reduced.

Figure 27E:
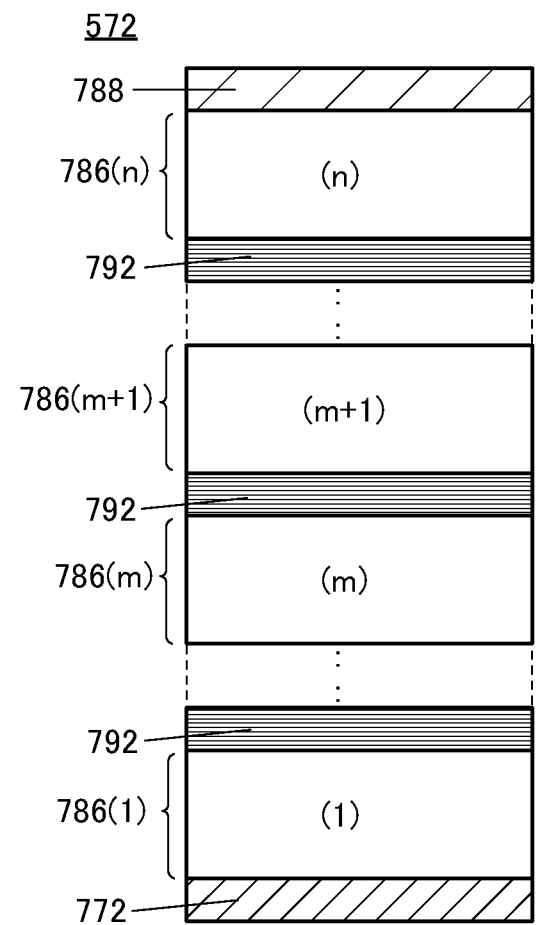

The light-emitting element 572 may have a structure illustrated in FIG. 27E. FIG. 27E illustrates the light-emitting element 572 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 27B. Note that FIG. 27E illustrates the EL layer 786(1), the EL layer 786(m), and the EL layer 786(m+1), and the EL layer 786(n) among the EL layers 786. Here, m is an integer greater than or equal to 2 and less than n, and n is an integer greater than m. As n becomes larger, the current efficiency and external quantum efficiency of the light-emitting element 572 can be increased. Thus, the display device 10 can display high-luminance images. In addition, the power consumption of the display device 10 can be reduced.

<Materials for Light-Emitting Element 572>

Next, materials that can be used for the light-emitting element 572 will be described.

<<Conductor 772 and Conductor 788>>

For the conductor 772 and the conductor 788, any of the following materials can be used in an appropriate combination as long as the functions of the anode and the cathode can be fulfilled. For example, a metal, an alloy, an electrically conductive compound, a mixture of these, and the like can be appropriately used. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

<<Hole-Injection Layer 721 and Hole-Transport Layer 722>>

The hole-injection layer 721 injects holes to the EL layer 786 from the conductor 772, which is an anode, or the charge generation layer 792 and contains a material with a high hole-injection property. Here, the EL layer 786 includes the EL layer 786a, the EL layer 786b, the EL layer 786c, and the EL layer 786(1) to the EL layer 786(n).

Examples of the material having a high hole-injection property include transition metal oxides such as molybdenum oxide, vanadium oxide, ruthenium oxide, tungsten oxide, and manganese oxide. Alternatively, it is possible to use any of the following materials: phthalocyanine-based compounds such as phthalocyanine (abbreviation: $H_2Pc$ and copper phthalocyanine (abbreviation: CuPC); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material having a high hole-injection property, a composite material containing a hole-transport material and an acceptor material (electron-accepting material) can be used. In that case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed to have a single-layer structure using a composite material containing a hole-transport material and an acceptor material (electron-accepting material), or a stacked-layer structure in which a layer containing a hole-transport material and a layer containing an acceptor material (electron-accepting material) are stacked.

The hole-transport layer 722 transports the holes, which are injected from the conductor 772 by the hole-injection layer 721, to the light-emitting layer 723. Note that the hole-transport layer 722 contains a hole-transport material. It is particularly preferable that the HOMO level of the hole-transport material used for the hole-transport layer 722 be the same as or close to the HOMO level of the hole-injection layer 721.

Examples of the acceptor material used for the hole-injection layer 721 include oxides of a metal belonging to any of Group 4 to Group 8 of the periodic table. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layer 721 and the hole-transport layer 722 are preferably substances with a hole mobility of greater than or equal to $10^{-6}$ cm$^2$/Vs. Note that other substances can also be used as long as they have a hole-transport property higher than an electron-transport property.

Preferred hole-transport materials are π-electron rich heteroaromatic compounds (e.g., carbazole derivatives and indole derivatives) and aromatic amine compounds; specific examples include compounds having an aromatic amine skeleton, such as 4,4'-bis[N-(1-naphthyl)-N-phenylamino] biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4''-tris(carbazol-9-yl)triphenylamine (abbreviation: TCTA), 4,4',4''-tris(N,N'-diphenylamino)triphenylamine (abbreviation: TDATA), and 4,4',4''-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl] benzene (abbreviation: TCPB), and 9-[4-(10-phenyl-9-anthracenyl)phenyl]-9H-carbazole (abbreviation: CzPA); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl) tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

High molecular compounds such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD) can also be used.

Note that the hole-transport material is not limited to the above examples and one of or a combination of various known materials can be used as the hole-transport material for the hole-injection layer 721 and the hole-transport layer 722. Note that the hole-transport layer 722 may be formed of a plurality of layers. In other words, a first hole-transport layer and a second hole-transport layer may be stacked, for example.

<<Light-Emitting Layer 723>>

The light-emitting layer 723 is a layer containing a light-emitting substance. As the light-emitting substance, a substance whose emission color is blue, violet, bluish violet, green, yellowish green, yellow, orange, red, or the like is appropriately used. Here, when the light-emitting element 572 includes a plurality of EL layers as illustrated in FIG. 27C to FIG. 27E, the use of different light-emitting substances for the light-emitting layers 723 in the EL layers enables different emission colors to be exhibited (e.g., it enables white light emission obtained by combining complementary emission colors). For example, when the light-emitting element 572 has the structure illustrated in FIG. 27C, the use of different light-emitting substances for the light-emitting layer 723 in the EL layer 786a and the light-emitting layer 723 in the EL layer 786b can achieve different emission colors of the EL layer 786a and the EL layer 786b. Note that a stacked-layer structure in which one light-emitting layer contains different light-emitting substances may be employed.

The light-emitting layer 723 may contain one or more kinds of organic compounds (a host material and an assist material) in addition to a light-emitting substance (guest material). As the one or more kinds of organic compounds, one or both of the hole-transport material and the electron-transport material can be used.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

As an example of the light-emitting substance that converts singlet excitation energy into light, a substance that exhibits fluorescence (fluorescent material) can be given; examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl] pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b] naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine](abbreviation: 1,6BnfAPrn-02), and N,N'-

(pyrene-1,6-diyl)bis[(6,N-diphenylbenzo[b]naphtho[1,2-d]furan)-8-amine] (abbreviation: 1,6BnfAPrn-03). In addition, pyrene derivatives are compounds effective for meeting the chromaticity of blue in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), and the like.

As examples of the light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit different emission colors (emission peaks), and thus are used through appropriate selection as needed.

As examples of a phosphorescent material that emits blue or green light and whose emission spectrum has a peak wavelength at greater than or equal to 450 nm and less than or equal to 570 nm, the following substances can be given.

Examples include organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$] iridium(III) picolinate (abbreviation: FIrpic), bis[2-(3,5-bistrifluoromethyl-phenyl)-pyridinato-N,C$^{2'}$]iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

As examples of a phosphorescent material that emits green or yellow light and whose emission spectrum has a peak wavelength at greater than or equal to 495 nm and less than or equal to 590 nm, the following substances can be given.

Examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)] and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}triduum(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]).

Among the above, organometallic iridium complexes having a pyridine skeleton (particularly, a phenylpyridine skeleton) or a pyrimidine skeleton are compounds effective for meeting the chromaticity of green in one embodiment of the present invention.

As examples of a phosphorescent material that emits yellow or red light and whose emission spectrum has a peak wavelength at greater than or equal to 570 nm and less than or equal to 750 nm, the following substances can be given.

Examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(dlnpm)$_2$(dpm)]); organometallic complexes having a pyrazine skeleton, such as (acetylacetonato)

bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]).

Among the above, organometallic iridium complexes having a pyrazine skeleton are compounds effective for meeting the chromaticity of red in one embodiment of the present invention. In particular, organometallic iridium complexes having a cyano group, such as [Ir(dmdppr-dmCP)$_2$(dpm)], are preferable because of their high stability.

Note that as the blue-light-emitting substance, a substance whose photoluminescence peak wavelength is greater than or equal to 430 nm and less than or equal to 470 nm, preferably greater than or equal to 430 nm and less than or equal to 460 nm is used. As the green-light-emitting substance, a substance whose photoluminescence peak wavelength is greater than or equal to 500 nm and less than or equal to 540 nm, preferably greater than or equal to 500 nm and less than or equal to 530 nm is used. As the red-light-emitting substance, a substance whose photoluminescence peak wavelength is greater than or equal to 610 nm and less than or equal to 680 nm, preferably greater than or equal to 620 nm and less than or equal to 680 nm is used. Note that the photoluminescence may be measured with either a solution or a thin film.

With the parallel use of such compounds and the microcavity effect, the above chromaticity can be met more easily. Here, a transflective electrode (metal thin film portion) that is needed for obtaining the microcavity effect has a thickness of preferably greater than or equal to 20 nm and less than or equal to 40 nm. The thickness is further preferably greater than 25 nm and less than or equal to 40 nm. However, the thickness greater than 40 nm possibly reduces the efficiency.

As the organic compounds (the host material and the assist material) used in the light-emitting layer 723, one or more kinds of substances having a larger energy gap than the light-emitting substance (the guest material) are used. Note that the hole-transport materials listed above and the electron-transport materials given below can be used as the host material and the assist material, respectively.

In the case where the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) higher than that of the light-emitting substance can be selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used; specifically, it is possible to use, for example, 9,10-diphenylanthracene (abbreviation: DPAnth), N,N'-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N',N',N,',N",N"-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 1,3,5-tri(1-pyrenyl)benzene (abbreviation: TPB3).

When a plurality of organic compounds are used for the light-emitting layer 723, it is preferable to use compounds that form an exciplex in combination with a light-emitting substance. In that case, various organic compounds can be used in appropriate combination; to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA). Note that a substance in which a π-electron rich heteroaromatic ring is directly bonded to a π-electron deficient heteroaromatic ring is particularly preferably used, in which case both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

<<Electron-Transport Layer 724>>

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility of higher than or equal to $1\times10^{-6}$ $cm^2/Vs$. Note that other substances can also be used as long as they have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use any of metal complexes such as $Alq_3$, tris(4-methyl-8-quinolinolato)aluminum(III) (abbreviation: $Almq_3$), bis(10-hydroxybenzo[h]quinolinato) beryllium (abbreviation: $BeBq_2$), BAlq, Zn(BOX)$_2$, and bis[2-(2-hydroxyphenyl)benzothiazolato]zinc(II) (abbreviation: Zn(BTZ)$_2$); heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs); and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Furthermore, a high molecular compound such as poly (2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-transport layer 724 is not limited to a single layer and may have a structure in which two or more layers each containing any of the above substances are stacked.

<<Electron-Injection Layer 725>>

The electron-injection layer 725 contains a substance having a high electron-injection property. The electron-injection layer 725 can be formed using an alkali metal, an alkaline earth metal, or a compound thereof, such as lithium fluoride (LiF), cesium fluoride (CsF), calcium fluoride ($CaF_2$), or lithium oxide ($LiO_x$). A rare earth metal compound such as erbium fluoride ($ErF_3$) can also be used. An electride may also be used for the electron-injection layer 725. Examples of the electride include a substance in which electrons are added at high concentration to a mixed oxide of calcium and aluminum. Any of the substances given above for forming the electron-transport layer 724 can also be used.

A composite material in which an organic compound and an electron donor (donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, the electron-transport material used for the electron-transport layer 724 (e.g., a metal complex or a heteroaromatic compound) can be used. As the electron donor, a substance showing a property of donating electrons to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

<<Charge Generation Layer 792>>

The charge generation layer 792 has a function of injecting electrons into the EL layer 786 that is closer to the conductor 772 of the two EL layers 786 in contact with the charge generation layer 792 and injecting holes to the other EL layer 786 that is closer to the conductor 788, when a voltage is applied between the conductor 772 and the conductor 788. For example, in the light-emitting element 572 with the structure illustrated in FIG. 27C, the charge generation layer 792 has a function of injecting electrons into the EL layer 786a and injecting holes into the EL layer 786b. Note that the charge generation layer 792 may have either a structure in which an electron acceptor (acceptor) is added to a hole-transport material or a structure in which an electron donor (donor) is added to an electron-transport material. Alternatively, both of these structures may be stacked. Forming the charge generation layer 792 by using any of the above materials can inhibit an increase in driving voltage of the display device 10 including the stack of the EL layers.

When the charge generation layer 792 has a structure in which an electron acceptor is added to a hole-transport material, the electron acceptor can be 7,7,8,8-tetracyano-2,3,5,6-tetrafluoroquinodimethane (abbreviation: $F_4$-TCNQ), chloranil, or the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting element 572, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Note that materials for the functional layers (the hole-injection layer, the hole-transport layer, the light-emitting layer, the electron-transport layer, and the electron-injection layer) included in the EL layer and the charge generation layer of the light-emitting element described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 2

In this embodiment, transistors that can be used in the display device of one embodiment of the present invention will be described.

<Structure Example 1 of Transistor>

Figure 28A:
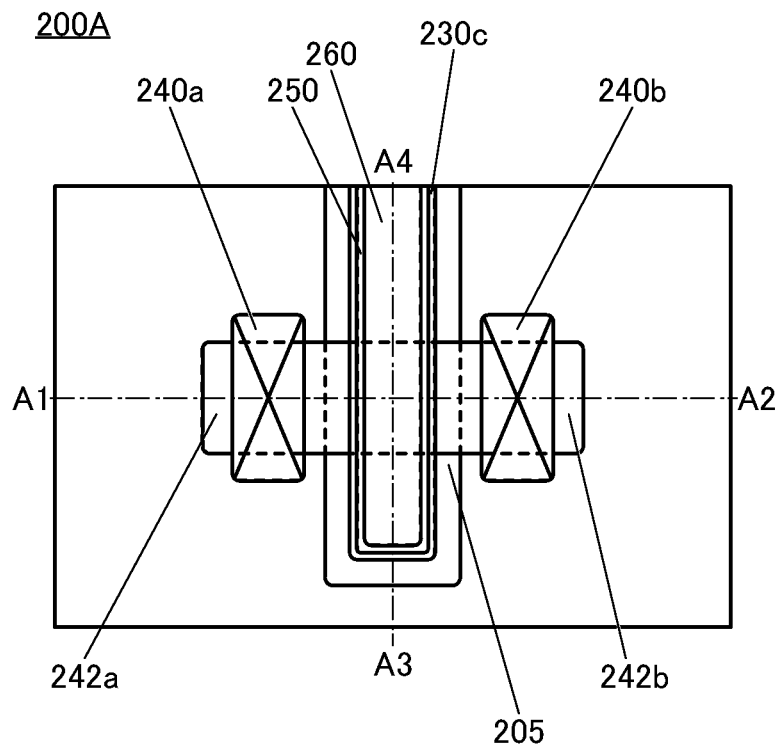
FIG. 28A is a top view illustrating a structure example of a transistor.
Figure 28C:
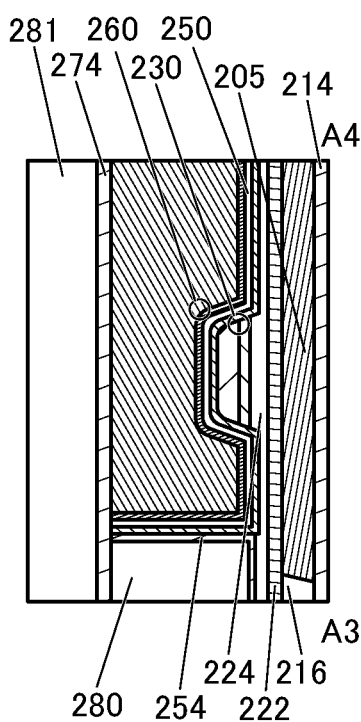
FIG. 28B and FIG. 28C are cross-sectional views illustrating structure examples of the transistor.
Figure 28B:
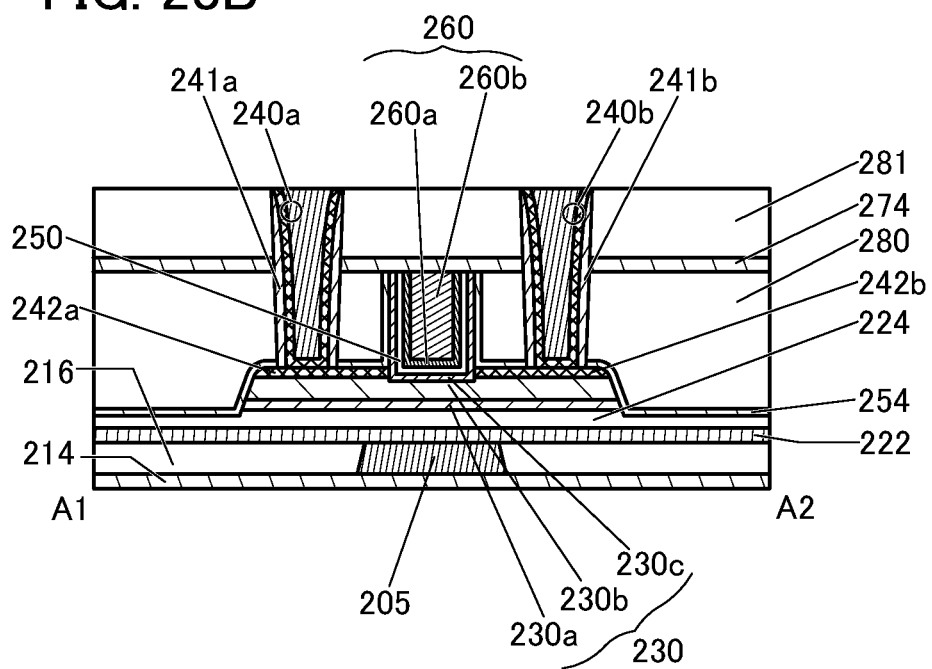

FIG. 28A, FIG. 28B, and FIG. 28C are a top view and cross-sectional views of a transistor 200A that can be used in the display device of one embodiment of the present invention and the periphery of the transistor 200A. The transistor 200A can be used in the display device of one embodiment of the present invention.

FIG. 28A is a top view of the transistor 200A. FIG. 28B and FIG. 28C are cross-sectional views of the transistor 200A. Here, FIG. 28B is a cross-sectional view of a portion indicated by the dashed-dotted line A1-A2 in FIG. 28A, and is a cross-sectional view in the channel length direction of the transistor 200A. FIG. 28C is a cross-sectional view of a portion indicated by the dashed-dotted line A3-A4 in FIG. 28A, and is a cross-sectional view in the channel width direction of the transistor 200A. Note that some components are not illustrated in the top view of FIG. 28A for clarity of the drawing.

As illustrated in FIG. 28, the transistor 200A includes a metal oxide 230a positioned over a substrate (not illustrated); a metal oxide 230b positioned over the metal oxide 230a; a conductor 242a and a conductor 242b that are positioned apart from each other over the metal oxide 230b; the insulator 280 that is positioned over the conductor 242a and the conductor 242b and has an opening between the conductor 242a and the conductor 242b; a conductor 260 positioned in the opening; an insulator 250 between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 28B and FIG. 28C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 28, side surfaces of the conductor 242a and the conductor 242b on the conductor 260 side are substantially perpendicular. Note that the transistor 200A illustrated in FIG. 28 is not limited thereto, and the angle formed between the side surfaces and the bottom surfaces of the conductor 242a and the conductor 242b may be greater than or equal to 100 and less than or equal to 80°, preferably greater than or equal to 30° and less than or equal to 60°. The side surfaces of the conductor 242a and the conductor 242b that face each other may have a plurality of surfaces.

As illustrated in FIG. 28, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 28B and FIG. 28C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Accordingly, the pixel density of the display device can be increased. In addition, the display device can have a narrow frame.

As illustrated in FIG. 28, the conductor 260 preferably includes a conductor 260a provided inside the insulator 250 and a conductor 260b provided to be embedded inside the conductor 260a.

The transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230a is preferably provided over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. In addition, the insulator 222 and the insulator 254 preferably have a function of inhibiting diffusion of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. Therefore, impurities such as hydrogen contained in the insulator 280 and the insulator 281 and excess oxygen can be inhibited from entering the insulator 224, the metal oxide 230, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. Alternatively, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a structure body has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one kind or a plurality of kinds selected from aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably aluminum (Al), gallium (Ga), yttrium (Y), or tin (Sn).

As illustrated in FIG. 28B, the metal oxide 230b in a region that is not overlap the conductor 242 sometimes have smaller thickness than the metal oxide 230b in a region that overlaps the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in the above manner can prevent formation of the channel in the region.

According to one embodiment of the present invention, a display device that includes small-size transistors and has high pixel density can be provided. A display device that includes a transistor with a high on-state current and has high luminance can be provided. A display device that includes a transistor operating at high speed and operates at high speed can be provided. A display device that includes a transistor having stable electrical characteristics and is highly reliable can be provided. A display device that includes a transistor with a low off-state current and has low power consumption can be provided.

The structure of the transistor 200A that can be used in the display device of one embodiment of the present invention is described in detail.

The conductor 205 is placed so as to include a region overlapped by the metal oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and increases the crystallinity of the metal oxide 230b and the metal oxide 230c.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. It is particularly preferable that the conductor 205 extend beyond an end portion of the metal oxide 230 that intersects with the channel width direction, as illustrated in FIG. 28C. In other words, the conductor 205 and the conductor 260 preferably overlap each other with the insulator positioned therebetween, in a region beyond the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 28C, the conductor 205 extends to function as a wiring as well. However, without limitation to this structure, a structure in which a conductor functioning as a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductor through which the above impurities are less likely to pass) may be used below the conductor 205. Alternatively, it is preferable to use a conductor having a function of inhibiting diffusion of oxygen (e.g., an oxygen atom or an oxygen molecule) (a conductor through which the oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, or ruthenium oxide is preferably used. Thus, the conductor 205 is a single layer or a stacked layer of the above conductive materials.

The insulator 214 preferably functions as a barrier insulating film that inhibits the entry of impurities such as water or hydrogen to the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of oxygen (e.g., an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The relative permittivity of each of the insulator 216, the insulator 280, and the insulator 281 functioning as an interlayer film is preferably lower than that of the insulator 214. When a material with a low relative permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 222 and the insulator 224 function as a gate insulator.

Here, the insulator 224 in contact with the metal oxide 230 preferably release oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 28C, the insulator 224 is sometimes thinner in a region overlapped by neither the insulator 254 nor the metal oxide 230b than in the other regions. In the insulator 224, the region overlapped by neither the insulator 254 nor the metal oxide 230b preferably has a thickness with which released oxygen can be adequately diffused.

Like the insulator 214 and the like, the insulator 222 preferably functions as a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of oxygen (e.g., an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 and the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and the entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that cases, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c continuously changes, or the energy levels of the conduction band minimum of junction portions between the metal oxide 230a, the metal oxide 230b, and the metal oxide 230c are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] is used. As the metal oxide 230b, a metal oxide with In:Ga:Zn=4:2:3 [atomic ratio] or 3:1:2 [atomic ratio] is used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected. Specifically, the metal oxide 230c has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display device to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap the opening of the insulator 280. Accordingly, the conductor 260 can be formed in a self-aligned manner between the conductor 242a and the conductor 242b.

The insulator 250 functions as a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 has a two-layer structure in FIG. 28, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., an oxygen atom and an oxygen molecule).

When the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 28A and FIG. 28C, the side surface of the metal oxide 230 is covered with the conductor 260 in a region where the metal oxide 230b does not overlap the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 28B and FIG. 28C, the insulator 254 is preferably in contact with the side surface of the metal oxide 230c, the top and side surfaces of the conductor 242a, the top and side surfaces of the conductor 242b, side surfaces of the metal oxide 230a and the metal oxide 230b, and the top surface of the insulator 224. Such a structure can inhibit the entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, it is preferable that the insulator 254 have a function of inhibiting diffusion of oxygen (e.g., an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are positioned to face each other with the conductor 260 therebetween. Note that the top surfaces of the conductor 240a and the conductor 240b may be level with the top surface of the insulator 281.

The insulator 241a is provided in contact with the inner walls of the openings in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b. Moreover, impurities such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

<Structure Example 2 of Transistor>

Figure 29A:
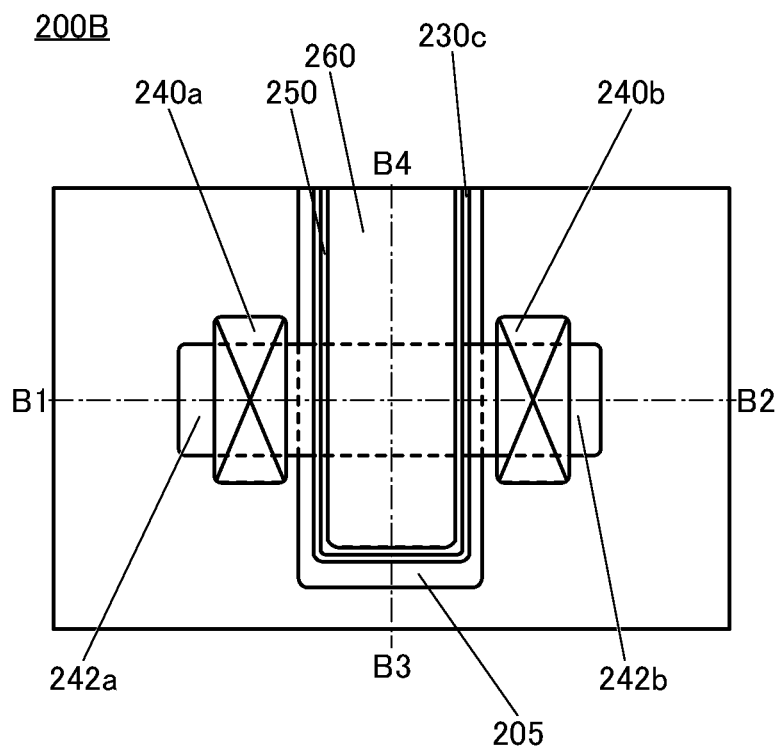
FIG. 29A is a top view illustrating a structure example of a transistor.
Figure 29C:
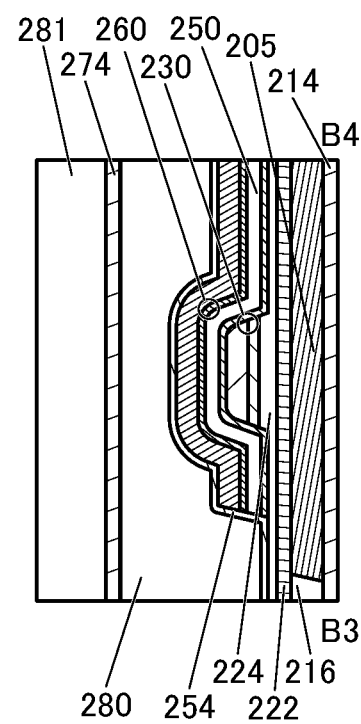
FIG. 29B and FIG. 29C are cross-sectional views illustrating structure examples of the transistor.
Figure 29B:
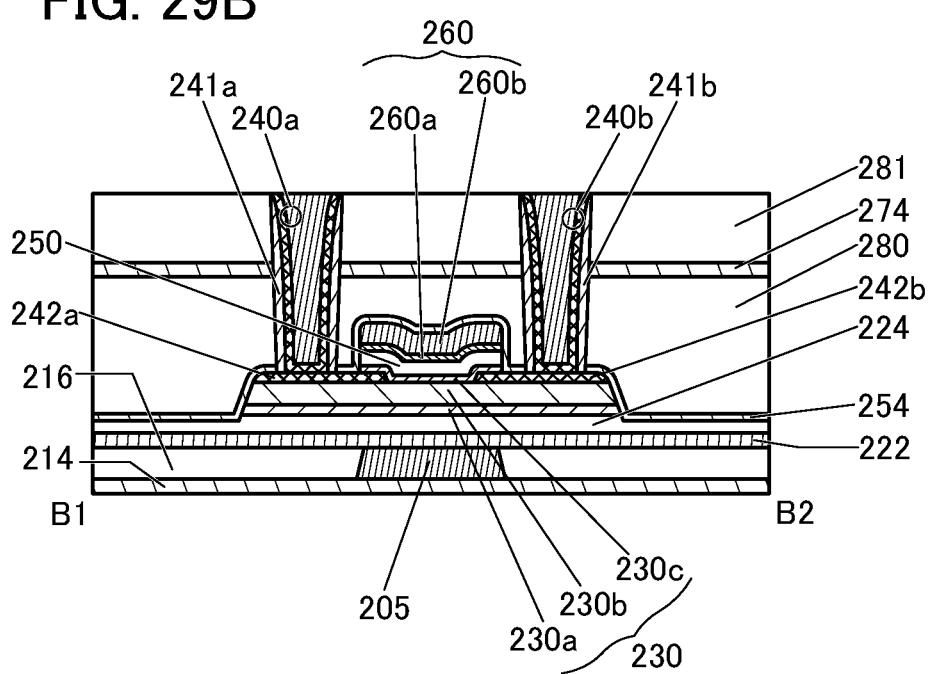

FIG. 29A, FIG. 29B, and FIG. 29C are a top view and cross-sectional views of a transistor 200B that can be used in the display device of one embodiment of the present invention and the periphery of the transistor 200B. The transistor 200B is a modification example of the transistor 200A.

FIG. 29A is a top view of the transistor 200B. FIG. 29B and FIG. 29C are cross-sectional views of the transistor 200B. Here, FIG. 29B is a cross-sectional view of a portion indicated by the dashed-dotted line B1-B2 in FIG. 29A, and is a cross-sectional view in the channel length direction of the transistor 200B. FIG. 29C is a cross-sectional view of a portion indicated by the dashed-dotted line B3-B4 in FIG. 29A, and is a cross-sectional view in the channel width direction of the transistor 200B. Note that some components are not illustrated in the top view of FIG. 29A for clarity of the drawing.

In the transistor 200B, the conductor 242a and the conductor 242b each have a region overlapping the metal oxide 230c, the insulator 250, and the conductor 260. This enables the transistor 200B to have a high on-state current. This also enables the transistor 200B to be a transistor that is easy to control.

The conductor 260 functioning as a gate electrode includes the conductor 260a and the conductor 260b over the conductor 260a. For the conductor 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., an oxygen atom and an oxygen molecule).

When the conductor 260a has a function of inhibiting oxygen diffusion, the range of choices for the material of the conductor 260b can be expanded. In other words, the conductor 260a inhibits oxidation of the conductor 260b, thereby preventing a decrease in conductivity.

The insulator 254 is preferably provided to cover the top surface and the side surface of the conductor 260, the side surface of the insulator 250, and the side surface of the metal oxide 230c. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200B.

<Structure Example 3 of Transistor>

Figure 30A:
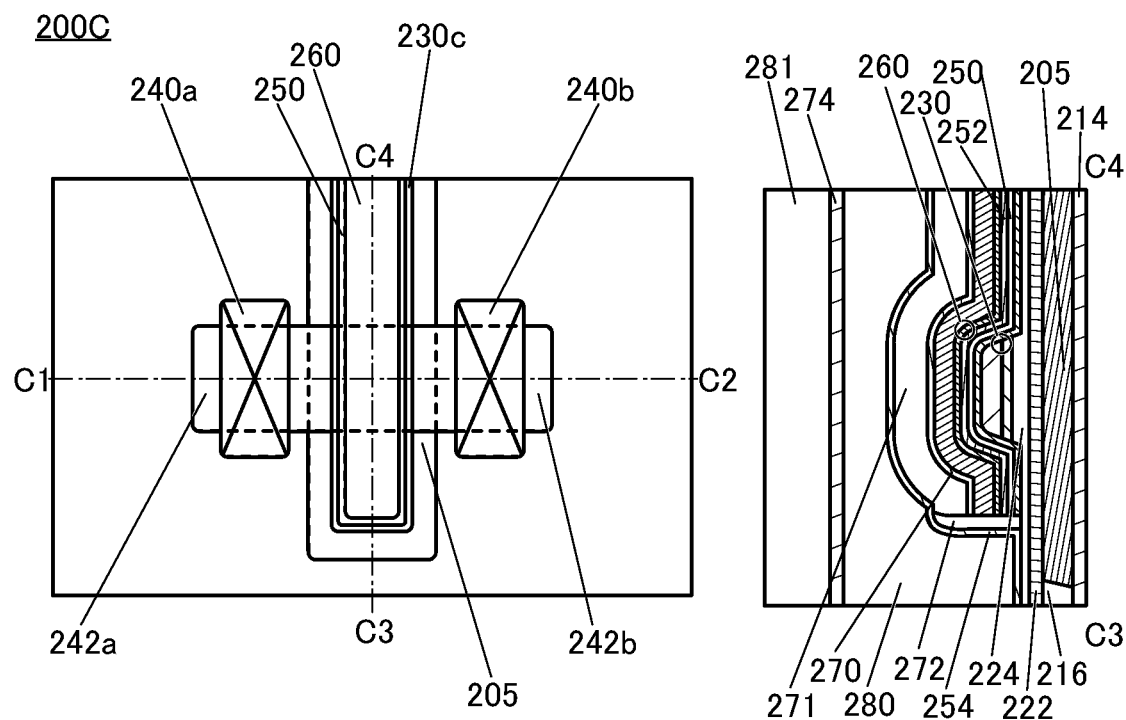
FIG. 30A is a top view illustrating a structure example of a transistor.
Figure 30C:
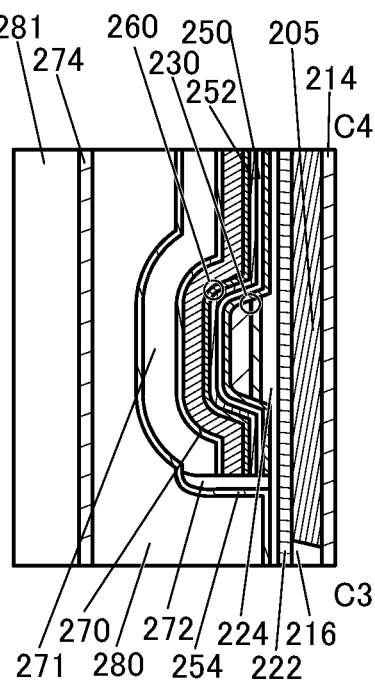
FIG. 30B and FIG. 30C are cross-sectional views illustrating structure examples of the transistor.
Figure 30B:
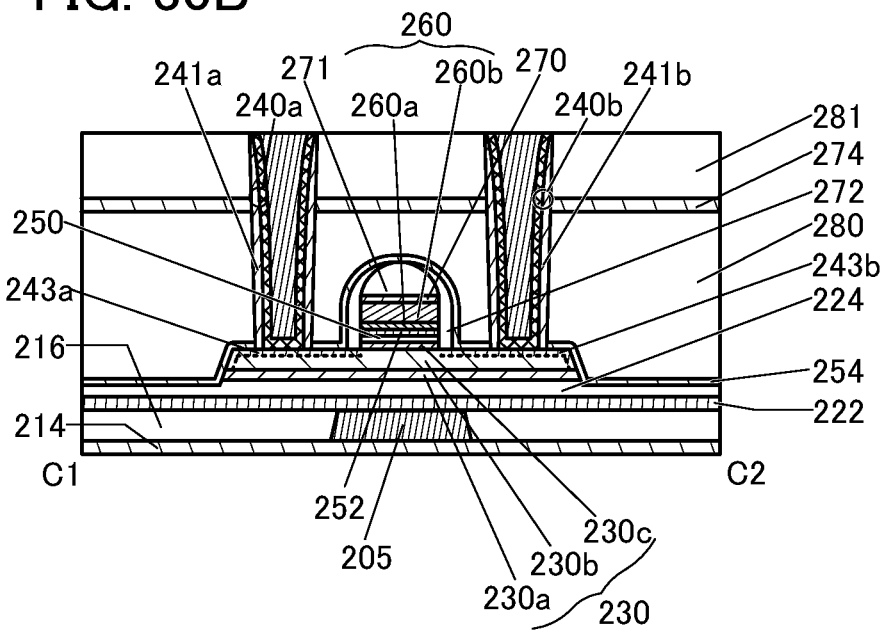

FIG. 30A, FIG. 30B, and FIG. 30C are a top view and cross-sectional views of a transistor 200C that can be used in the display device of one embodiment of the present invention and the periphery of the transistor 200C. The transistor 200C is a modification example of the transistor 200A.

FIG. 30A is a top view of the transistor 200C. FIG. 30B and FIG. 30C are cross-sectional views of the transistor 200C. Here, FIG. 30B is a cross-sectional view of a portion indicated by the dashed-dotted line C1-C2 in FIG. 30A and is a cross-sectional view in the channel length direction of the transistor 200C. FIG. 30C is a cross-sectional view of a portion indicated by the dashed-dotted line C3-C4 in FIG. 30A and is a cross-sectional view in the channel width direction of the transistor 200C. Note that some components are not illustrated in the top view of FIG. 30A for clarity of the drawing.

The transistor 200C includes the insulator 250 over the metal oxide 230c and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, diffusion of oxygen into the conductor 260 is inhibited. In other words, a reduction in the amount of oxygen supplied to the metal oxide 230 can be inhibited. Moreover, oxidization of the conductor 260 due to oxygen can be inhibited.

Note that the metal oxide 252 may function as part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance value and become a conductor. Such a conductor can be referred to as an OC (Oxide Conductor) electrode.

Note that the metal oxide 252 may function as part of a gate insulator. Thus, when silicon oxide, silicon oxynitride, or the like is used for the insulator 250, a metal oxide that is a high-k material with a high relative permittivity is preferably used for the metal oxide 252. Such a stacked-layer structure can be thermally stable and can have a high relative permittivity. Accordingly, a gate potential applied at the time of operation of the transistor can be lowered while the physical thickness is maintained. In addition, the equivalent oxide thickness (EOT) of an insulating layer functioning as a gate insulator can be reduced.

Although the metal oxide 252 in the transistor 200C is illustrated as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200C can be increased without a reduction in the influence of the electric field from the conductor 260. With the metal oxide 252 functioning as a gate insulator, the distance between the conductor 260 and the metal oxide 230 is kept by the physical thicknesses of the insulator 250 and the metal oxide 252, so that leakage current between the conductor 260 and the metal oxide 230 can be reduced. Thus, with the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is unlikely to be crystallized by heat treatment in a later step. Note that the metal oxide 252 is not an essential component. Design is appropriately determined in consideration of required transistor characteristics.

For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulator 270 can be inhibited. Moreover, the entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also functions as a barrier layer. In that case, the insulator 270 is not necessarily provided.

Parts of the insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by introducing an impurity element such as phosphorus or boron to the exposed surface of the metal oxide 230b by an ion implantation method, an ion doping method, a plasma immersion ion implantation method, or plasma treatment, for example. In this embodiment and the like, an impurity element refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as impurity regions or low-resistance regions.

The region 243a and the region 243b can be formed in a self-aligned manner by using the insulator 271 and/or the conductor 260 as a mask. Accordingly, the conductor 260 does not overlap the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low relative permittivity. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of the insulator 272. In that case, the insulator 272 serves as a mask like the insulator 271 or the like. Thus, the impurity element is not added to a region of the metal oxide 230b overlapped by the insulator 272, so that the electrical resistivity of the region can be kept high.

The transistor 200C also includes the insulator 254 over the insulator 272 and the metal oxide 230. The insulator 254 is preferably formed by a sputtering method. The insulator formed by a sputtering method can be an insulator containing few impurities such as water or hydrogen.

Note that an oxide film obtained by a sputtering method may extract hydrogen from the component over which the oxide film is deposited. For that reason, the hydrogen concentrations in the metal oxide 230 and the insulator 272 can be reduced when the insulator 254 absorbs hydrogen and water from the metal oxide 230 and the insulator 272.

<Materials for Transistor>

Materials that can be used for the transistor will be described.

<<Substrate>>

As a substrate where the transistor is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With further miniaturization and higher integration of a transistor, for example, a problem such as generation of leakage current may arise because of a thinned gate insulator. When a high-k material is used for the insulator functioning as a gate insulator, the voltage at the time of operation of the transistor can be reduced while the physical thickness is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, when silicon oxide or silicon oxynitride that includes a region containing oxygen released by heating is provided in contact with the metal oxide 230, oxygen vacancies in the metal oxide 230 can be compensated.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

Conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Further alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing the above metal element and nitrogen may be used. For example, a conductive material containing nitrogen such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 3

Described in this embodiment is a metal oxide (hereinafter also referred to as an oxide semiconductor) applicable to an OS transistor described in the above embodiment.

<Classification of Crystal Structures>

First, the classification of the crystal structures of an oxide semiconductor will be described with reference to FIG. 31A. FIG. 31A is a diagram showing the classification of crystal structures of an oxide semiconductor, typically IGZO (a metal oxide containing In, Ga, and Zn).

As shown in FIG. 31A, an oxide semiconductor is roughly classified into "Amorphous," "Crystalline," and "Crystal." The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 31A are in an intermediate state between "Amorphous" and "Crystal," and belong to a new crystalline phase. That is, these structures are completely different from "Amorphous," which is energetically unstable, and "Crystal."

A crystal structure of a film or a substrate can be analyzed with an X-ray diffraction (XRD) spectrum. FIG. 31B shows an XRD spectrum, which is obtained by grazing-incidence XRD (GIXD) measurement, of a CAAC-IGZO film classified into "Crystalline." Note that a GIXD method is also referred to as a thin film method or a Seemann-Bohlin method. The XRD spectrum that is shown in FIG. 31B and obtained by GIXD measurement is hereinafter simply referred to as an XRD spectrum. The CAAC-IGZO film in FIG. 31B has an atomic ratio of In:Ga:Zn=4:2:3 or a neighborhood thereof. The CAAC-IGZO film in FIG. 31B has a thickness of 500 nm.

As shown in FIG. 31B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 31B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 31C shows a diffraction pattern of the CAAC-IGZO film. FIG. 31C shows a diffraction pattern obtained by the NBED method in which an electron beam is incident in the direction parallel to the substrate. The CAAC-IGZO film in FIG. 31C has an atomic ratio of In:Ga:Zn=4:2:3 or a neighborhood thereof. In the nanobeam electron diffraction method, electron diffraction is performed with a probe diameter of 1 nm.

As shown in FIG. 31C, a plurality of spots indicating c-axis alignment are observed in the diffraction pattern of the CAAC-IGZO film.

<<Structure of Oxide Semiconductor>>

Oxide semiconductors might be classified in a manner different from the one in FIG. 31A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1 \times 10^{17}$ cm$^{-3}$, preferably lower than or equal to $1 \times 10^{15}$ cm$^{3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the channel formation region using the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in combination with the other embodiments described in this specification as appropriate.

Embodiment 4

In this embodiment, electronic devices each including a display device that is one embodiment of the present invention are described.

Figure 32A:
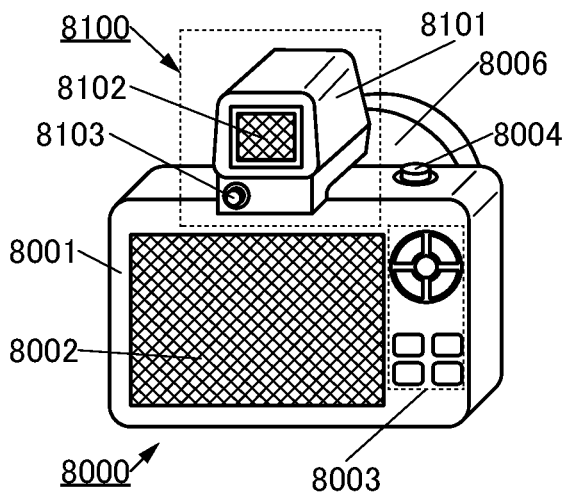
FIG. 32A to FIG. 32E are perspective views illustrating examples of electronic devices.

FIG. 32A is a diagram showing the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 32A, a finder including a display device may be incorporated in a housing 8001 of the camera 8000.

The camera 8000 includes the housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 functions as a power button. The on/off state of the display portion 8102 can be switched with the button 8103.

A display device of one embodiment of the present invention can be used for the display portion 8002 of the camera 8000 and the display portion 8102 of the finder 8100. The display device of one embodiment of the present invention has extremely high pixel density; thus, even when the display portion 8002 or the display portion 8102 is close to the user, the user does not perceive pixels, and a more realistic image can be displayed on the display portion 8002 or the display portion 8102. In particular, an image displayed on the display portion 8102 provided in the finder 8100 is perceived when the user brings his/her eyes closer to the eyepiece of the finder 8100; thus, the distance between the user and the display portion 8102 becomes very short. Thus, in particular, the display device of one embodiment of the present invention is preferably used for the display portion 8102. Note that in the case where the display device of one embodiment of the present invention is used for the display portion 8102, the resolution of an image that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4 k or higher. Moreover, for example, in the case where an image having a resolution of 5K can be displayed on the display portion 8102, the camera 8000 is preferably provided with an imaging device that can take an image of 5 k or higher.

Figure 32B:
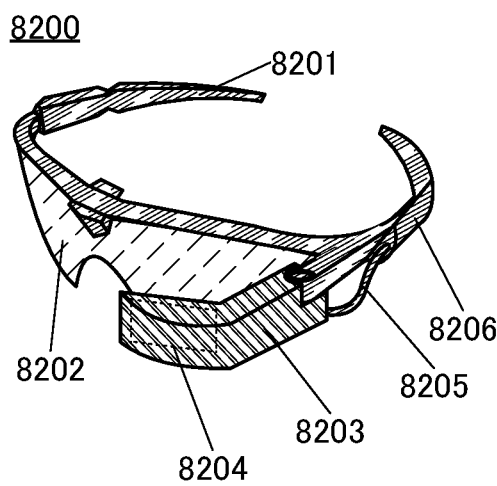

FIG. 32B is a diagram showing the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display portion 8204 can use the display device of one embodiment of the present invention. Accordingly, the head-mounted display 8200 can have a narrower frame, a high-quality image can be displayed on the display portion 8204, and a more realistic image can be displayed.

Figure 32C:
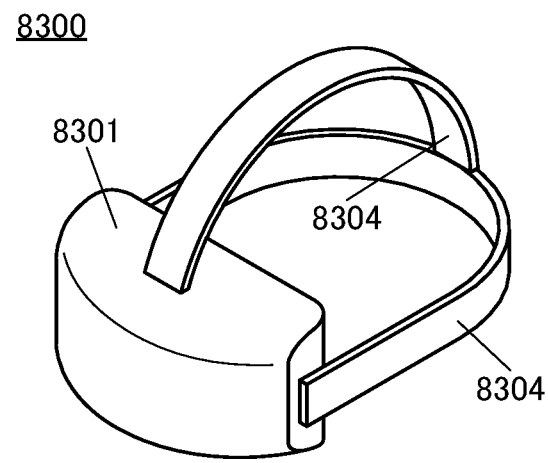
Figure 32D:
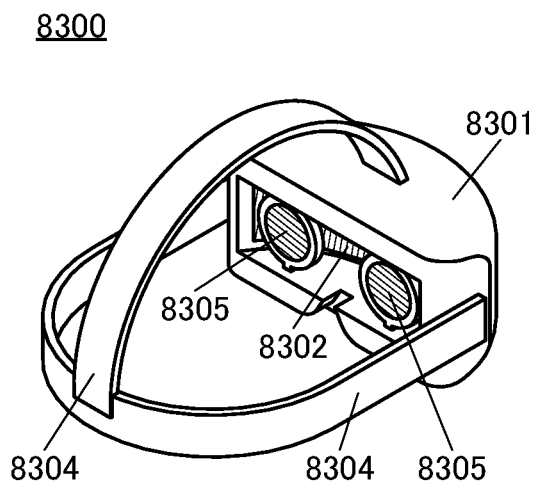
Figure 32E:
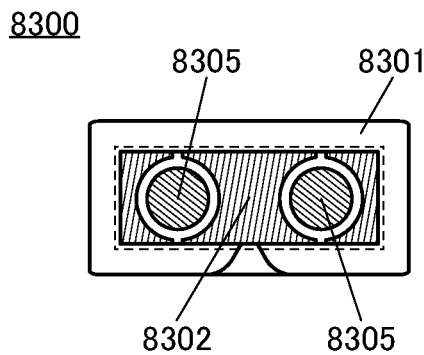

FIG. 32C to FIG. 32E are diagrams showing the appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that it is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

Note that the display device of one embodiment of the present invention can be used in the display portion 8302. The display device of one embodiment of the present invention has extremely high pixel density; thus, even when an image is magnified using the lenses 8305 as in FIG. 32E, the user does not perceive pixels, and a more realistic image can be displayed.

Next, FIG. 33A to FIG. 33G show examples of electronic devices that are different from the electronic devices illustrated in FIG. 32A to FIG. 32E.

Electronic devices illustrated in FIG. 33A to FIG. 33G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 33A to FIG. 33G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 33A to FIG. 33G are not limited thereto, and the electronic devices can have a variety of functions. Although not illustrated in FIG. 33A to FIG. 33G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 33A to FIG. 33G are described below.

Figure 33A:
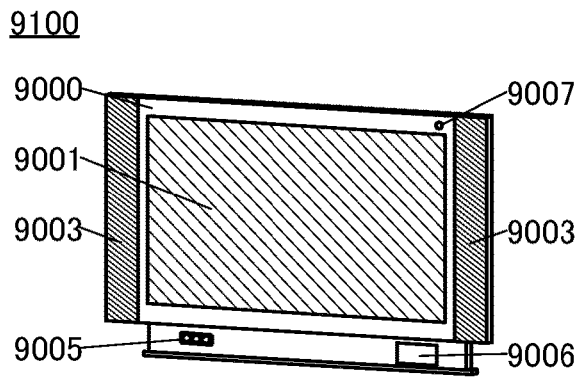
FIG. 33A to FIG. 33G are perspective views illustrating examples of electronic devices.

FIG. 33A is a perspective view illustrating a television 9100. The television 9100 can include the display portion 9001 having a large screen size of, for example, 50 inches or more, or 100 inches or more.

The display device of one embodiment of the present invention can be used for the display portion 9001 included in the television 9100. Accordingly, the television 9100 can have a narrower frame, a high-quality image can be displayed on the display portion 9001, and a more realistic image can be displayed.

Figure 33B:
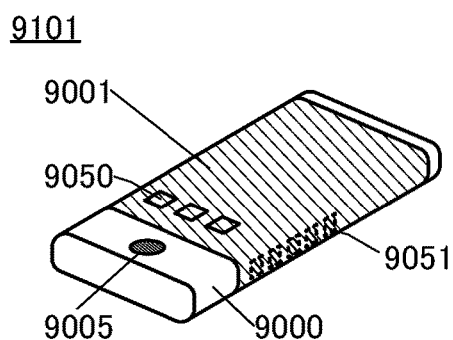

FIG. 33B is a perspective view illustrating a portable information terminal 9101. The portable information terminal 9101 has a function of one or more selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used for the display portion 9001 included in the portable information terminal 9101. Accordingly, the size of the portable information terminal 9101 can be reduced, a high-quality image can be displayed on the display portion 9001, and a more realistic image can be displayed.

Figure 33C:
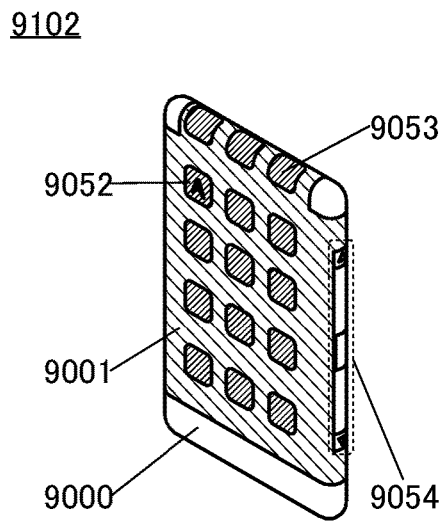

FIG. 33C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display device of one embodiment of the present invention can be used for the display portion 9001 of the portable information terminal 9102. Accordingly, the size of the portable information terminal 9102 can be reduced, a high-quality image can be displayed on the display portion 9001, and a more realistic image can be displayed.

Figure 33D:
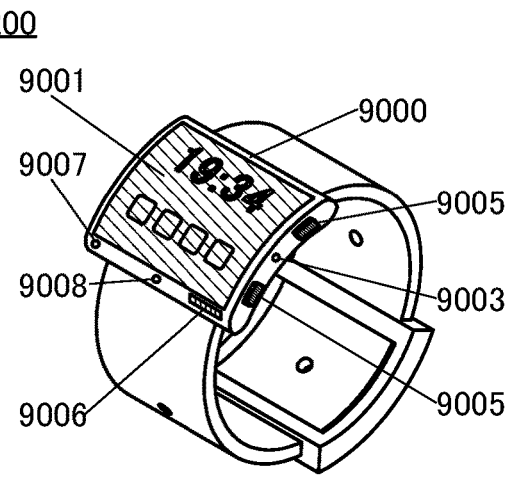

FIG. 33D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used in the display portion 9001 of the portable information terminal 9200. Accordingly, the portable information terminal 9200 can have a narrower frame, a high-quality image can be displayed on the display portion 9001, and a more realistic image can be displayed.

Figure 33E:
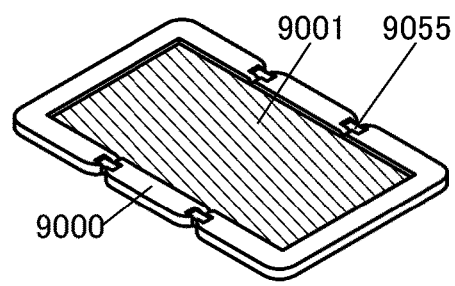
Figure 33F:
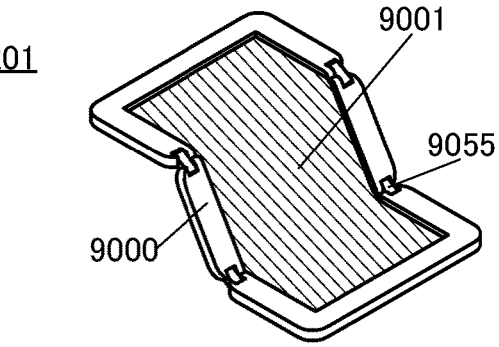
Figure 33G:
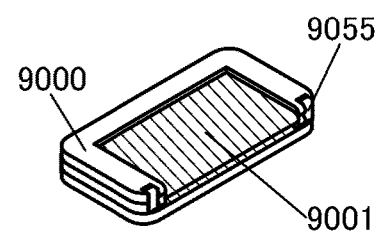

FIG. 33E to FIG. 33G are perspective views illustrating a foldable portable information terminal 9201. FIG. 33E is a perspective view of the portable information terminal 9201 in the opened state, FIG. 33F is a perspective view of the portable information terminal 9201 that is shifted from one of the opened state and the folded state to the other, and FIG. 33G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display device of one embodiment of the present invention can be used in the display portion 9001 of the portable information terminal 9201. Accordingly, the portable information terminal 9201 can have a narrower frame, a high-quality image can be displayed on the display portion 9001, and a more realistic image can be displayed.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

REFERENCE NUMERALS

10: display device, 20: layer, 21: gate driver circuit, 21a: gate driver circuit, 21b: gate driver circuit, 22: data driver circuit, 22a: data driver circuit, 22b: data driver circuit, 23: region, 23a: region, 23b: region, 23c: region, 23d: region, 30: layer, 31: wiring, 31a: wiring, 31b: wiring, 32: wiring, 33: display portion, 34: pixel, 35: wiring, 35a: wiring, 35b: wiring, 40: circuit, 41: receiver circuit, 42: serial-to-parallel converter circuit, 43: buffer circuit, 44: shift register circuit, 45: latch circuit, 46: D/A converter circuit, 46a: potential generator circuit, 46b: pass transistor logic circuit, 47: amplifier circuit, 48: resistor, 49: pass transistor, 51: transistor, 52: transistor, 53: transistor, 54: transistor, 55: transistor, 56: transistor, 57: transistor, 58: transistor, 59: transistor, 60: transistor, 61: transistor, 62: transistor, 63: transistor, 64: capacitor, 65: capacitor, 66: capacitor, 67: source follower circuit, 70: region, 71: transistor, 72: transistor, 73: dummy transistor, 80: layer, 81: demultiplexer circuit, 81a: demultiplexer circuit, 81b: demultiplexer circuit, 82: wiring, 82a: wiring, 82b: wiring, 83: wiring, 83a: wiring, 83b: wiring, 110: channel formation region, 111: source region, 112: drain region, 113: gate electrode, 114: opening, 115: wiring, 116: opening, 117: wiring, 118: opening, 119: opening, 120: opening, 121: wiring, 122: wiring, 123: wiring, 130: channel formation region, 131: source region, 132: drain region, 133: gate electrode, 134: opening, 135: wiring, 136: opening, 137: wiring, 138: opening, 139: opening, 140: opening, 141: wiring, 142: wiring, 143: wiring, 151: semiconductor, 152: conductor, 200A: transistor, 200B: transistor, 200C: transistor, 205: conductor, 214: insulator, 216: insulator, 222: insulator, 224: insulator, 230: metal oxide, 230a: metal oxide, 230b: metal oxide, 230c: metal oxide, 240: conductor, 240a: conductor, 240b: conductor, 241: insulator, 241a: insulator, 241b: insulator, 242: conductor, 242a: conductor, 242b: conductor, 243a: region, 243b: region, 244: insulator, 250: insulator, 252: metal oxide, 254: insulator, 260: conductor, 260a: conductor, 260b: conductor, 270: insulator, 271: insulator, 272: insulator, 274: insulator, 280: insulator, 281: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449a: low-resistance region, 449b: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 550: transistor, 552: transistor, 554: transistor, 560: capacitor, 562: capacitor, 570: liquid crystal element, 572: light-emitting element, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 760: connection electrode, 772: conductor, 774: conductor, 776: liquid crystal layer, 778: structure body, 780: anisotropic conductor, 786: EL layer, 786*a*: EL layer, 786*b*: EL layer, 786*c*: EL layer, 788: conductor, 792: charge generation layer, 800: transistor, 801*a*: conductor, 801*b*: conductor, 805: conductor, 811: conductor, 813: conductor, 814: insulator, 816: insulator, 817: conductor, 821: insulator, 822: insulator, 824: insulator, 844: insulator, 853: conductor, 854: insulator, 855: conductor, 874: insulator, 880: insulator, 881: insulator, 901: subpixel, 901B: subpixel, 901G: subpixel, 901R: subpixel, 902: pixel, 911: conductor, 912: conductor, 913: semiconductor, 914: semiconductor, 915*a*: conductor, 915*b*: conductor, 916*a*: conductor, 916*b*: conductor, 917: conductor, 918: conductor, 919: conductor, 920: conductor, 921: conductor, 922: conductor, 923: conductor, 924: conductor, 925: conductor, 926: conductor, 927: conductor, 928: conductor, 929: conductor, 930: conductor, 931: conductor, 990: conductor, 991: bonding layer, 992: insulator, 993: coloring layer, 993*a*: coloring layer, 993*b*: coloring layer, 994: bonding layer, 995: substrate, 1021: insulator, 1022: insulator, 1023: insulator, 1024: insulator, 1025: insulator, 1026: insulator, 1027: insulator, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:

1. A display device comprising:
a first layer comprising a gate driver circuit and a data driver circuit;
a second layer stacked on the first layer, the second layer comprising a plurality of demultiplexer circuits; and
a third layer stacked on the second layer, the third layer comprising a display portion having a plurality pixels arranged in a matrix,
wherein at least one of the gate driver circuit and the data driver circuit includes a first transistor having a channel formation region comprising silicon,
wherein each of the plurality of demultiplexer circuits includes a second transistor having a channel formation region comprising a first metal oxide,
wherein each of the plurality of pixels includes a third transistor having a channel formation region comprising a second metal oxide,
wherein at least one of the plurality of demultiplexer circuits is electrically connected to the data driver circuit,
wherein the plurality of demultiplexer circuits are electrically connected to the display portion, and
wherein the gate driver circuit comprises a region overlapping the data driver circuit.

2. The display device according to claim 1,
wherein the display portion overlaps with the plurality of the demultiplexer circuits, the gate driver circuit, and the data driver circuit.

3. The display device according to claim 1,
wherein the first layer further includes a first circuit,
wherein the data driver circuit includes a plurality of second circuits electrically connected to the first circuit,
wherein the display portion overlaps with the gate driver circuit and the data driver circuit, and
wherein the display portion does not overlap with the first circuit.

4. The display device according to claim 3,
wherein the first circuit comprises a potential generator circuit, and
wherein each of the plurality of second circuits comprises a pass transistor logic circuit.

5. The display device according to claim 3,
wherein the first circuit is configured to generate a plurality of potentials with different levels from each other, and
wherein the plurality of second circuits are configured to receive image data and output any of the plurality of potentials generated by the first circuit based on digital value of the image data.

6. The display device according to claim 3,
wherein the number of the plurality of second circuits is smaller than the number of columns of the pixels arranged in the matrix.

7. The display device according to claim 6,
wherein the number of the plurality of second circuits is smaller than or equal to ½ the number of the columns of the pixels.

8. The display device according to claim 1,
wherein each of the first metal oxide and the second metal oxide comprises In, an element M (M is Al, Ga, Y, or Sn), and Zn.

9. A display device comprising:
a first layer comprising a gate driver circuit and a plurality of data driver circuits;
a second layer stacked on the first layer, the second layer comprising a plurality of demultiplexer circuits; and
a third layer stacked on the second layer, the third layer comprising a plurality of display portions arranged in a first matrix,
wherein each of the plurality of display portions comprises a plurality of pixels arranged in a second matrix,
wherein at least one of the gate driver circuit and the plurality of data driver circuits includes a first transistor having a channel formation region comprising silicon,
wherein each of the plurality of demultiplexer circuits includes a second transistor having a channel formation region comprising a first metal oxide,
wherein each of the plurality of pixels includes a third transistor having a channel formation region comprising a second metal oxide,
wherein a first one of the plurality of demultiplexer circuits is electrically connected to a first one of the plurality of data driver circuits and a first one of the plurality of display portions, and wherein the gate driver circuit comprises a region overlapping at least the first one of the plurality of data driver circuits.

10. The display device according to claim 9,
wherein the first one of the plurality of display portions overlaps with the first one of the plurality of demultiplexer circuits, the gate driver circuit, and the first one of the plurality of data driver circuits.

11. The display device according to claim 9,
wherein the first layer further includes a first circuit,
wherein each of the plurality of data driver circuits includes a plurality of second circuits electrically connected to the first circuit, and
wherein the plurality of display portions do not overlap with the first circuit.

12. The display device according to claim 11,
wherein the first circuit comprises a potential generator circuit, and
wherein each of the plurality of second circuits comprises a pass transistor logic circuit.

13. The display device according to claim 11,
wherein the first circuit is configured to generate a plurality of potentials with different levels from each other, and
wherein the plurality of second circuits are configured to receive image data and output any of the plurality of potentials generated by the first circuit based on digital value of the image data.

14. The display device according to claim 11,
wherein the number of the plurality of second circuits is smaller than the number of columns of the plurality of pixels arranged in the second matrix.

15. The display device according to claim 14,
wherein the number of the plurality of second circuits is smaller than or equal to ½ the number of the columns of the plurality of pixels.

16. The display device according to claim 9,
wherein each of the first metal oxide and the second metal oxide comprises In, an element M (M is Al, Ga, Y, or Sn), and Zn.

17. A display device comprising:
a first layer comprising a plurality of gate driver circuits and a plurality of data driver circuits;
a second layer stacked on the first layer, the second layer comprising a plurality of demultiplexer circuits; and
a third layer stacked on the second layer, the third layer comprising a plurality of display portions arranged in a first matrix,
wherein each of the plurality of display portions comprises a plurality of pixels arranged in a second matrix,
wherein at least one of the plurality of gate driver circuits and the plurality of data driver circuits includes a first transistor having a channel formation region comprising silicon,
wherein each of the plurality of demultiplexer circuits includes a second transistor having a channel formation region comprising a first metal oxide,
wherein each of the plurality of pixels includes a third transistor having a channel formation region comprising a second metal oxide,
wherein a first one of the plurality of demultiplexer circuits is electrically connected to a first one of the plurality of data driver circuits and a first one of the plurality of display portions,
wherein a first one of the plurality of gate driver circuits comprises a region overlapping the first one of the plurality of data driver circuits, and
wherein a second one of the plurality of gate driver circuits comprises a region overlapping a second one of the plurality of data driver circuits.

18. The display device according to claim 17,
wherein the first one of the plurality of display portions overlaps with the first one of the plurality of demultiplexer circuits, the first one of the plurality of gate driver circuits, and the first one of the plurality of data driver circuits.

19. The display device according to claim 17,
wherein the first layer further includes a first circuit electrically connected to at least the first one of the plurality of data driver circuits,
wherein each of the plurality of data driver circuits includes a plurality of second circuits electrically connected to the first circuit, and
wherein the plurality of display portions do not overlap with the first circuit.

20. The display device according to claim 19,
wherein the first circuit comprises a potential generator circuit, and
wherein each of the plurality of second circuits comprises a pass transistor logic circuit.

21. The display device according to claim 19,
wherein the first circuit is configured to generate a plurality of potentials with different levels from each other, and
wherein the plurality of second circuits are configured to receive image data and output any of the plurality of potentials generated by the first circuit based on digital value of the image data.

22. The display device according to claim 19,
wherein the number of the plurality of second circuits is smaller than the number of columns of the plurality of pixels arranged in the second matrix.

23. The display device according to claim 22,
wherein the number of the plurality of second circuits is smaller than or equal to ½ the number of the columns of the plurality of pixels.

24. The display device according to claim 17,
wherein each of the first metal oxide and the second metal oxide comprises In, an element M (M is Al, Ga, Y, or Sn), and Zn.

* * * * *